US012684760B2

(12) United States Patent
Liao et al.

(10) Patent No.: US 12,684,760 B2
(45) Date of Patent: Jul. 14, 2026

(54) MEMORY DEVICE STRUCTURE AND METHOD

(71) Applicant: Taiwan Semiconductor Manufacturing Company, Ltd., Hsinchu (TW)

(72) Inventors: Shih-Yu Liao, Hsinchu City (TW); Chung-Liang Cheng, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 400 days.

(21) Appl. No.: 18/347,528

(22) Filed: Jul. 5, 2023

(65) Prior Publication Data

US 2025/0016983 A1     Jan. 9, 2025

(51) Int. Cl.
　H10B 12/00　　　(2023.01)
　H10D 30/01　　　(2025.01)
　　　　　(Continued)

(52) U.S. Cl.
　CPC ............. H10B 12/33 (2023.02); H10B 12/05 (2023.02); H10D 30/014 (2025.01);
　　　　　(Continued)

(58) Field of Classification Search
　CPC ...... H10B 12/33; H10B 12/05; H10D 30/014; H10D 30/43; H10D 30/6729;
　　　　　(Continued)

(56) References Cited

U.S. PATENT DOCUMENTS

| | | | | |
|---|---|---|---|---|
| 11,004,856 | B1 * | 5/2021 | Zhang .................... | H10B 10/12 |
| 12,289,894 | B1 * | 4/2025 | Dokania ................ | H10B 53/20 |
| 2023/0073071 | A1 * | 3/2023 | Sato ...................... | G11C 11/221 |

FOREIGN PATENT DOCUMENTS

| | | |
|---|---|---|
| TW | 202306082 A | 2/2023 |
| TW | 202318647 A | 5/2023 |

OTHER PUBLICATIONS

Office Action of Corresponding TW Patent Application No. 113125185 dated May 19, 2025.

* cited by examiner

*Primary Examiner* — Jonathan Han
(74) *Attorney, Agent, or Firm* — Kilpatrick Townsend & Stockton LLP

(57)　　　　ABSTRACT

Memory cells, semiconductor devices, semiconductor stacked structures, and fabrication methods are provided. An example memory cell includes a capacitor and a transistor stacked over the capacitor in a compact configuration. The capacitor includes a floating gate, a high-k dielectric layer, and a metal gate. The metal gate extends horizontally from a first sidewall to a second sidewall and vertically from a bottom surface to a top surface. The transistor includes the metal gate and a gate dielectric layer disposed on the metal gate. The gate dielectric layer includes two side portions respectively disposed on the two sidewalls of the metal gate and, and a top portion disposed on the top surface of the metal gate. The transistor further includes two separate S/D regions respectively formed on the two side portions of the gate dielectric layer, and a channel region formed on the top portion of the gate dielectric layer.

20 Claims, 50 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/83* | (2025.01) |
| *H10W 20/20* | (2026.01) |

(52) U.S. Cl.

CPC ......... *H10D 30/43* (2025.01); *H10D 30/6729* (2025.01); *H10D 30/6735* (2025.01); *H10D 30/6755* (2025.01); *H10D 30/6757* (2025.01); *H10D 62/121* (2025.01); *H10D 84/0128* (2025.01); *H10D 84/013* (2025.01); *H10D 84/0149* (2025.01); *H10D 84/038* (2025.01); *H10D 84/83* (2025.01); *H10W 20/20* (2026.01)

(58) Field of Classification Search

CPC ........... H10D 30/6735; H10D 30/6755; H10D 30/6757; H10D 62/121; H10D 84/0128; H10D 84/013; H10D 84/0149; H10D 84/038; H10D 84/83; H10D 86/423; H10D 86/481; H10D 30/019; H10D 30/0195; H10D 30/507; H10D 30/501; H10D 30/503; H10D 84/832; H10D 64/017; H10D 88/00; H10W 20/20; B82Y 10/00

See application file for complete search history.

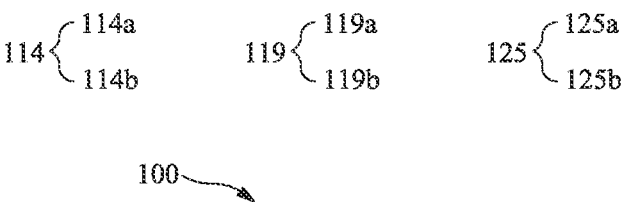
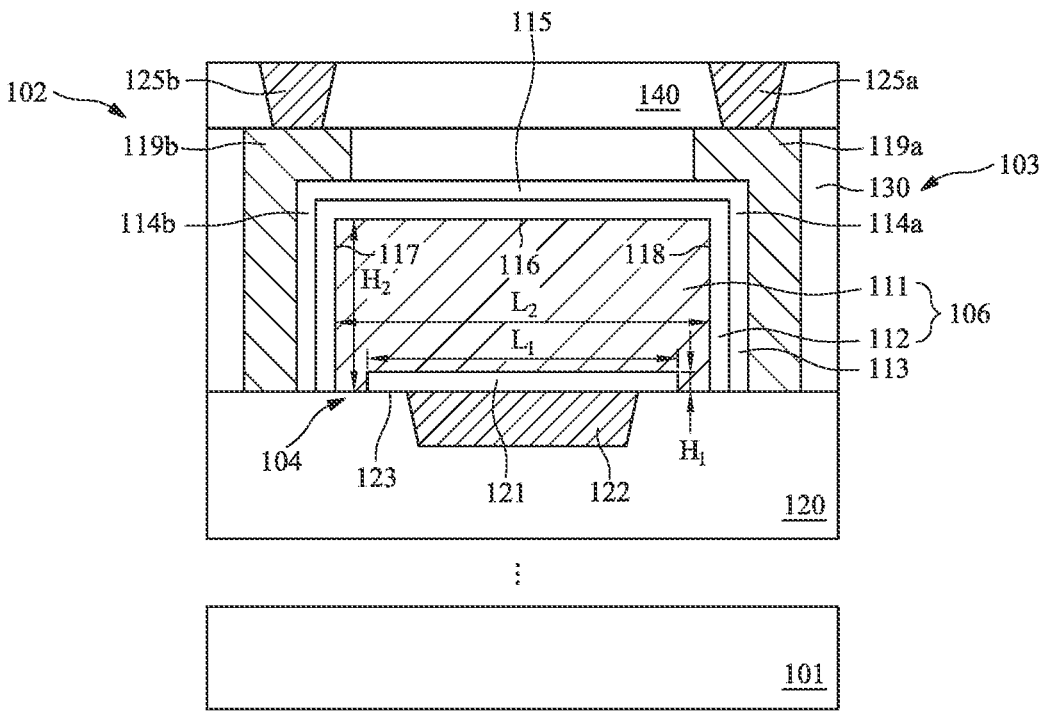
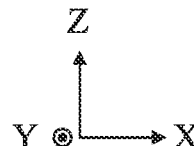
Fig. 1A

200

PROVIDE A PARTIALLY FORMED DEVICE HAVING A CAPACITOR, THE CAPACITOR HAVING A METAL GATE 202

FORM A GATE DIELECTRIC LAYER ON THE METAL GATE 204

FORM S/D REGIONS AND A CHANNEL REGION 206

FORM A FIRST DIELECTRIC LAYER 208

FORM OPENINGS IN THE FIRST DIELECTRIC LAYER 210

FORM S/D ELECTRODES 212

FORM A SECOND DIELECTRIC LAYER 214

FORM VIA CONTACTS IN THE SECOND DIELECTRIC LAYER 216

100
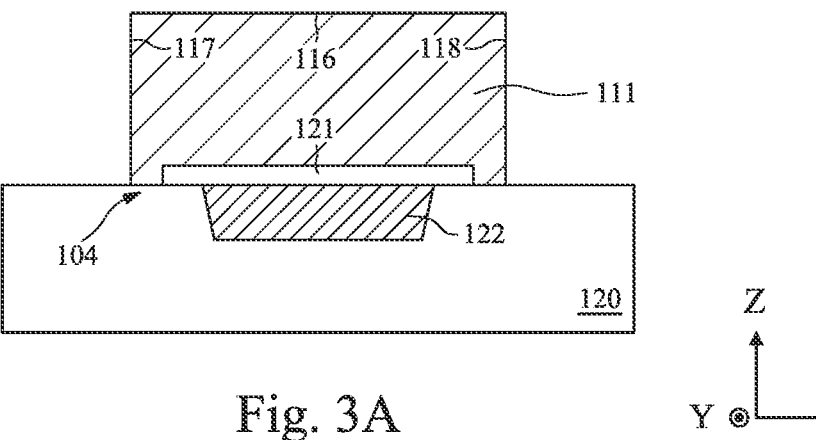
117   116   118   111
121
104   122
120
Fig. 3A
Z
Y   X
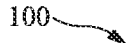
100
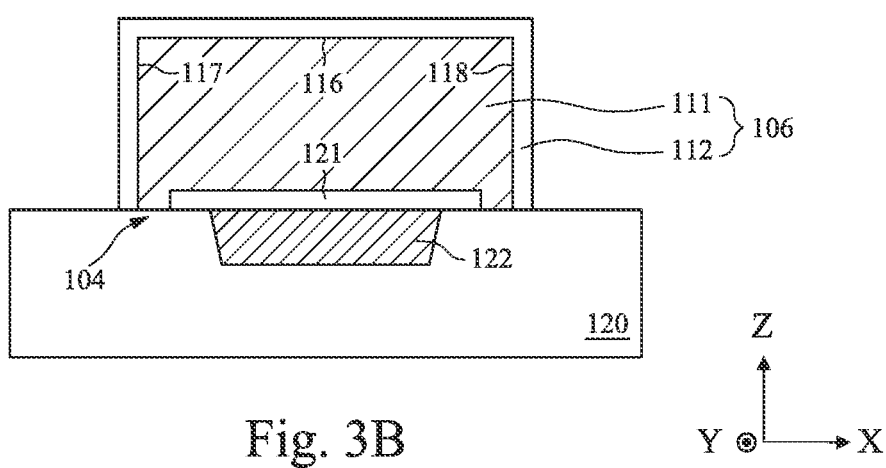
117   116   118   111 ⎫
                        ⎬ 106
121              112 ⎭
104   122
120
Fig. 3B
Z
Y   X

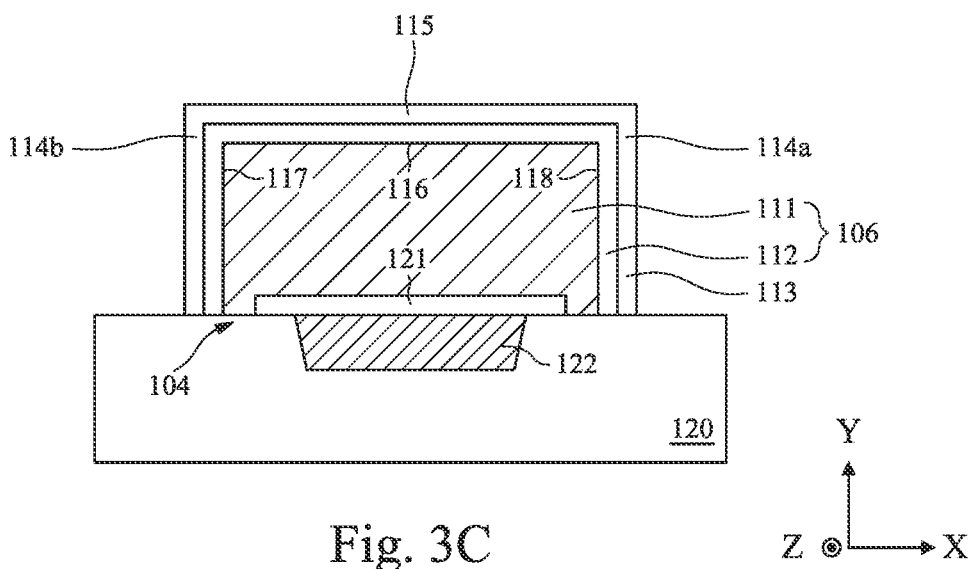
Fig. 3C
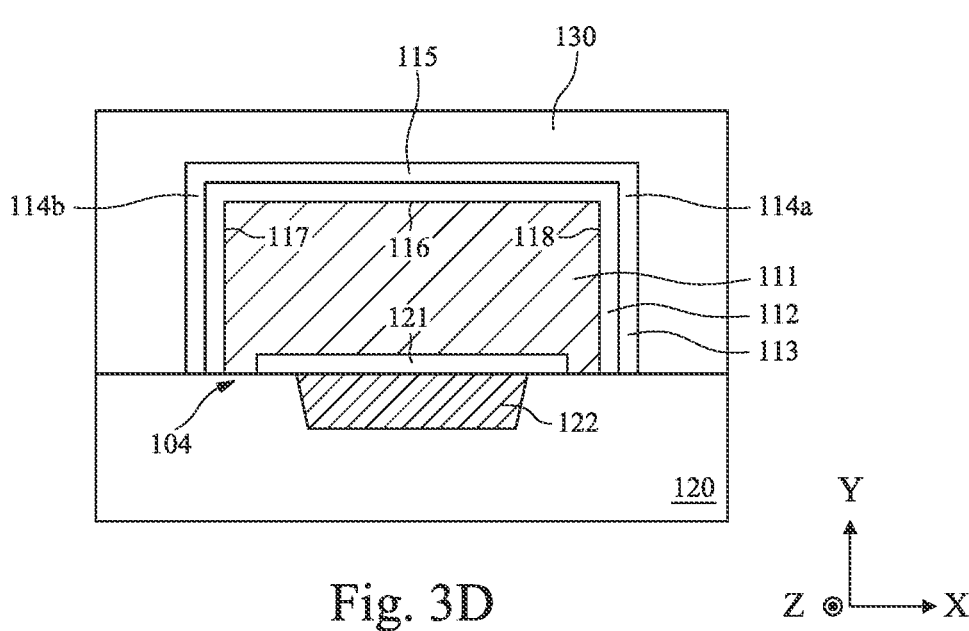
Fig. 3D

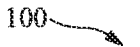
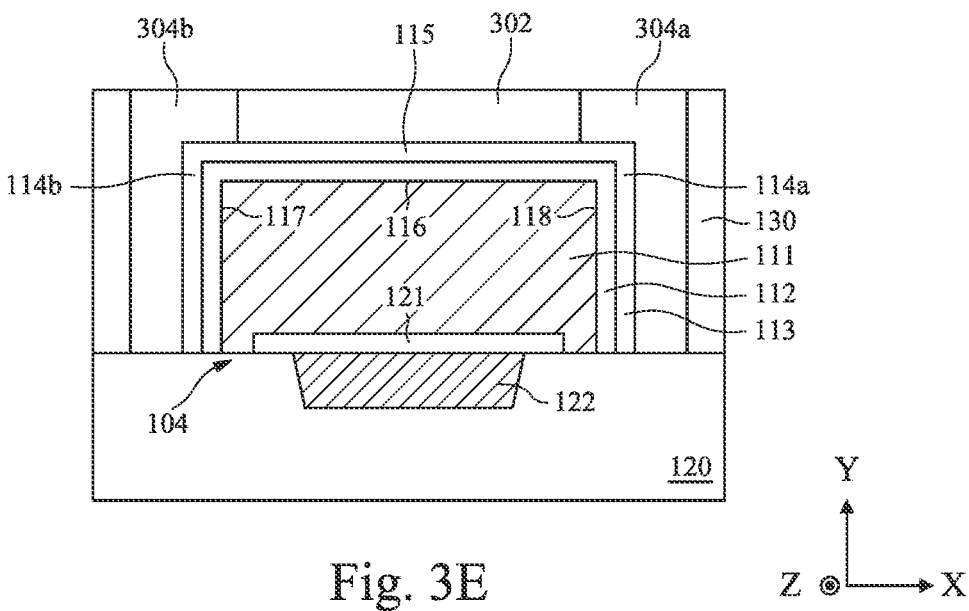
Fig. 3E
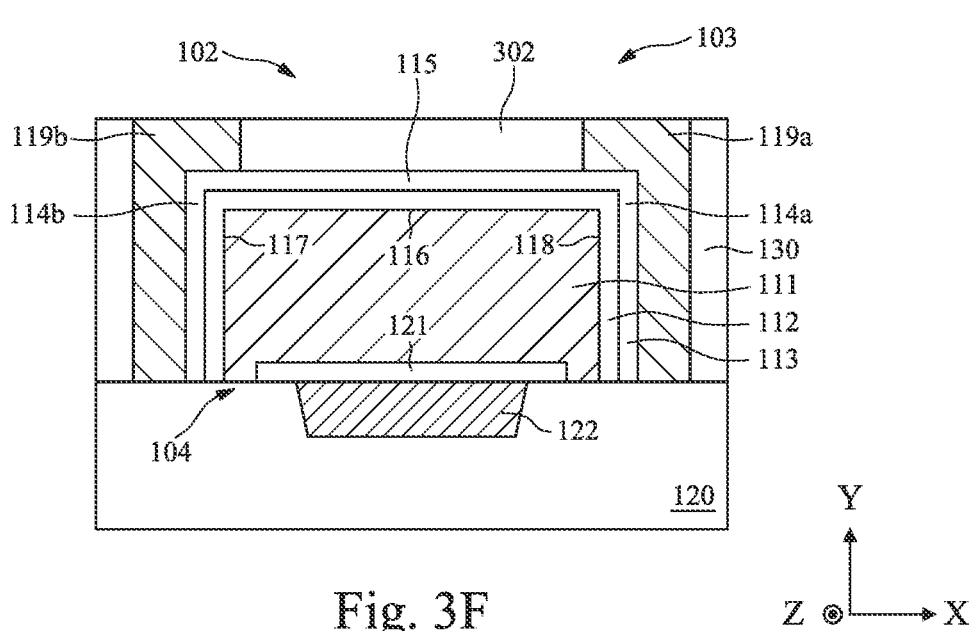
Fig. 3F

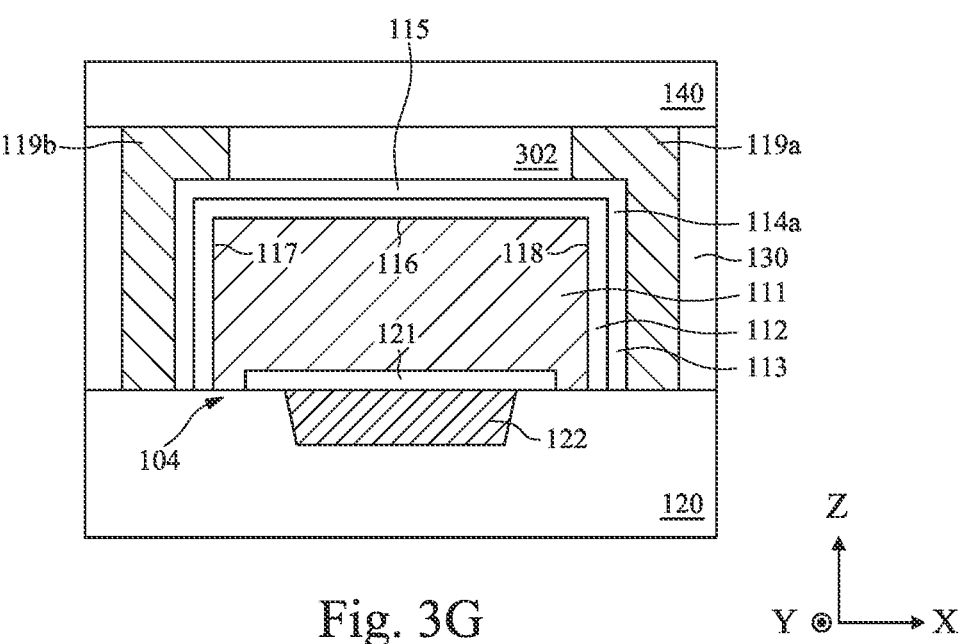
Fig. 3G
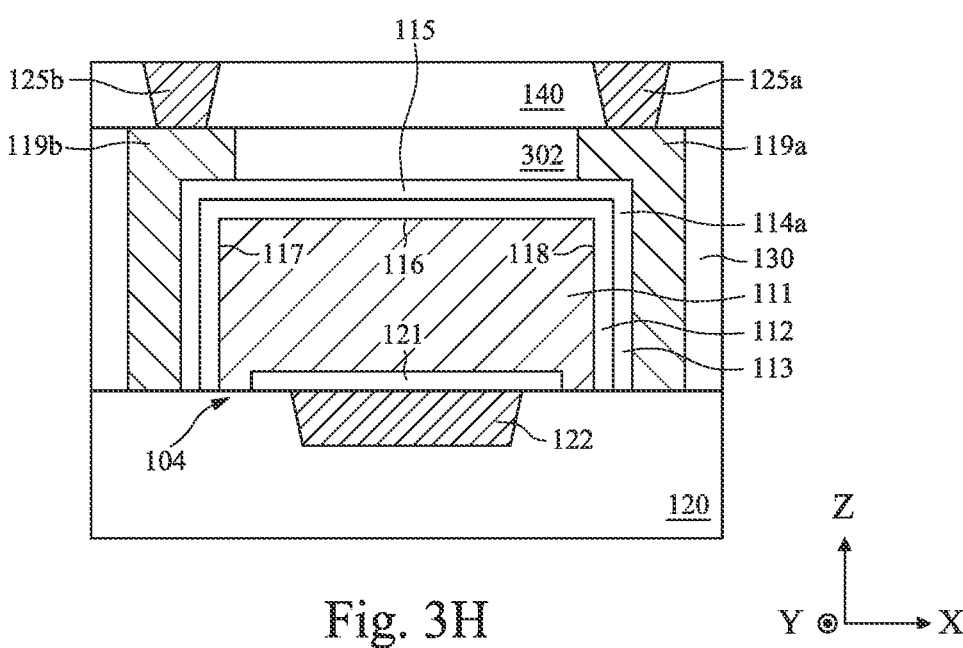
Fig. 3H

414 {
414a
414b
419 {
419a
419b
425 {
425a
425b
400
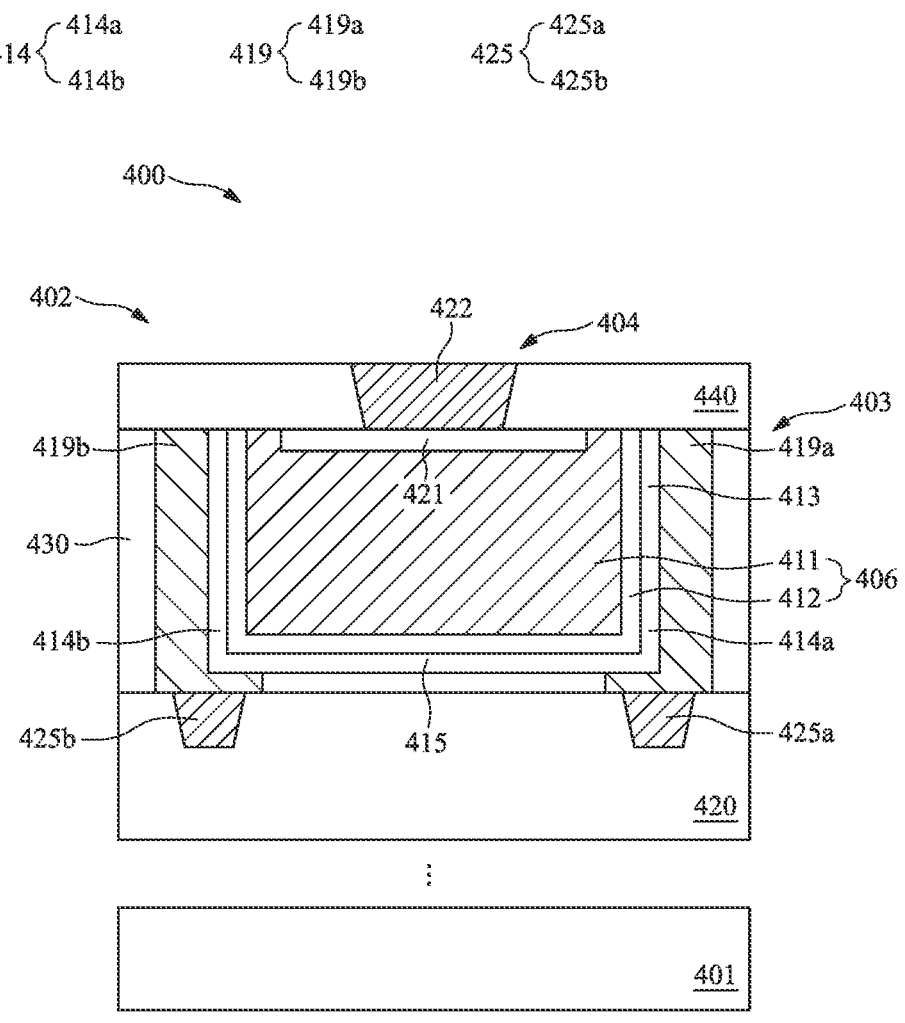
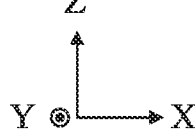
Fig. 4

500

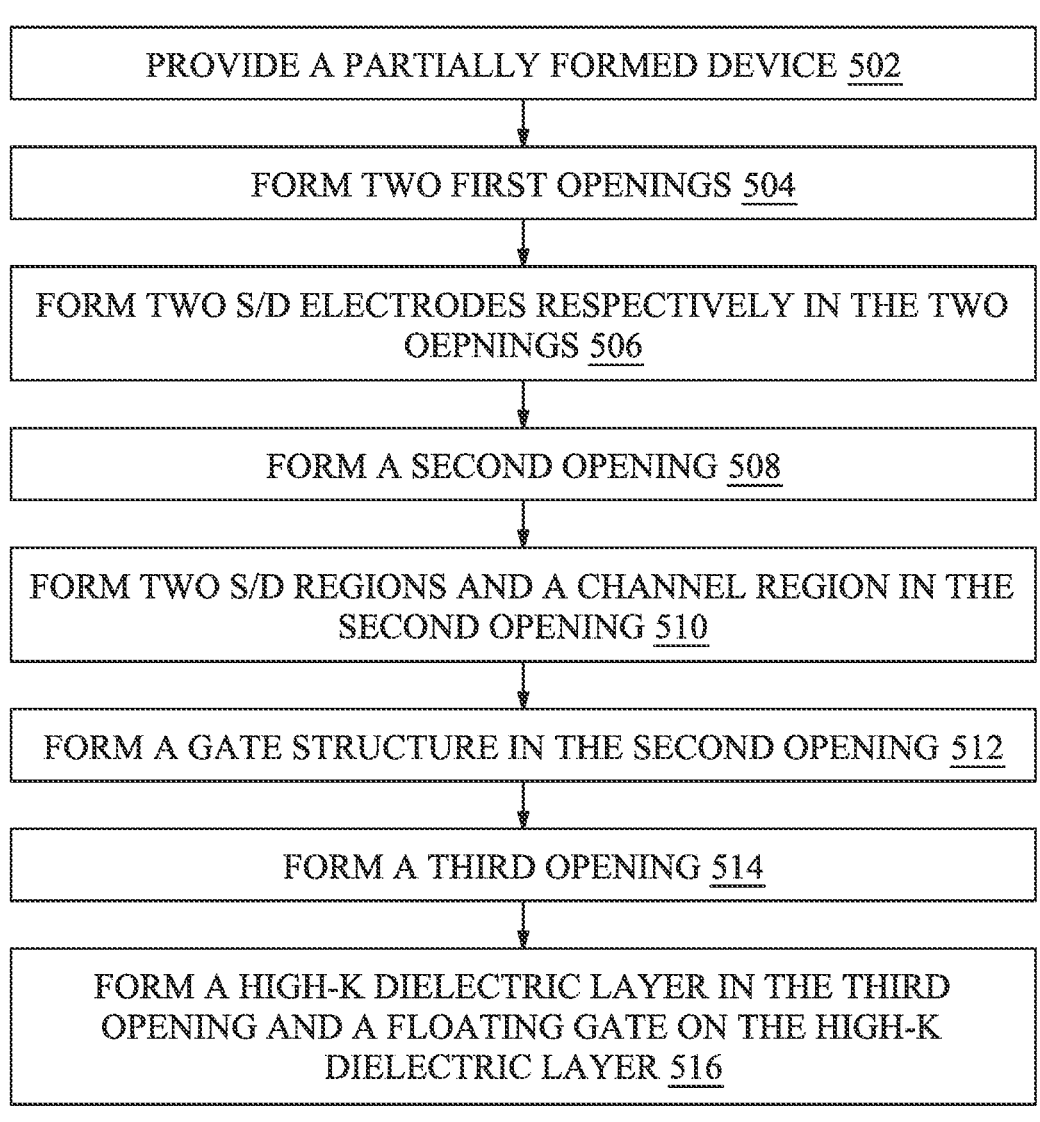

| PROVIDE A PARTIALLY FORMED DEVICE 502 |

| FORM TWO FIRST OPENINGS 504 |

| FORM TWO S/D ELECTRODES RESPECTIVELY IN THE TWO OEPNINGS 506 |

| FORM A SECOND OPENING 508 |

| FORM TWO S/D REGIONS AND A CHANNEL REGION IN THE SECOND OPENING 510 |

| FORM A GATE STRUCTURE IN THE SECOND OPENING 512 |

| FORM A THIRD OPENING 514 |

| FORM A HIGH-K DIELECTRIC LAYER IN THE THIRD OPENING AND A FLOATING GATE ON THE HIGH-K DIELECTRIC LAYER 516 |

Fig. 5

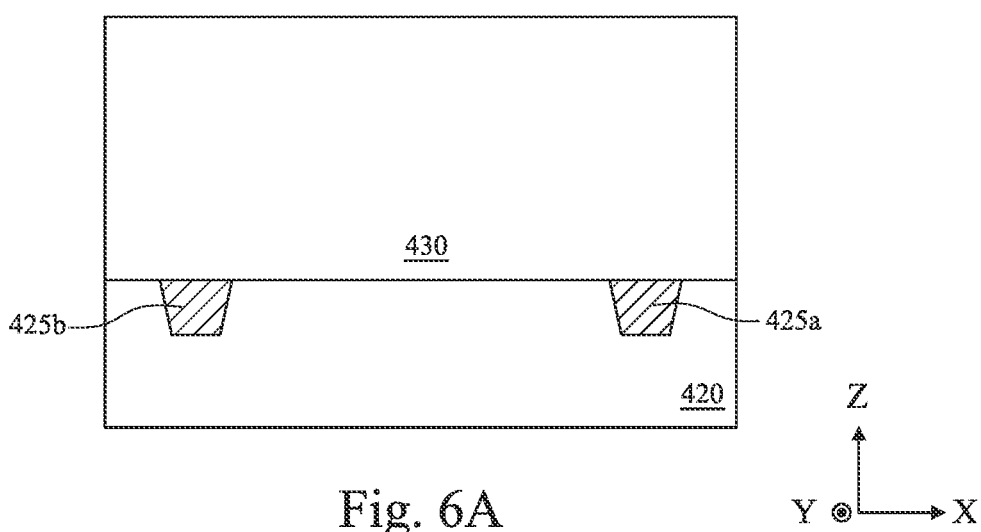
Fig. 6A
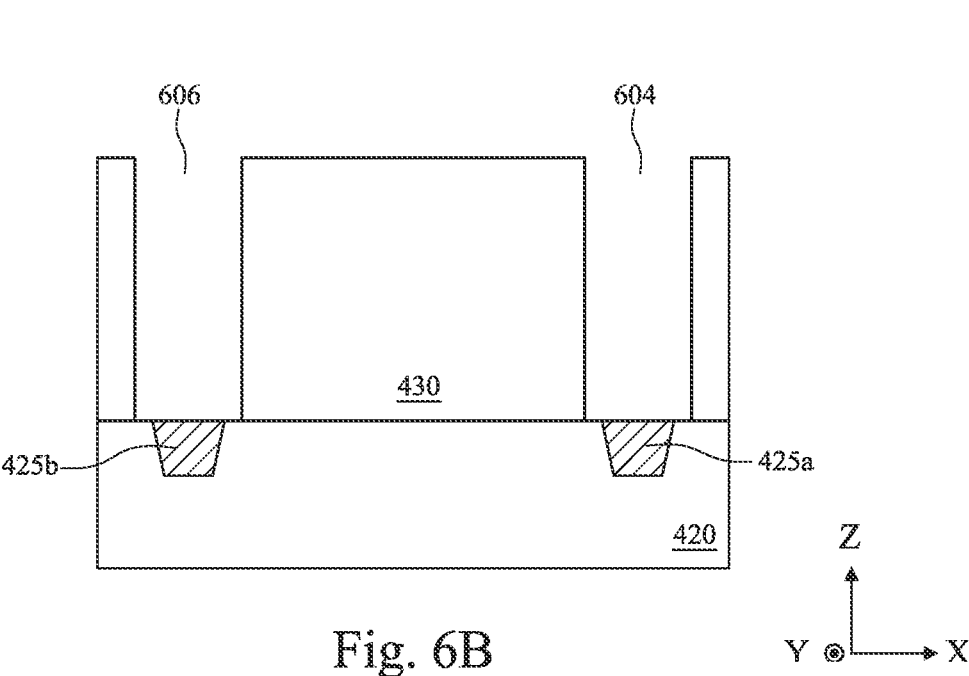
Fig. 6B

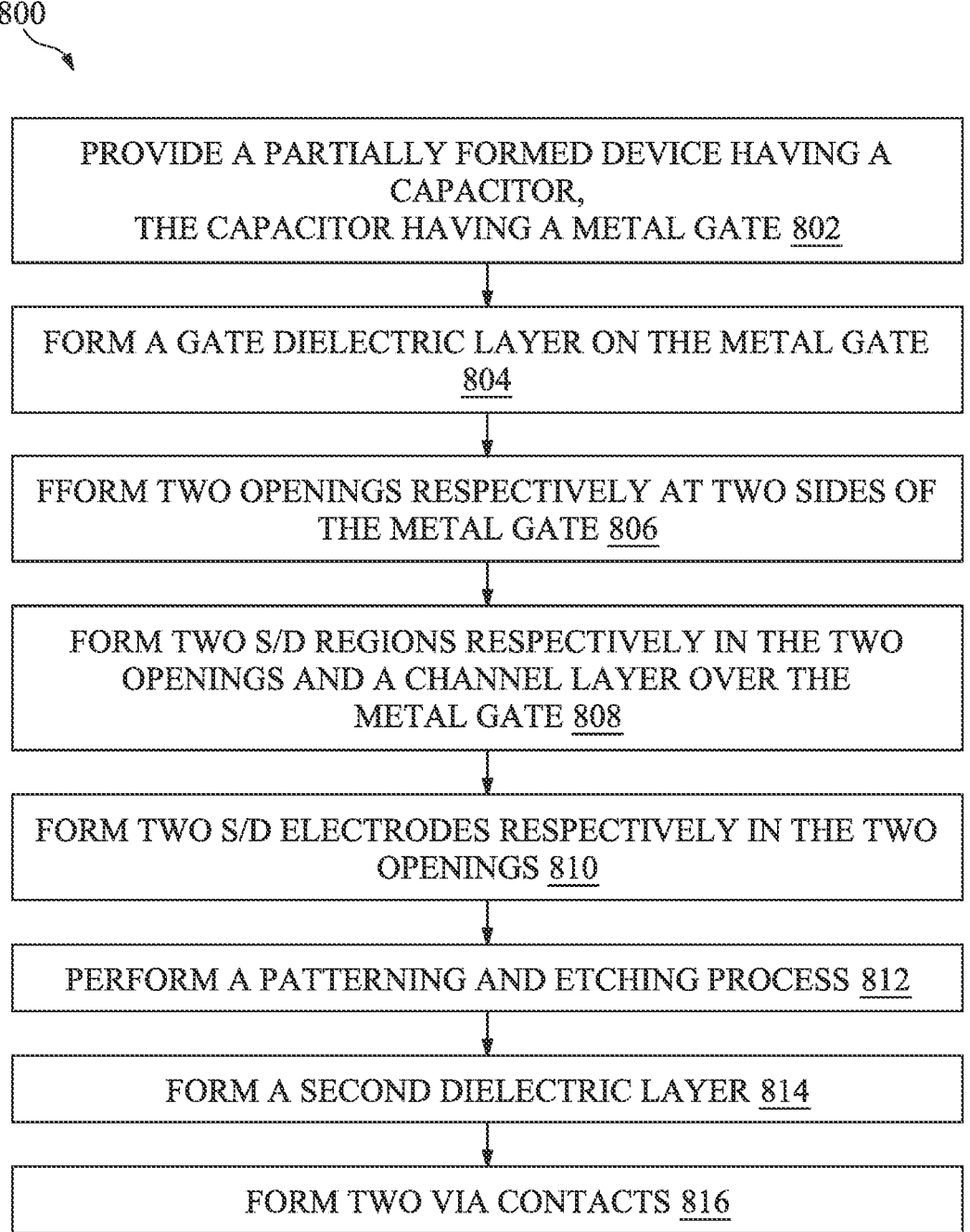

800

PROVIDE A PARTIALLY FORMED DEVICE HAVING A
CAPACITOR,
THE CAPACITOR HAVING A METAL GATE 802

FORM A GATE DIELECTRIC LAYER ON THE METAL GATE
804

FFORM TWO OPENINGS RESPECTIVELY AT TWO SIDES OF
THE METAL GATE 806

FORM TWO S/D REGIONS RESPECTIVELY IN THE TWO
OPENINGS AND A CHANNEL LAYER OVER THE
METAL GATE 808

FORM TWO S/D ELECTRODES RESPECTIVELY IN THE TWO
OPENINGS 810

PERFORM A PATTERNING AND ETCHING PROCESS 812

FORM A SECOND DIELECTRIC LAYER 814

FORM TWO VIA CONTACTS 816

Fig. 8

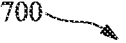
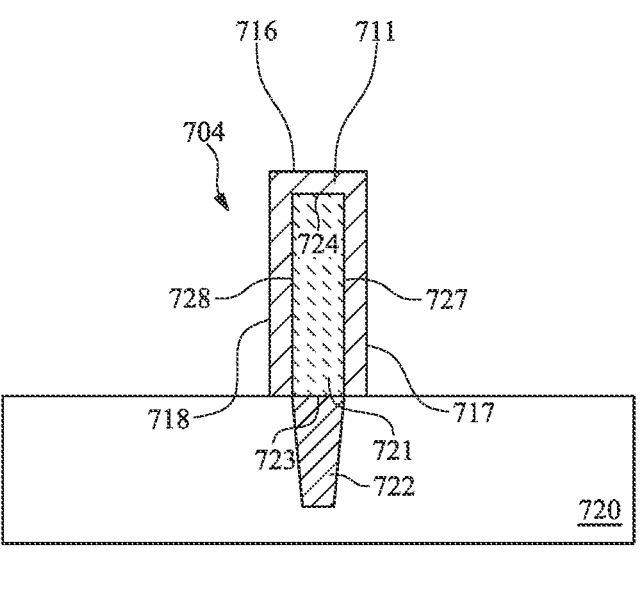
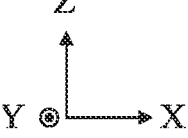
Fig. 9A
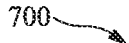
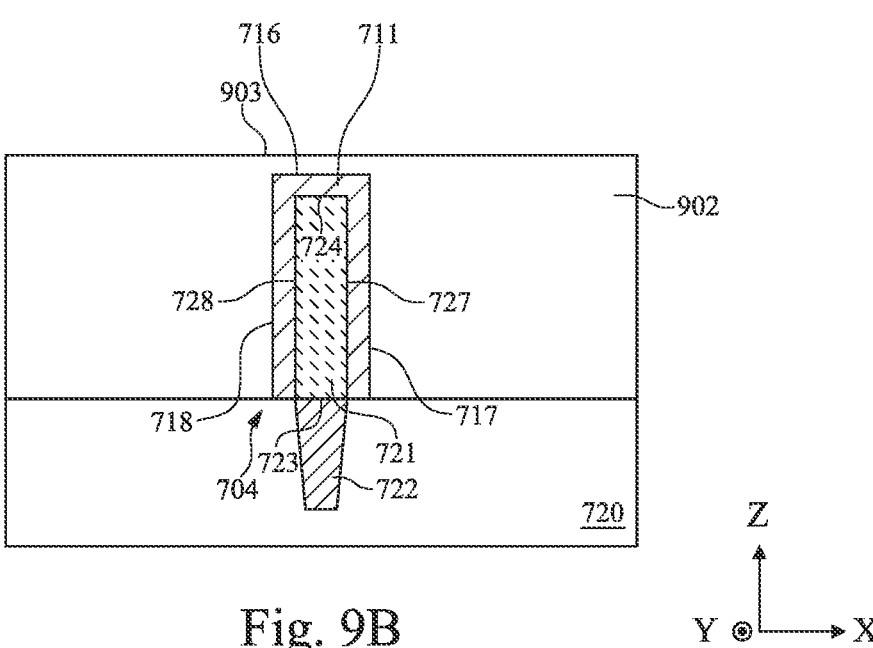
Fig. 9B

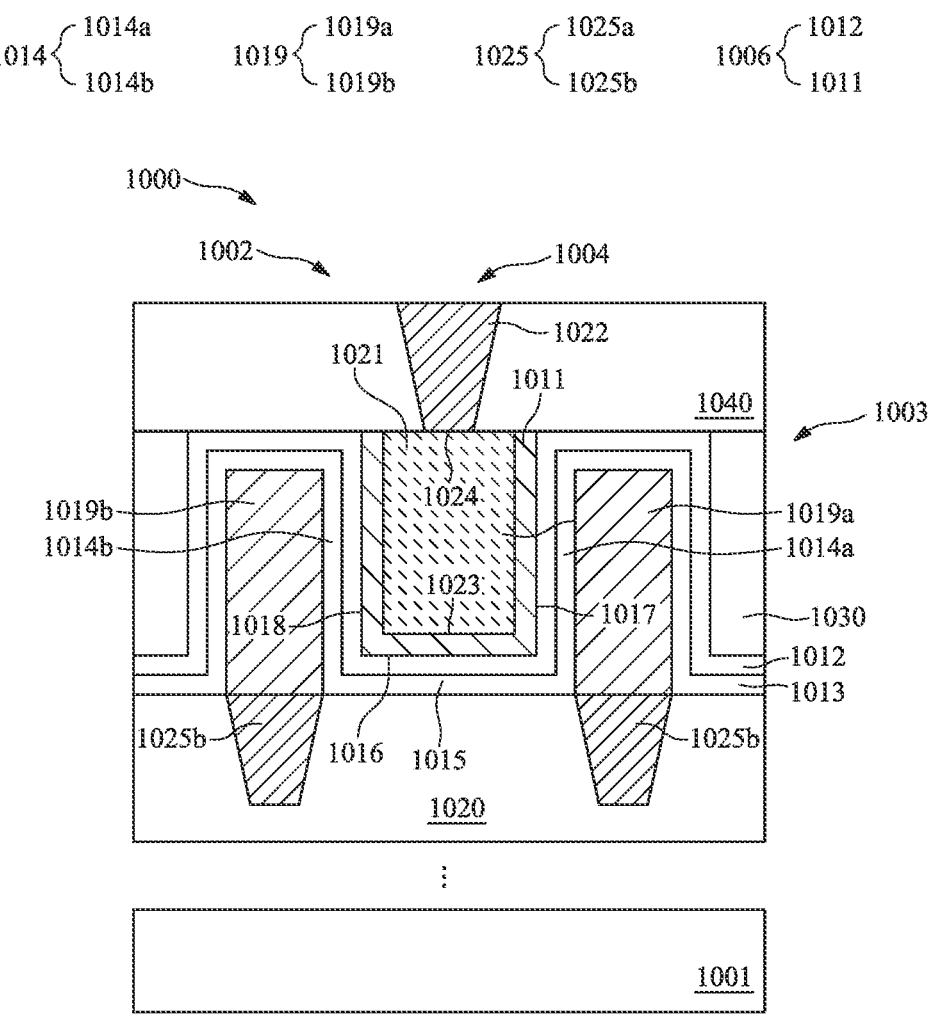
$$1014 \begin{cases} 1014a \\ 1014b \end{cases} \quad 1019 \begin{cases} 1019a \\ 1019b \end{cases} \quad 1025 \begin{cases} 1025a \\ 1025b \end{cases} \quad 1006 \begin{cases} 1012 \\ 1011 \end{cases}$$
Fig. 10
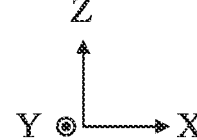

1100

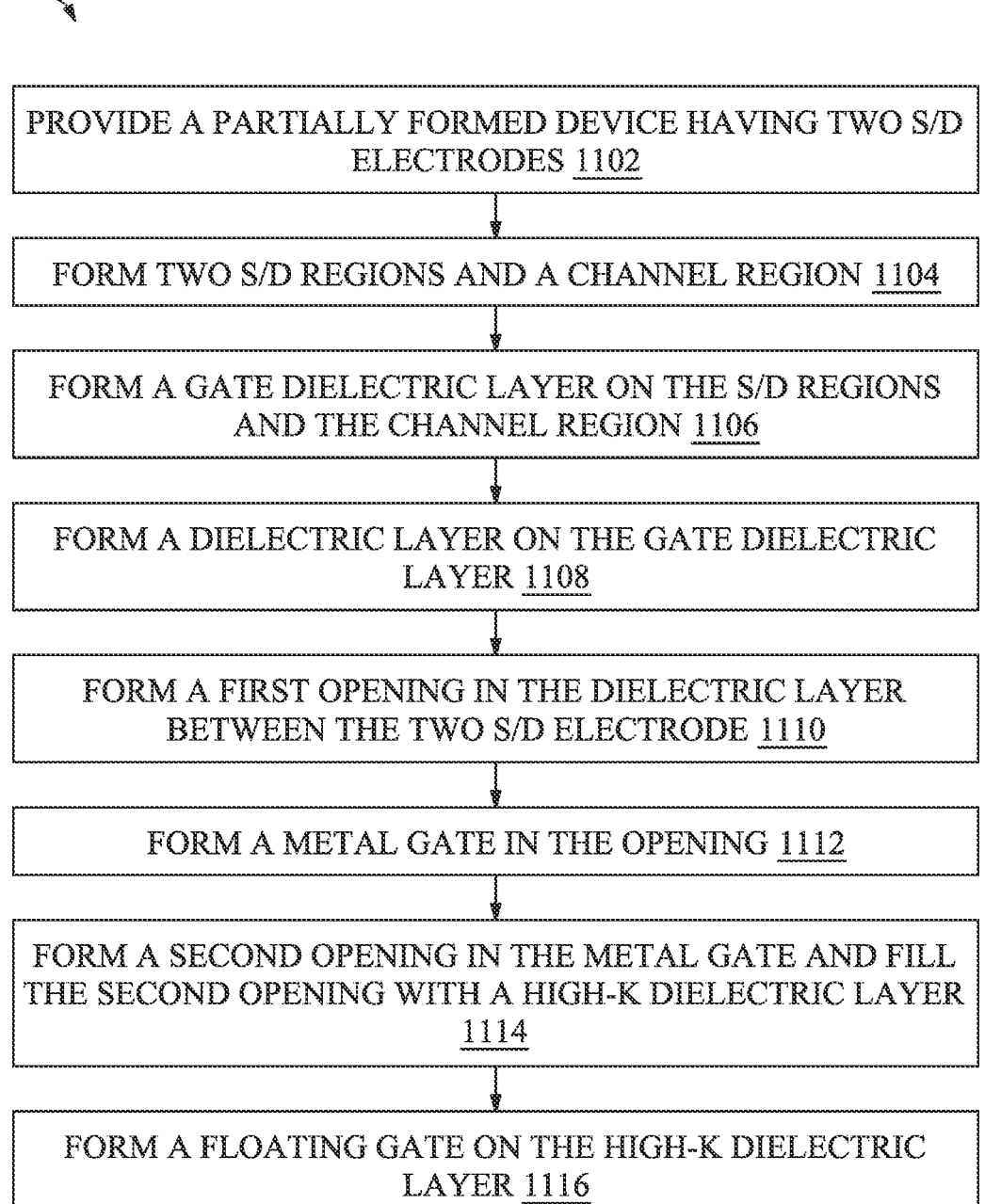

PROVIDE A PARTIALLY FORMED DEVICE HAVING TWO S/D ELECTRODES 1102

FORM TWO S/D REGIONS AND A CHANNEL REGION 1104

FORM A GATE DIELECTRIC LAYER ON THE S/D REGIONS AND THE CHANNEL REGION 1106

FORM A DIELECTRIC LAYER ON THE GATE DIELECTRIC LAYER 1108

FORM A FIRST OPENING IN THE DIELECTRIC LAYER BETWEEN THE TWO S/D ELECTRODE 1110

FORM A METAL GATE IN THE OPENING 1112

FORM A SECOND OPENING IN THE METAL GATE AND FILL THE SECOND OPENING WITH A HIGH-K DIELECTRIC LAYER 1114

FORM A FLOATING GATE ON THE HIGH-K DIELECTRIC LAYER 1116

Fig. 11

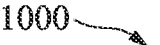
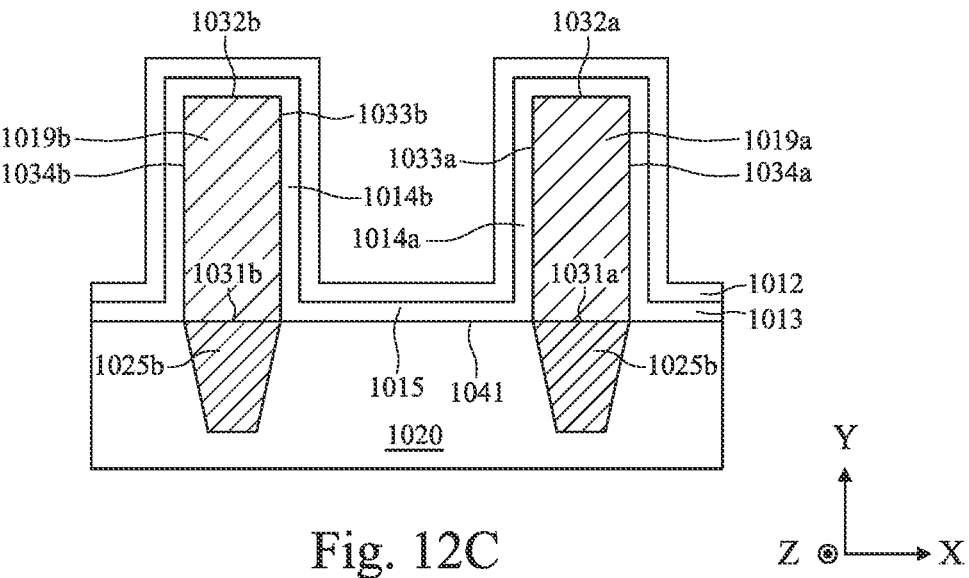
Fig. 12C
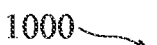
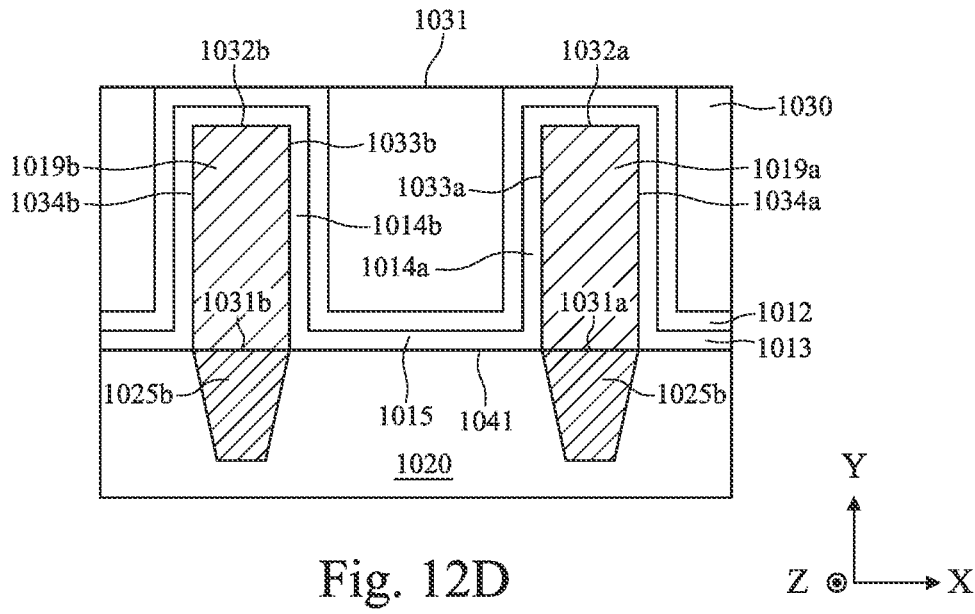
Fig. 12D

1400

FORM A TRANSISTOR ON A SUBSTRATE 1402

FORM AN INTERCONNECT STRUCTURE THAT CONTACTS THE TRANSISTOR GATE 1404

BOND WITH A CARRIER SUBSTRATE TO FORM A STACKED STRUCTURE 1406

INVERT THE STACKED STRUCTURE 1408

THIN THE SUBSTRATE TO EXPOSE SHARED S/D REGION 1410

FORM BACKSIDE S/D CONTACT 1412

FORM POWER RAILS 1414

FORM A MEMORY CELL 1416

FORM CONTACT PLUG PORTION 1418

FORM A TOV 1420

1555
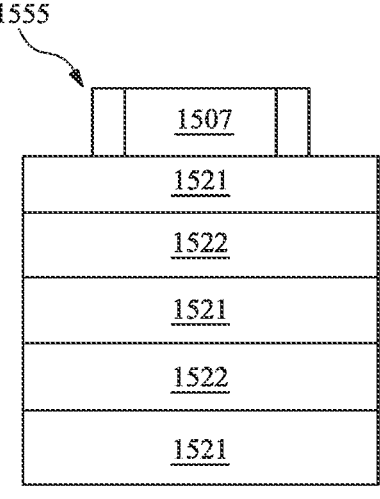
Fig. 15C
1557
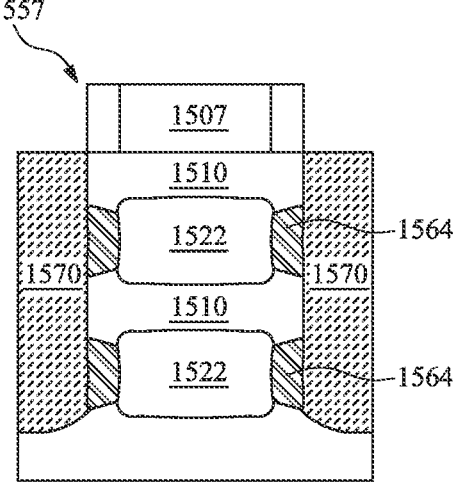
Fig. 15D
1557
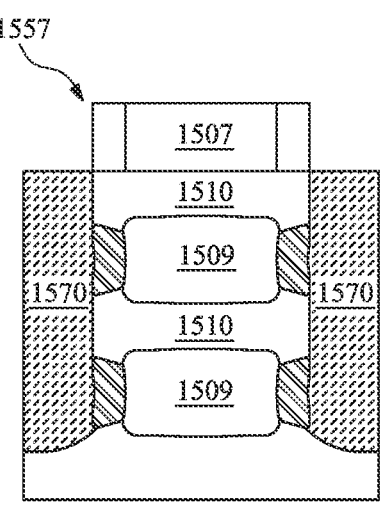
Fig. 15E
1557
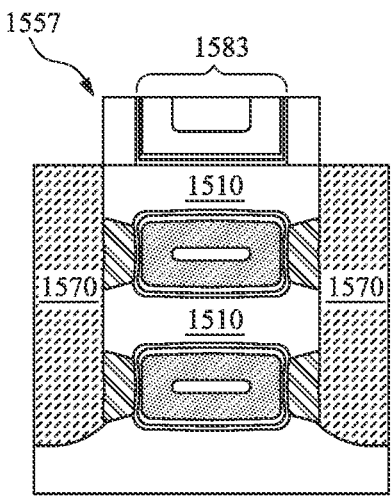
Fig. 15F
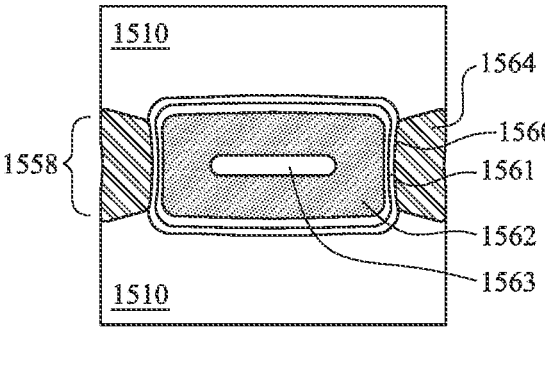
Fig. 15G
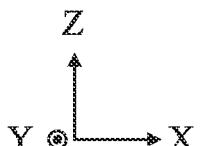

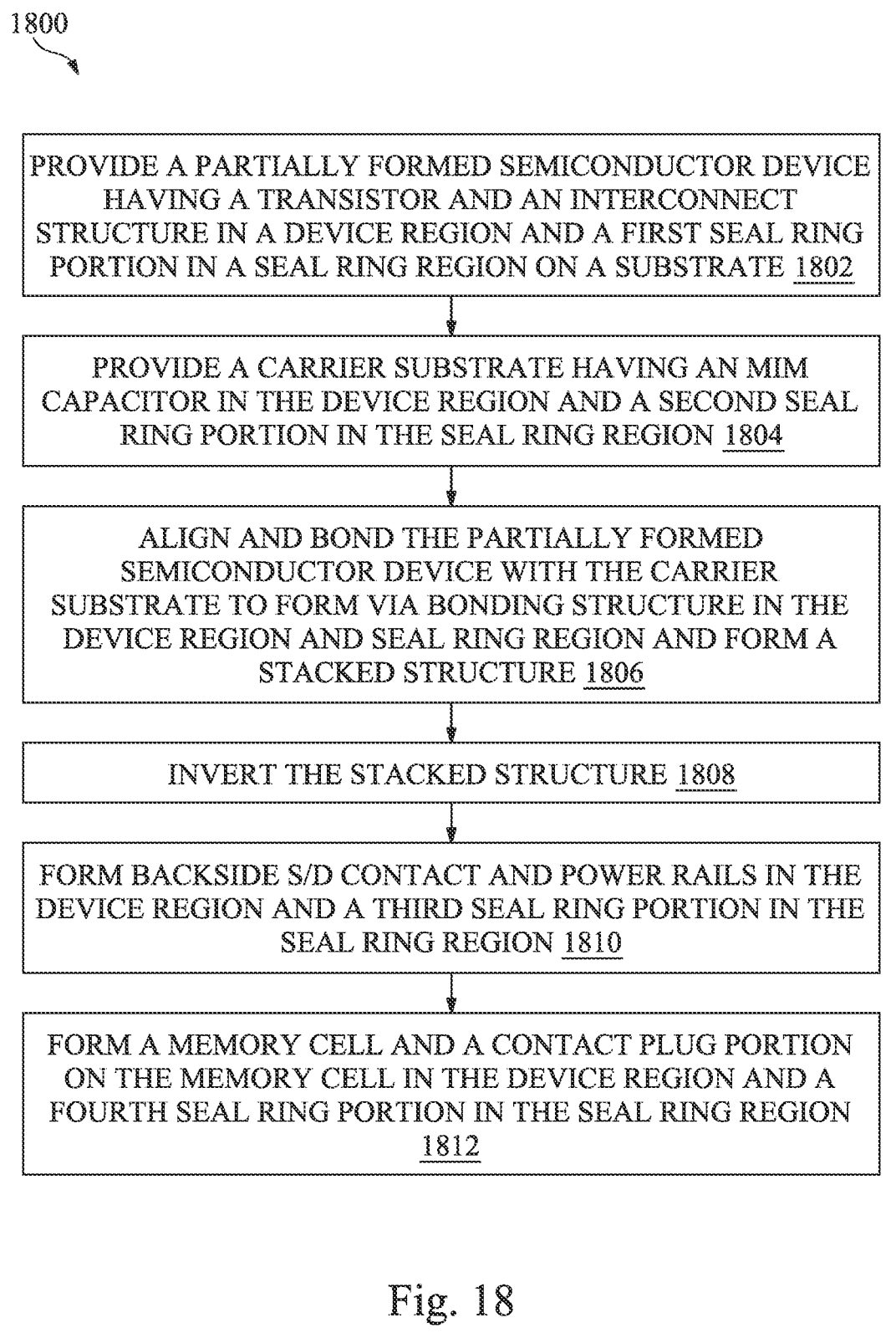

1800

PROVIDE A PARTIALLY FORMED SEMICONDUCTOR DEVICE HAVING A TRANSISTOR AND AN INTERCONNECT STRUCTURE IN A DEVICE REGION AND A FIRST SEAL RING PORTION IN A SEAL RING REGION ON A SUBSTRATE 1802

PROVIDE A CARRIER SUBSTRATE HAVING AN MIM CAPACITOR IN THE DEVICE REGION AND A SECOND SEAL RING PORTION IN THE SEAL RING REGION 1804

ALIGN AND BOND THE PARTIALLY FORMED SEMICONDUCTOR DEVICE WITH THE CARRIER SUBSTRATE TO FORM VIA BONDING STRUCTURE IN THE DEVICE REGION AND SEAL RING REGION AND FORM A STACKED STRUCTURE 1806

INVERT THE STACKED STRUCTURE 1808

FORM BACKSIDE S/D CONTACT AND POWER RAILS IN THE DEVICE REGION AND A THIRD SEAL RING PORTION IN THE SEAL RING REGION 1810

FORM A MEMORY CELL AND A CONTACT PLUG PORTION ON THE MEMORY CELL IN THE DEVICE REGION AND A FOURTH SEAL RING PORTION IN THE SEAL RING REGION 1812

Fig. 18

MEMORY DEVICE STRUCTURE AND METHOD

FIELD

Embodiments of the present disclosure relate generally to semiconductor devices, and more particularly to memory devices.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. Such scaling down has also increased the complexity of processing and manufacturing ICs. Other ways of overcoming the complexity and the physical limitation of manufacturing ICs have been considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic diagram illustrating cross-sectional view of an example memory device, in accordance with some embodiments.

FIGS. 3A-3H are schematic diagrams illustrating cross-sectional views of intermediate stages in the formation of the memory device of FIG. 1A, in accordance with some embodiments.

FIG. 4 is a schematic diagram illustrating cross-sectional view of another example memory device, in accordance with some embodiments.

FIG. 5 is a flow diagram illustrating an example method for fabricating the memory device of FIG. 4, in accordance with some embodiments.

FIGS. 6A-6H are schematic diagrams illustrating cross-sectional views of intermediate stages in the formation of the memory device of FIG. 4, in accordance with some embodiments.

FIG. 8 is a flow diagram illustrating an example method for fabricating the memory device of FIG. 7, in accordance with some embodiments.

FIGS. 9A-9H are schematic diagrams illustrating cross-sectional views of intermediate stages in the formation of the memory device of FIG. 7, in accordance with some embodiments.

FIG. 10 is a schematic diagram illustrating cross-sectional view of another example memory device, in accordance with some embodiments.

FIG. 11 is a flow diagram illustrating an example method for fabricating the memory device of FIG. 10, in accordance with some embodiments.

FIGS. 12A-12H are schematic diagrams illustrating cross-sectional views of intermediate stages in the formation of the memory device of FIG. 10, in accordance with some embodiments.

FIG. 18 is a flow diagram illustrating an example method for fabricating the stacked structure shown in FIG. 17, in accordance with some embodiments.

DETAILED DESCRIPTION OF THE INVENTION

Figure 1B:
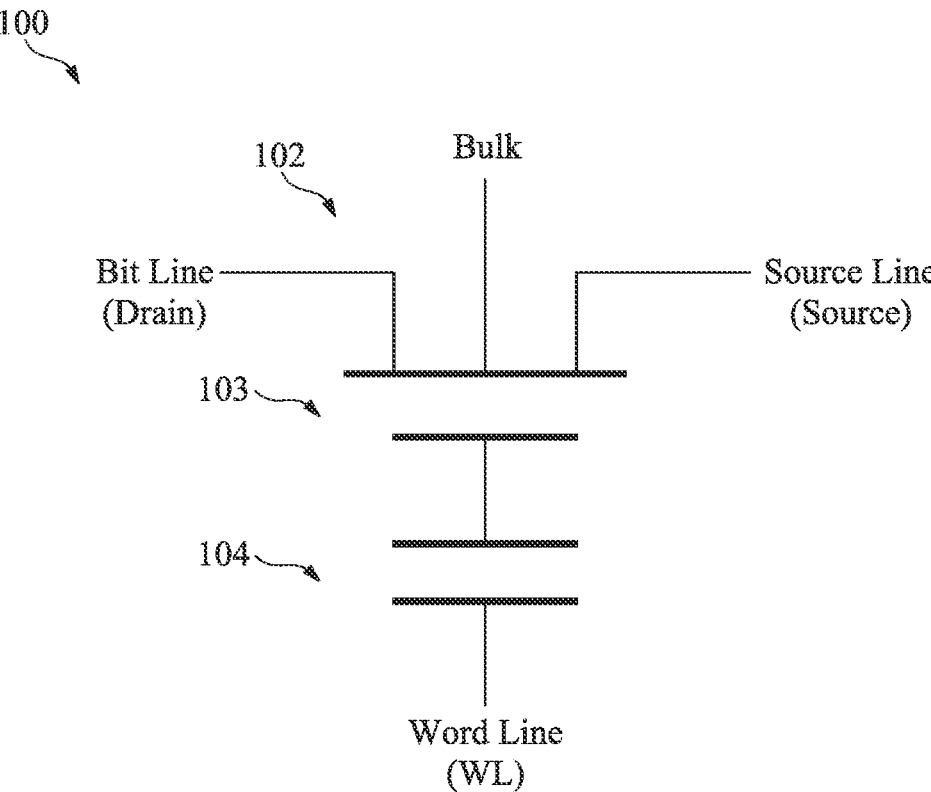
FIG. 1B is a circuit diagram of the 1T1C memory cell of FIG. 1, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and may not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Terms such as "about," "approximately," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Structures disclosed herein can be patterned by various methods. For example, the fin structures can be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is removed, and the remaining spacers can be used to pattern the fin structures.

Various layers or components of the devices, memory cells, and structures according to the present disclosure may be formed by suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), atomic layer CVD (AL-CVD), atmospheric pressure CVD (AP-CVD), and/or other suitable techniques.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

One or more embodiments of the present disclosure improve the dimension limitation of integrated circuits (ICs) that causes low device density. For example, reducing the dimension of components such as transistors or memory cells to increase integration density becomes more and more challenging due to the physical limitation. The present disclosure provides novel memory cells having a transistor and a capacitor in a stacked configuration. The present disclosure further provides novel integrated structures having a memory cell and a logic device in a stacked configuration. The novel memory cells and integrated structures are capable of increasing integration density.

One insight provided in the present disclosure is related to a novel one-transistor-one-capacitor (1T1C) memory cell having a stacked and compact configuration. According to some embodiments, a 1T1C memory cell has a three-dimensional (3D) structure having a capacitor that is partially enclosed by the transistor. The capacitor is a metal-dielectric-metal (MDM) type capacitor. The transistor includes a gate electrode (i.e., the transistor gate electrode) that is used as a metal electrode of the capacitor. Compared with traditional 1T1C memory cells having the transistor and capacitor isolated from each other or formed in different layers of the memory device, the transistor and capacitor of the present 1T1C memory cell are stacked in the vertical or horizontal direction, and the capacitor is partially enclosed by the transistor, therefore forming a more compact or condensed configuration. The memory cells according to the present disclosure may generally be used for non-volatile memory devices, such as Resistive Random Access Memory (RRAM) devices, Dynamic Random Access Memory (DRAM) devices, Magneto-Resistive Random Access Memory (MRAM), Ferroelectric Random Access Memory (FeRAM), or the like.

Another insight provided in the present disclosure is related to a stacked device structure with a memory cell stacked on and overlapped with the backside of a logic device to increase density. Traditionally, methods of increasing density were largely directed towards arranging both the memory cells (e.g., DRAM, RRAM, or the like) and the logic devices (e.g., integrated circuits) on the frontside of a substrate. That is, the logic device and the memory cells would be arranged side-by-side on the same plane (i.e., the frontside of the substrate). To further increase the density in the front side, reducing the dimensions of the components were the key factors.

Here, the stacked device structure according to the present disclosure increases the density of components by arranging the memory cells and the logic devices in an overlapped relationship which further reduces the area footprint of the IC. For example, an original substrate may be used for forming the logic device (e.g., a gate-all-around (GAA) device). The FEOL (front-end-of-line) and the MEOL (mid-end-of-line) processes may be performed to form a semiconductor device. After these processes are completed, the frontside of semiconductor device may be bonded with the frontside of a carrier wafer in a face-to-face manner to form a stacked structure. Next, the stacked structure may be flipped and then the backside of the original substrate may be thinned down, leaving only a portion of silicon or other semiconductor material of the original substrate after the thinning. On the backside, contact patterning and contact plug formation may be performed. The flipped wafer is then used as a substrate for forming additional devices such as power rails, memory cells (e.g., the present memory cells with compact structures), electric routings, etc., on the backside of the original substrate. Thereafter, a through oxide via (TOV) may be used to connect the backside memory cell to the power rail or the frontside logic device. The additional components and devices formed on the backside of the logic device are at least partially aligned and overlapped in the vertical direction, thereby increasing the overall integration density of the stacked structure.

Example Memory Devices Having Compact 1T1C Memory Cell

FIG. 1A is a schematic diagram illustrating a cross-sectional view of an example memory device 100, in accordance with some embodiments. In the illustrated example, the memory device 100 includes, among other components, a substrate 101, one or more dielectric layers (e.g., interlayer dielectric (ILD) layers) and a 1T1C memory cell 102. For example, the one or more dielectric layers may include a first interlayer dielectric (ILD) layer 120, a second ILD layer 130, a third ILD layer 140, etc. The 1T1C memory cell 102 has a stacked structure and includes a transistor 103 and a capacitor 104 stacked in the vertical direction (i.e., the Z-direction). The transistor 103 is also regarded as an access device, and the capacitor 104 is regarded as a storage device. As shown in FIG. 1A, the transistor 103 partially encloses the capacitor 104, forming a stacked and compact 1T1C structure. The 1T1C memory cell 102 may be formed in a dielectric layer (e.g., the ILD layer 120) of the memory device 100. Compared with traditional 1T1C memory device having the transistor and capacitor in two separate or isolated dielectric layers apart from each other, the 1T1C memory cell 102 according to the present disclosure has a more compact structure, which could improve the overall integration density of the memory device 100.

The substrate 101 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide or, and/or other suitable materials; an alloy semiconductor such as SiGe, GaAsP, AlInAs, AlGaAs, GaInAs, GaInP, GaInAsP; and/or other suitable materials. The substrate 101 may be a single-layer material having a uniform composition. Alternatively, the substrate 101 may include multiple material layers having similar or different compositions suitable for IC device manufacturing. In one example, the substrate 101 may be a silicon-on-insulator (SOI) substrate having a semiconductor silicon layer formed on a silicon oxide layer. In another example, the substrate 101 may include a conductive layer, a semiconductor layer, a dielectric layer, other layers, or combinations thereof.

The dielectric layers 120/130/140 or any other dielectric layers described herein may include a dielectric material, such as tetraethylorthosilicate (TEOS), a low-k dielectric material, doped silicon oxide (e.g., borophosphosilicate glass (BPSG), fused silica glass (FSG), phosphosilicate glass (PSG), boron doped silicon glass (BSG), etc.), and/or other suitable dielectric materials. The dielectric layers 120/130/140 may each further include a multi-layer structure having multiple dielectric materials. The dielectric layers 120/130/140 may be formed by a deposition process such as, for example, CVD, flowable CVD (FCVD), spin-on-glass (SOG) and/or other suitable methods.

The transistor 103 may be a planar field-effect transistor (FET), a thin-film FET, a three-dimensional (3D) FET, a fin FET (FinFET), a gate-all-around (GAA) FET, or some other suitable type of semiconductor device. In the illustrated example, the transistor 103 is a 3D FET and includes, among other components, a gate structure 106, two source/drain (S/D) regions 114a and 114b (collectively as 114), a channel region 115, two S/D electrodes 119a and 119b (collectively as 119). The transistor 103 may further include two via contacts 125a and 125b (collectively as 125). The gate structure 106 further includes a metal gate 111 and a gate dielectric layer 112. The capacitor 104 has a planar-type metal-dielectric-metal (MDM) structure and includes a floating gate 122, a high-k dielectric layer 121, and the metal gate 111. As shown in FIG. 1A, the transistor 103 and the capacitor 104 share the metal gate 111 and are electrically coupled to each other via the metal gate 111.

The gate dielectric layer 112 of the gate structure 106 may include a dielectric material such as, but not limited to, silicon oxide ($SiO_2$), silicon nitride ($Si_3N_4$), silicon oxynitride ($SiO_xN_y$), hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium silicate, zirconium aluminate, zirconium oxide, titanium oxide, aluminum oxide ($Al_2O_3$), hafnium dioxide-alumina ($HfO_2$—$Al_2O_3$) alloy, or combinations thereof. Other suitable dielectric materials for forming the gate dielectric layer 112 are within the contemplated scope of the present disclosure.

The high-k dielectric layer 121 of the capacitor 104 may include a high-k dielectric material. The high-k dielectric material may be defined as a dielectric material with a dielectric constant greater than that of $SiO_2$. In many embodiments, the high-k dielectric layer 121 includes hafnium, oxygen, lanthanum, aluminum, titanium, zirconium, tantalum, silicon, other suitable materials, or combinations thereof. In some embodiments, the high-k dielectric layer 121 includes a material selected from the group consisting of carbon-doped oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof. In various embodiments, the high-k dielectric layer 121 includes oxides or nitrides of the elements listed above. In an example embodiment, the high-k dielectric layer 121 includes hafnium oxide, such as $HfO_2$.

In some embodiments, the gate dielectric layer 112 and the high-k dielectric layer 121 may each be formed by, for example, but not limited to, sputtering, CVD, PVD, ALD, plasma-enhanced ALD, molecular beam epitaxy (MBE), combinations thereof, or other suitable techniques. In some embodiments, the gate dielectric layer 112 and the high-k dielectric layer 121 may each include one or more layers, each being made using one or more of the dielectric materials mentioned above.

In the capacitor 104 illustrated in FIG. 1A, the floating gate 122 is disposed in the IDL layer 120, and the high-k dielectric layer 121 is disposed on and in physical contact with the floating gate 122. The metal gate 111 of the gate structure 106 is disposed on and in physical contact with the high-k dielectric layer 121. In some embodiments, the metal gate 111 may have a 3D configuration, extending vertically from a bottom surface 123 to a top surface 116 and extending horizontally from a first sidewall 117 to a second sidewall 118. The bottom surface 123 of the metal gate 111 is co-planar with the bottom surface of the high-k dielectric layer 121, and the metal gate 111 has a length (i.e., the horizontal dimension in the X-direction) larger than a length of the high-k dielectric layer 121, such that the high-k dielectric layer 121 is partially enclosed in a bottom portion of the metal gate 111. The gate dielectric layer 112 of the gate structure 106 has two side portions, two edge portions, and a top portion, the two side portions are respectively disposed on the two sidewalls 117 and 118 of the metal gate 111, the two edge portions are respectively disposed on the top surface 116 proximate to sidewalls 117 and 118, and the top portion is disposed on a central majority of the top surface 116.

In some embodiments, the capacitor 104 has a planar-type shape or configuration. For example, the high-k dielectric layer 121 has a length ($L_1$) defined by the horizontal dimension in the X-direction, a height ($H_1$) defined by the vertical dimension in the Z-direction. $L_1$ is substantially larger than $H_1$. In other words, the high-k dielectric layer 121 has an aspect ratio ($H_1/L_1$) substantially less than 1. The metal gate 111 has a length ($L_2$) defined by the horizontal dimension in the X-direction, a height ($H_2$) defined by the vertical dimension in the Z-direction. $L_2$ may be equal to, larger, or smaller than $H_1$. In other words, the metal gate 111 has an aspect ratio ($H_2/L_2$) equal to, larger, or smaller than 1. Comparing the high-k dielectric layer 121 and the metal gate 111, $L_2$ is larger than $L_1$. In some embodiments, $H_2$ is substantially larger than $H_1$.

The floating gate 122 may include a conductive material such as polysilicon, silicon nitride (SiN), metal such as aluminum (Al) or tungsten (W), or conductive polymers such as poly(3-hexylthiophene) (P3HT) or poly(ethylene dioxythiophene) (PEDOT). The metal gate 111 may include a work function metal such as TiN, TaN, Ru, Mo, Al, WN, ZrSi2, MoSi2, TaSi2, NiSi2, WN, Ti, Ag, TaAl, TaAIC, TiAIN, TaC, TaCN, TaSiN, Mn, Zr, other suitable work function materials, or combinations thereof. The work function metal may include a plurality of layers and may be deposited by ALD, CVD, PVD, other suitable processes, or combinations thereof. In some embodiments, the metal gate 111 includes TiN.

In some embodiments, the transistor 103 further includes a semiconductor layer 113 disposed on the gate dielectric layer 112. The two S/D regions 114a and 114b and the channel region 115 may be formed in the semiconductor layer 113. For example, the two S/D regions 114a and 114b are formed respectively on two side portions and/or edge portions of the semiconductor layer 113 positioned at or proximate to the two sidewalls 117 and 118 of the metal gate 111, and the channel region 115 is formed on a top portion of the semiconductor layer 113 positioned over and proximate to the top surface 116 of metal gate 111.

The semiconductor layer 113 may include an oxide semiconductor material such as, but not limited to, indium gallium zinc oxide (IGZO), indium zinc oxide (IZO), zinc oxide (ZnO), indium tin oxide (InSnO), tungsten-doped indium oxide (InWO), gallium oxide ($GaO_x$), indium oxide ($InO_x$), and the like. In some embodiments, the semiconductor layer 113 may further include, for example, but not limited to, amorphous silicon, crystalline silicon, or the like. Other suitable materials for forming the semiconductor layer 113 are within the contemplated scope of the present disclosure.

In some embodiments, the semiconductor layer 113 is an IGZO layer formed by indium (In), gallium (Ga), zinc (Zn) and oxygen (O), as mentioned above. IGZO is an amorphous semiconductor material, which has 20-50 times the electron mobility of amorphous silicon. It can be deposited as a uniform amorphous phase while retaining the high carrier mobility. IGZO can be formed at relatively low-temperature and can be used in junctionless transistor operation, and avoid charge trapping, which occurs in inversion mode operation. The ratio of In, Ga, Zn, and O of IGZO can be adjusted to meet various design requirements. In addition, the ability to deposit the IGZO at relatively low temperatures low represents a particular advantage. The IGZO may also be deposited on sidewalls or conformably on any desired structure to a precise thickness, allowing the fabrication of 3D transistors having any desired geometry. Additionally, deposition of the IGZO may be compatible with deposition of many materials such as the gate dielectric layer 112.

The IGZO layer may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). The relative content of gallium, indium, zinc, and oxygen may be varied depending on design requirements.

The IGZO layer can be manufactured using a synthesis method, for example, a low temperature ALD process, for example, at or below 250° C. Alternatively, IGZO layer can be manufactured using solution processing, such as a pulsed laser deposition (PLD), or spin coating, which involves depositing In and Ga solution layers onto a hot plate and annealing at temperatures roughly between 200° C. and 400° C., depending on the target composition. Subsequently, the films can be annealed in air. However, other suitable methods can also be used to form the IGZO layer in alternative embodiments. The IGZO layer may have a thickness from about 0.1 nm to about 500 nm, from about 0.5 to about 50 nm, or from about 1 nm to about 10 nm.

In some embodiments, the S/D regions 114 may be formed in the IGZO layer (i.e., semiconductor layer 113) by doping the corresponding side portions and/or edge portions of the semiconductor layer 113 with ion impurities using techniques such as ion implantation. Alternatively, the S/D regions 114 may be formed by adjusting the ratio of In, Ga, Zn, and O in the corresponding side portions and/or edge portions of the semiconductor layer 113. Still alternatively, the S/D regions 114 may be formed by annealing the IGZO layer at selective temperatures after the IGZO layer is formed.

In some embodiments, an S/D layer (not shown) separate from the semiconductor layer 113 is disposed on the gate dielectric layer 112, and the semiconductor layer 113 is disposed on the S/D layer after the S/D regions 114 are formed in the S/D layer. The S/D regions 114a and 114b may be formed in the corresponding portions of the S/D layer positioned at or proximate to the two sidewalls 117 and 118 of the metal gate 111, respectively. A top portion of the S/D layer between the S/D regions 114a and 114b may be removed to form a gap that separates and isolates the two S/D regions 114a and 114b. A portion of the semiconductor layer 113 deposited on the S/D layer may fill the gap and form the channel region 115, which is connected to both the S/D regions 114a and 114b. The S/D layer may include a semiconductor material such as Germanium (Ge) or silicon-germanium (SiGe), metal silicides such as titanium silicide, tungsten silicide, or cobalt silicide, or doped polysilicon. The S/D regions 114 may be formed by doping the corresponding portions of the S/D layer with impurities using doping techniques such as ion implantation.

The two S/D electrodes 119a and 119b are respectively disposed on the two S/D regions 114a and 114b. The S/D electrodes 119 may include a conductive material similar to the metal gate 111, such as TIN, TaN, Ru, Mo, Al, WN, $ZrSi_2$, $MoSi_2$, $TaSi_2$, $NiSi_2$, WN, Ti, Ag, TaAl, TaAIC, TiAIN, TaC, TaCN, TaSiN, Mn, Zr, or a combination thereof. In some embodiments, the S/D electrodes 119 include TiN.

The memory device 100 may further include two via contacts 125a and 125b (collectively as via contacts 125) respectively disposed on and coupled with the two S/D electrodes 119a and 119b. The two via contacts 125a and 125b include a conductive material and are configured to electrically connect the two S/D electrodes 119a and 119b to another feature or component in the memory device 100.

FIG. 1B is a circuit diagram of the 1T1C memory cell 102 in FIG. 1A, in accordance with some embodiments. In the illustrated example, the 1T1C memory cell 102 includes the transistor 103 coupled to the capacitor 104. The 1T1C memory cell 102 is electrically addressable via a bit line (BL) coupled to the drain region 114a/114b of the transistor 103 and a source line (SL) coupled to the source region 114b/114a and a word line (WL) coupled to the floating gate 122 of the capacitor 104. As mentioned above, the capacitor 104 is between the WL and the transistor 103 and coupled to the gate structure 106 of transistor 103, such that the capacitor 104 and the transistor 103 share the metal gate 111. Thus, the capacitor 104 of the 1T1C memory cell 102 is sometimes also referred to as a "WL capacitor." Multiple 1T1C memory cells 102 can be arranged in rows and columns to form a memory array, in accordance with some embodiments. The circuit diagram shown in FIG. 1B may also represent the 1T1C memory cell 402 (shown in FIG. 4), the 1T1C memory cell 702 (shown in FIG. 7), and 1T1C memory cell 1002 (shown in FIG. 10), which are variations of the 1T1C memory cell 102 of FIG. 1A.

It should be noted that the 1T1C memory cell 102 shown in FIG. 1B is for illustrative purpose only, and memory cells having multiple transistors and/or multiple capacitors with a stacked and compact structure are also within the scope of the present disclosure. For example, an 2T2C memory cell may have two transistors proximate to and coupled with each other in the horizontal direction as well as two capacitors respectively enclosed in the two transistors, in a similar manner as the 1T1C memory cell 102. Other examples of memory cells (e.g., 1T2C, 2T1C, 4T4C, 8T8C) with the same of similar compact structure of the memory cell 102 are also contemplated within the scope of the present disclosure.

Figure 2:
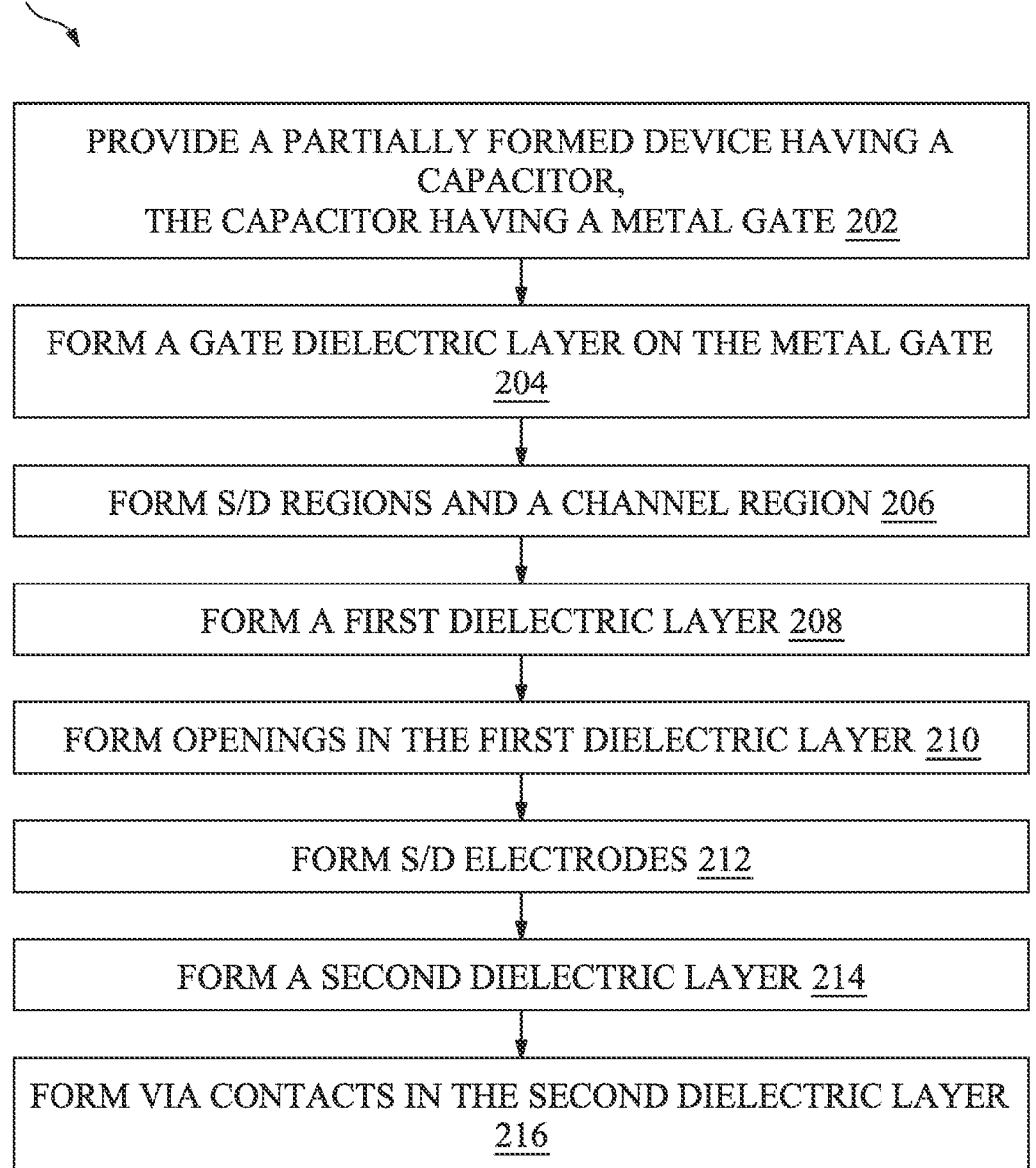
FIG. 2 is a flow diagram illustrating an example method for fabricating the memory device of FIG. 1A, in accordance with some embodiments.

FIG. 2 is a flow diagram illustrating an example method 200 for fabricating the memory device 100 of FIG. 1A according to some embodiments. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3H, which illustrate a portion of the memory device 100 during the intermediate steps of the method 200. FIGS. 3A-3H are schematic diagrams illustrating cross-sectional views of intermediate stages in the formation of the memory device 100, in accordance with some embodiments.

At 202, referring to FIG. 3A, a partially formed memory device 100 is provided and received. Any of numerous processes used in semiconductor fabrication may be used to make the illustrated partially formed device 100. The partially formed memory device 100 includes a dielectric layer 120 and a capacitor 104. The capacitor includes a floating gate 122 (i.e., bottom floating gate) disposed in the dielectric layer 120, a high-k dielectric layer 121 disposed on the floating gate 122, and a metal gate 111 disposed on the high-k dielectric layer 121.

At 204, referring to FIG. 3B, a gate dielectric layer 112 is formed and deposited on the metal gate 111. In some embodiments, the gate dielectric layer 112 is deposited using ALD. The gate dielectric layer 112 is disposed on the top surface 116 as well as two sidewalls 117 and 118 of the metal gate 111. The gate dielectric layer 112 and the metal gate 111 form the gate structure 106.

At 206, referring to FIG. 3C, two S/D regions 114a and 114b as well as a channel region 115 are formed. In some embodiments, a semiconductor layer 113 is formed and deposited on the gate dielectric layer 112. Then, the two S/D regions 114a and 114b are respectively formed in two side portions of the semiconductor layer 113. The two S/D regions 114a and 114b are respectively positioned proximate to the first sidewall 117 and second sidewall 118 of the metal gate 111. The channel region 115 is formed in a top portion of the semiconductor layer 113.

In some embodiments, an S/D layer (not shown) is formed and deposited on the gate dielectric layer 112. The two S/D regions 114a and 114b are respectively formed in two side portions and/or edge portions of the S/D layer. A top portion of the S/D layer is removed to form a gap between the two S/D regions 114. The gap separates and isolates the two S/D regions 114a and 114b from each other. Then, a semiconductor layer 113 is formed and deposited on the S/D layer and fills the gap between the two S/D regions 114. In some embodiments, the semiconductor layer 113 is an IGZO layer deposited using ALD.

At 208, referring to FIG. 3D, a dielectric layer 130 is formed. The dielectric layer 130 is deposited on and covers the semiconductor layer 113. A planarization such as a chemical mechanical polish (CMP) process may be performed to planarize the top surface of the dielectric layer 130.

At 210, referring to FIG. 3E, two openings 304a and 304b are formed in the dielectric layer 130. The openings 304a and 304b may be formed by performing a patterning and etching process to remove portions of the dielectric layer 130 and expose the corresponding S/D regions 114 of the semiconductor layer 113. The etching process may be a dry etching process, a wet etching process, a reactive ion etching (RIE) process, a neutral beam etching (NBE) process, other suitable methods, or combinations thereof. For example, a dry etching process may use chlorine-containing gases, fluorine-containing gases, and/or other etching gases. The wet etching solutions may include ammonium hydroxide (NH₄OH), hydrofluoric acid (HF) or diluted HF, deionized water, tetramethylammonium hydroxide (TMAH), and/or other suitable wet etching solutions.

At 212, referring to FIG. 3F, two S/D electrodes 119 are formed respectively. The two S/D electrodes 119a and 119b may be formed by depositing a metal layer to fill the two openings 304a and 304b, respectively. A CMP process may be performed to remove excess metal layer and planarize the top surface of the two S/D electrodes 119a and 119b. As such, the transistor 103 is formed above and aligned with the capacitor 104 in the vertical direction, and the metal gate 111 is shared by the capacitor 104 and the transistor 103, forming a stacked and compact structure of the 1T1C memory cell 102.

At 214, referring to FIG. 3G, a dielectric layer 140 (i.e., an ILD layer 140) is formed. The dielectric layer 140 may be deposited on the two S/D electrodes 119a and 119b and the dielectric layer 302. A CMP process may be performed to planarize the top surface of dielectric layer 140.

At 216, referring to FIG. 3H, two S/D via contacts 125a and 125b are formed. The via contacts 125a and 125b may be formed by forming two via openings (not shown) using a patterning and etching process to respectively expose a top surface of the S/D electrodes 119a and 119b, depositing a conductive layer to fill the two via openings, and performing a CMP process to remove excess conductive layer and planarize the top surface of the via contacts 125a and 125b.

FIG. 4 is a schematic diagram illustrating a cross-sectional view of another example memory device 400, in accordance with some embodiments. The memory device 400 is a variation of the memory device 100 shown in FIG. 1A. In the illustrated example, the memory device 400 includes, among other components, a substrate 401, one or more dielectric layers 420/430/440, and a 1T1C memory cell 402. The memory device 400 may further include two via contacts 425a and 425b (collectively as 425). Similar to the 1T1C memory cell 102, the 1T1C memory cell 402 also has a stacked structure and includes a transistor 403 and a capacitor 404 stacked in the vertical direction (i.e., the Z-direction). A difference between the 1T1C memory cell 402 and the 1T1C memory cell 102 is that the capacitor 404 of the 1T1C memory cell 402 lies over the transistor 403 in the 1T1C memory cell 402, and the floating gate 422 is at the top of the 1T1C memory cell 402.

Various components of the memory device 400 and aspects thereof, such as the substrate 401, dielectric layers 420/430/440, transistor 403, capacitor 404, and the via contacts 425 are similar to the substrate 101, dielectric layers 120/130/140, transistor 103, capacitor 104, and the via contacts 125 of the memory device 100, respectively, and thus will not be repeated unless otherwise indicated.

In the illustrated example of the 1T1C memory cell 402, the transistor 403 includes two S/D electrodes 419a and 419b (collectively as 419), a semiconductor layer 413 disposed on the two S/D electrodes 419, a gate dielectric layer 412 disposed on the semiconductor layer 413, a metal gate 411 disposed on the gate dielectric layer 412. The 1T1C memory cell 402 may further include two S/D regions 414a and 414b (collectively as 414) and a channel region 415. The two S/D regions 414 are respectively formed in two side portions and/or edge portions of the semiconductor layer 413, and the channel region 415 is formed in a bottom portion of the semiconductor layer 413. The metal gate 411 and the gate dielectric layer 412 form the gate structure 406. The capacitor 404 includes the metal gate 411, a high-k dielectric layer 421 disposed on the metal gate 411, and a floating gate 422 disposed on the high-k dielectric layer 421. In this arrangement, the capacitor 404 lies over and is vertically aligned with the transistor 403, and the capacitor 404 and the transistor 403 share the metal gate 411.

FIG. 5 is a flow diagram illustrating an example method 500 for fabricating the memory device 400 of FIG. 4 according to some embodiments. The method 500 is described below in conjunction with FIGS. 6A-6H, which illustrate a portion of the memory device 400 during the intermediate steps of the method 500. FIGS. 6A-6H are schematic diagrams illustrating cross-sectional views of intermediate stages in the formation of the memory device 400, in accordance with some embodiments.

At 502, referring to FIG. 6A, a partially formed device 400 is provided. The device 400 includes a first dielectric layer 420 and two separate via contacts 425a and 425b respectively formed in a top portion the first dielectric layer 420. A second dielectric layer 430 (e.g., an oxide layer) is formed on the first dielectric layer 420 and the via contacts 425a and 425b.

At 504, referring to FIG. 6B, two first openings 604 and 606 are respectively formed over the two via contacts 425a and 425b, such that a top surface of the via contacts 425a and 425b is exposed to the openings 604 and 606, respectively. The two separate first openings 604 and 606 may be formed by performing a patterning and etching process to remove the corresponding portions of the second dielectric layer 430.

Figure 6C:
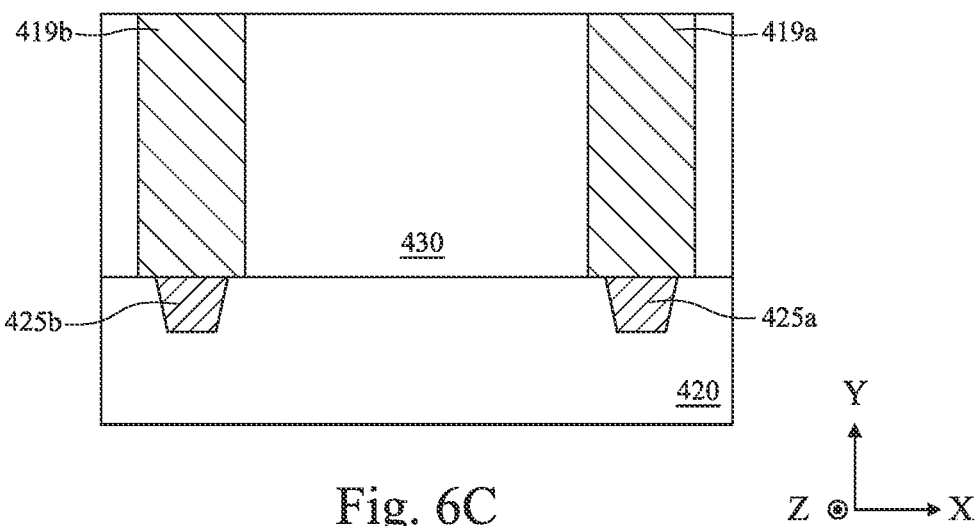

At 506, referring to FIG. 6C, two separate S/D electrodes 419a and 419b are respectively formed. The S/D electrodes 419a and 419b may be formed by depositing a conductive layer to fill the first openings 604 and 606, followed by a CMP process to remove the excess conductive layer. The two separate S/D electrodes 419a and 419b are respectively coupled to the two via contacts 425a and 425b.

Figure 6D:
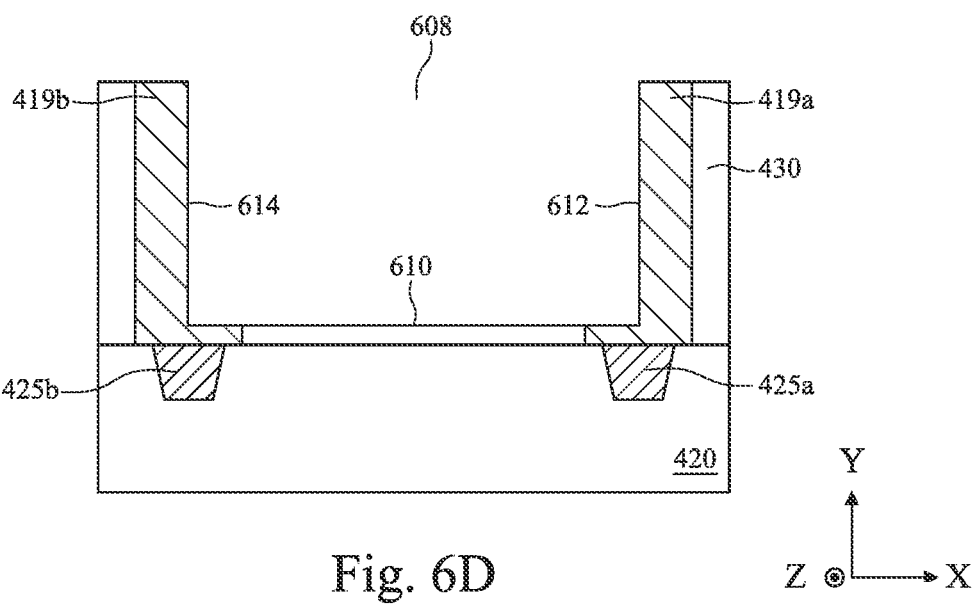

At 508, referring to FIG. 6D, a second opening 608 is formed. The second opening 608 may be formed by a patterning and etching process to remove an inner side portion of each of the two S/D electrodes 419a and 419b as well as a major portion of the second dielectric layer 430 between the two S/D electrodes 419a and 419b. The second opening 608 may be characterized by a first sidewall 612 of the S/D electrode 419a, a second sidewall 614 of the S/D electrode 419b, and a bottom surface 610. The bottom surface 610 is above a bottom surface of the second dielectric layer 430, such that a bottom surface of each of the two S/D electrodes 419a/419b remains connected to the corresponding via contact 425a/425b.

Figure 6E:
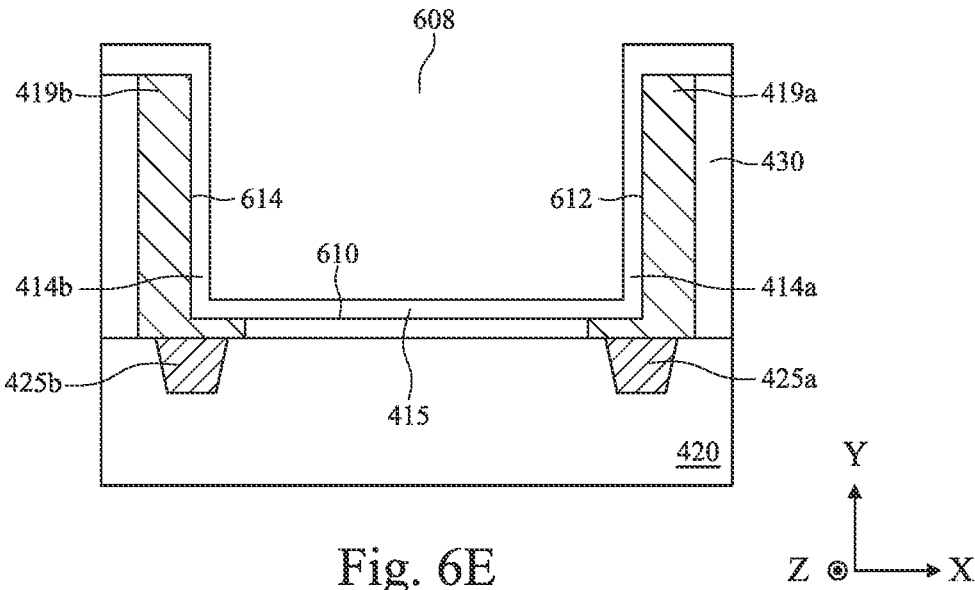

At 510, referring to FIG. 6E, two S/D regions 414a and 414b as well as a channel region 415 are formed. In some embodiments, a semiconductor layer 413 is formed and deposited in the second opening 608. The semiconductor layer 413 may be deposited using ALD and covers the sidewalls 612 and 614 as well as the bottom surface 610 in the second opening 608. The side portions and edge portions of the semiconductor layer 413 respectively close to the sidewalls 612 and 614 may form the S/D regions 414a and 414b, respectively. The bottom portion of the semiconductor layer 413 may form the channel region 415. In some embodiments, the semiconductor layer 413 is an IGZO layer formed using ALD.

In alternative embodiments, an S/D layer (not shown) may be formed in the second opening 608 and covers the sidewalls 612 and 614 as well as the bottom surface 610 in the second opening 608. The S/D regions 414a and 414b may be respectively formed by treating the corresponding portions of the S/D layer disposed on the sidewalls 612 and 614. A bottom portion of the S/D layer may be removed to form a gap that separates and isolates the two S/D regions 414. Then the semiconductor layer 413 is formed and deposited on the S/D layer and fills the gap between the two isolated S/D regions 414. The portion of the semiconductor layer 413 filled in the gap between the two isolated S/D regions 414 form the channel region 415, which is connected to the two S/D regions 414.

Figure 6F:
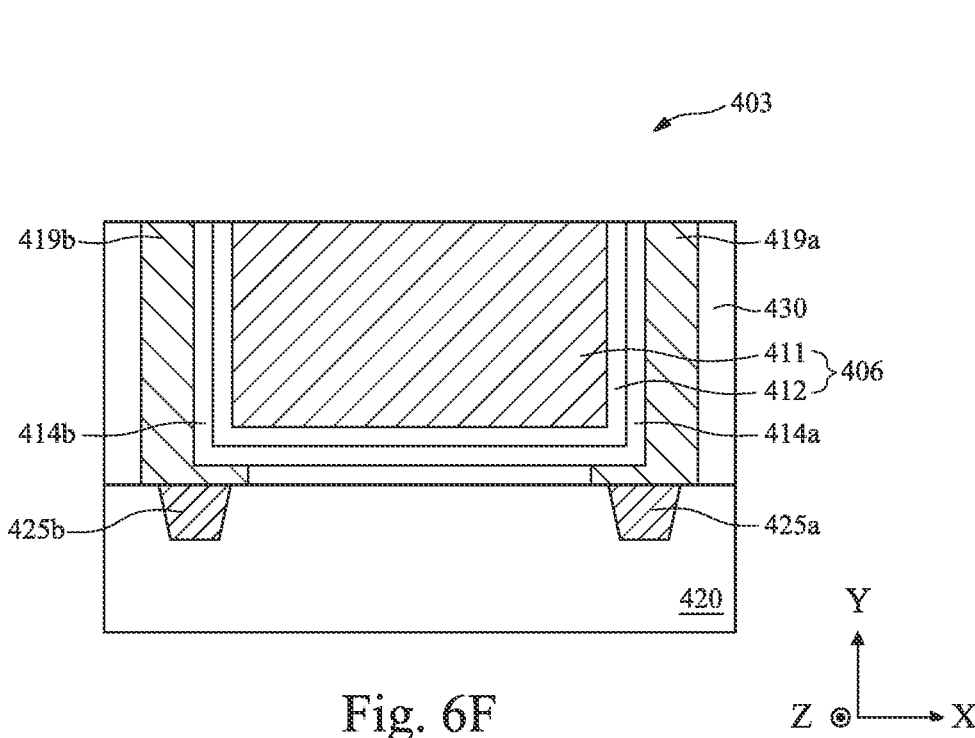

At 512, referring to FIG. 6F, a gate structure 406 is formed. The gate structure 406 may be formed by depositing a gate dielectric layer 412 on the S/D regions 414 and the channel region 415 in the second opening 608, depositing a metal layer on the gate dielectric layer 412 and fill the second opening 608 to form a metal gate 411, and performing a CMP process to remove excess metal layer and planarize the top surface of the metal gate 411. In some embodiments, the gate dielectric layer 412 and metal gate 411 are deposited using ALD. As such, a transistor 403 is formed.

Figure 6G:
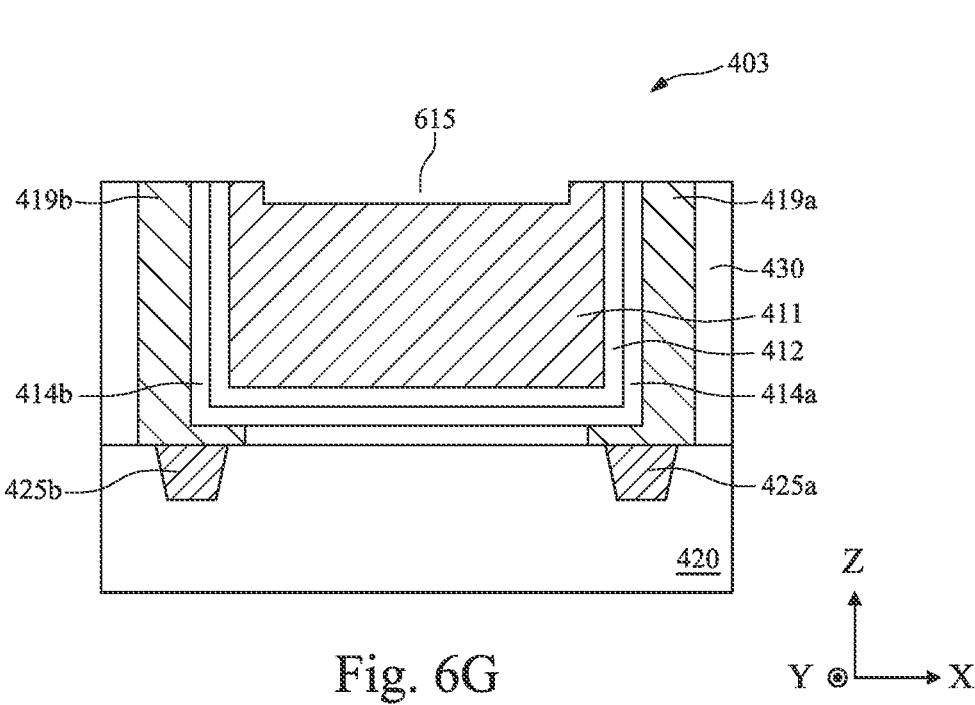

At 514, referring to FIG. 6G, a third opening 615 is formed. The third opening 615 may be formed by performing a patterning and etching process to remove a top portion of the metal gate 411.

Figure 6H:
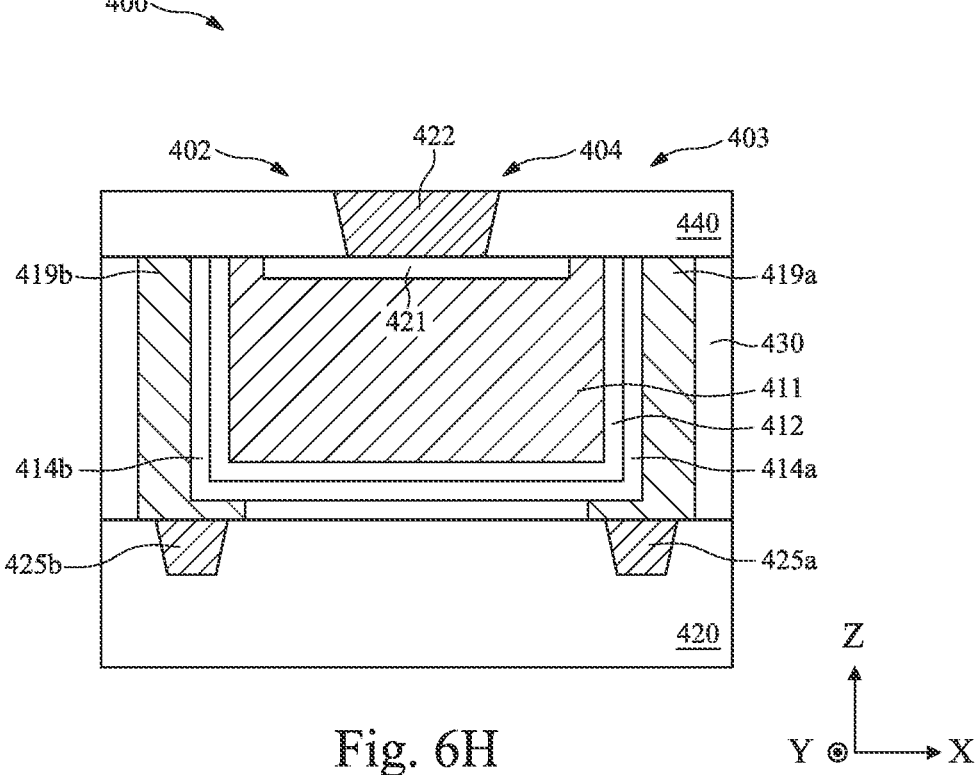

At 516, referring to FIG. 6H, a capacitor 404 is formed. In some embodiments, a high-k dielectric layer 421 is deposited on the metal gate 411 and fills in the third opening 615, and a CMP process is performed subsequently to remove excess high-k dielectric layer 421. A third dielectric layer 440 is formed on the second dielectric layer 430 to cover the top surface of the high-k dielectric layer 421, and a floating gate 422 (i.e., top floating gate) is subsequently formed in the third dielectric layer 440. The floating gate 422 may be formed by performing a patterning and etching process to remove a portion of the third dielectric layer 440 and expose a top surface of the high-k dielectric layer 421, depositing a conductive layer on the third dielectric layer 440 and filling the opening to form the floating gate 422, and performing a CMP process to remove excess metal layer and planarize the top surface of the floating gate 422. As such, the capacitor 404 is formed above and aligned with the transistor 403 in the vertical direction, and the metal gate 411 is shared by the capacitor 404 and the transistor 403, forming a stacked and compact structure of the 1T1C memory cell 402.

Figure 7:
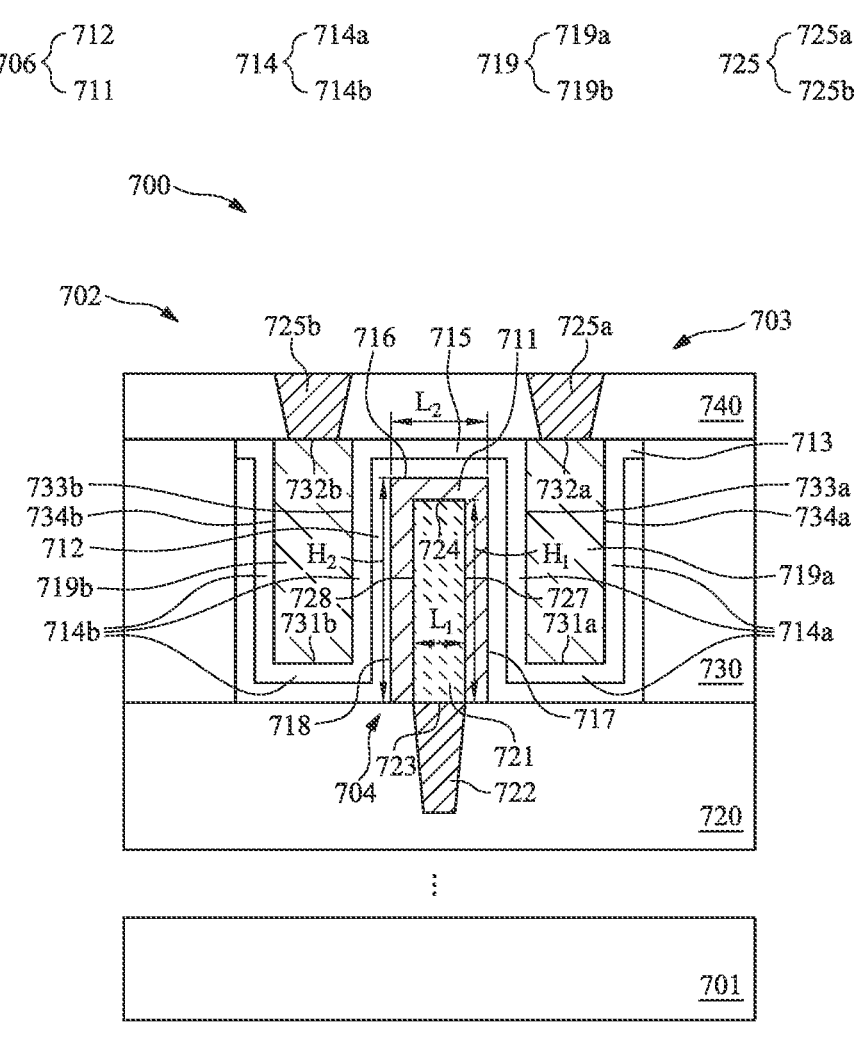
FIG. 7 is a schematic diagram illustrating cross-sectional view of another example memory device, in accordance with some embodiments.

FIG. 7 is a schematic diagram illustrating a cross-sectional view of another example memory device 700, in accordance with some embodiments. The memory device 700 is a variation of the memory device 100 shown in FIG. 1A. In the illustrated example, the memory device 700 includes, among other components, a substrate 701, one or more dielectric layers 720/730/740, and a 1T1C memory cell 702. The memory device 700 may further include two via contacts 725a and 725b (collectively as 725). A difference between the memory device 100 of FIG. 1 and the memory device 700 relates to the dimension and configuration of the capacitor. Compared with the capacitor 104 (shown in FIG. 1A) having a "planar-type" shape and configuration with a high-k dielectric layer 121 of relatively large horizontal dimension and relatively smaller vertical dimension, the capacitor 704 of the 1T1C memory cell 702 shown in FIG. 7 has a "cup-type" shape and configuration with a high-k dielectric layer 721 of relatively smaller horizontal dimension and relatively large vertical dimension.

Similar to the 1T1C memory cell 102, the 1T1C memory cell 702 also has a compact structure and includes a transistor 703 and a capacitor 704 partially enclosed by the transistor 703. The transistor 703 has a 3D structure and includes a gate structure 706, two S/D regions 714a and 714b (collectively as 714), a channel region 715, and two S/D electrodes 719a and 719b (collectively as 719). The gate structure 706 further includes a metal gate 711 and a gate dielectric layer 712. The capacitor 704 includes the metal gate 711, a floating gate 722, and a high-k dielectric layer 721 disposed between and enclosed by the metal gate 711 and the floating gate 722. In this arrangement, the transistor 703 and the capacitor 704 share the metal gate 711. The capacitor 704 is disposed between the two S/D electrodes 719a and 719b of the transistor 703 in the X-direction, resulting in a more compacted structure compared with traditional 1T1C memory cells. The floating gate 722 of the capacitor 704 is at the bottom of the 1T1C memory cell 702.

The floating gate 722 is formed in the first dielectric layer 720, the high-k dielectric layer 721 is disposed on the floating gate 722, extending vertically from a bottom surface 723 (i.e., the top surface of the floating gate 722) to a top surface 724 and extending horizontally a first sidewall 727 to a second sidewall 728 in the X-direction. The metal gate 711 is disposed on the high-k dielectric layer 721 and is in contact with the top surface 724 and the two sidewalls 727 and 728 of the high-k dielectric layer 721. The metal gate 711 extends vertically from a bottom surface (i.e., aligned with the bottom surface 723 of the high-k dielectric layer 721) to a top surface 716 and extends horizontally from a first sidewall 717 to a second sidewall 718 in the X-direction. The first sidewall 717 of the metal gate 711 is proximate to the first sidewall 727 of the high-k dielectric layer 721, and the second sidewall 718 of the metal gate 711 is proximate to the second sidewall 728 of the high-k dielectric layer 721. The top surface 716 of the metal gate 711 is over and aligned with the top surface 724 of the high-k dielectric layer 721 in the vertical direction.

In some embodiments, the capacitor 704 has a cup-type shape or configuration. For example, the high-k dielectric layer 721 has a length ($L_1$) and a height ($H_1$), and the metal gate 711 has a length ($L_2$) and a height ($H_2$). $L_2$ is larger than $L_1$, and $H_2$ is larger than $H_1$. In some embodiments, $H_1$ is substantially larger than $L_1$, and $H_2$ is substantially larger than $L_2$. In other words, the high-k dielectric layer 721 has an aspect ratio ($H_1/L_1$) substantially more than 1, and the metal gate 711 similarly has an aspect ratio ($H_2/L_2$) substantially more than 1.

Compared with the metal gate 111 of the memory device 100 shown in FIG. 1A, the metal gate 711 of the memory device 700 has a relatively smaller dimension (i.e., length) in the X-direction, and the high-k dielectric layer 721 of the memory device has a relatively large vertical dimension (i.e., height).

The gate dielectric layer 712 is disposed on the sidewalls 717 and 718 as well as the top surface 716 of the metal gate 711. In some embodiments, a semiconductor layer 713 is formed on the gate dielectric layer 712. The two S/D regions 714a and 714b are respectively formed in two side portions and/or edge portions of the semiconductor layer 713 positioned proximate to the sidewalls 727 and 728 of the metal gate 711. The channel region 715 is formed in a top portion of the semiconductor layer 713 aligned with and proximate to the top surface 716 of the metal gate 711.

In some embodiments, a S/D layer (not shown) is formed on the gate dielectric layer 712. The two S/D regions 714a and 714b are respectively formed in two side portions of the S/D layer positioned proximate to the sidewalls 727 and 728 of the metal gate 711. A top portion of the S/D layer proximate to the top surface 716 of the metal gate 711 may be removed to form a gap to separate and isolate the two S/D regions 714a and 714b. Then, the semiconductor layer 713 is formed, and a top portion of the semiconductor layer 713 proximate to the top surface 716 of the metal gate 711 fills the gap and form the channel region 715, which is connected to both the S/D regions 714a and 714b.

The two S/D electrodes 714a and 714b are respectively positioned at the two sidewalls 727 and 728 of the metal gate 711 and are aligned in the X-direction. The S/D electrode 719a is disposed on the S/D region 714a (i.e., the side portion of the semiconductor layer 713 proximate to the sidewall 727 of the metal gate 711), and the S/D electrode 719b is disposed on the S/D region 714b (i.e., the side portion of the semiconductor layer 713 proximate to the sidewall 728 of the metal gate 711). The S/D electrode 719a is substantially aligned with the metal gate 711, extends vertically from a bottom surface 731a to a top surface 732a, and extends horizontally from a proximal sidewall 733a (i.e., proximate to the sidewall 727 of the metal gate 711) to a distal sidewall 734a (i.e., distal to the sidewall 727 of the metal gate 711). Likewise, the S/D electrode 719b is substantially aligned with the metal gate 711, extends vertically from a bottom surface 731b to a top surface 732b, and extends horizontally from a proximal sidewall 733b (i.e., proximate to the sidewall 728 of the metal gate 711) to a distal sidewall 734b (i.e., distal to the sidewall 728 of the metal gate 711).

The S/D electrode 719a may be partially surrounded by the semiconductor layer 713. For example, the proximal sidewall 733a is covered by the S/D region 714a, the bottom surface 731a and the distal sidewall 734a are also covered by a portion of the semiconductor layer 713. In some embodiments, the portion of the semiconductor layer 713 disposed under the bottom surface 731a and on the distal sidewall 734a can also serve as an extension of the S/D region 714a. Likewise, the S/D electrode 719b may also be partially surrounded by the semiconductor layer 713. For example, the proximal sidewall 733b is covered by the S/D region 714b, the bottom surface 731b and the distal sidewall 734b are also covered by a portion of the semiconductor layer 713. In some embodiments, the portion of the semiconductor layer 713 disposed under the bottom surface 731b and on the distal sidewall 734b can also serve as an extension of the S/D region 714b. The top surfaces 732a and 732b of the S/D electrodes 719a and 719b are co-planar with a top surface of the channel region 715, and they are also aligned with the interface between the second dielectric layer 730 and the third dielectric layer 740. The two via contacts 725a and 725b are formed in the third dielectric layer 740 and are respectively coupled to the S/D electrodes 719a and 719b.

FIG. 8 is a flow diagram illustrating an example method 800 for fabricating the memory device 700 of FIG. 7 according to some embodiments. The method 800 is described below in conjunction with FIGS. 9A-9H, which illustrate a portion of the memory device 700 during the intermediate steps of the method 800. FIGS. 9A-9H are schematic diagrams illustrating cross-sectional views of intermediate stages in the formation of the memory device 700, in accordance with some embodiments.

At 802, referring to FIG. 9A, a partially formed device 700 is provided and received. The partially formed device 700 includes a dielectric layer 720 and a capacitor 704. The capacitor 704 includes a floating gate 722 (i.e., bottom floating gate) disposed in the dielectric layer 720, a high-k dielectric layer 721 disposed on the floating gate 722, and a metal gate 711 disposed on the high-k dielectric layer 721. The high-k dielectric layer 721 is partially enclosed by the metal gate 711, as mentioned above.

At 804, referring to FIG. 9B, a dielectric layer 902 containing a gate dielectric material is formed and deposited on the metal gate 711. The dielectric layer 902 is deposited on the top surface 716 as well as the two sidewalls 727 and 728 of the metal gate 711. A CMP process may be performed to planarize the top surface of the dielectric layer 902.

Figure 9C:
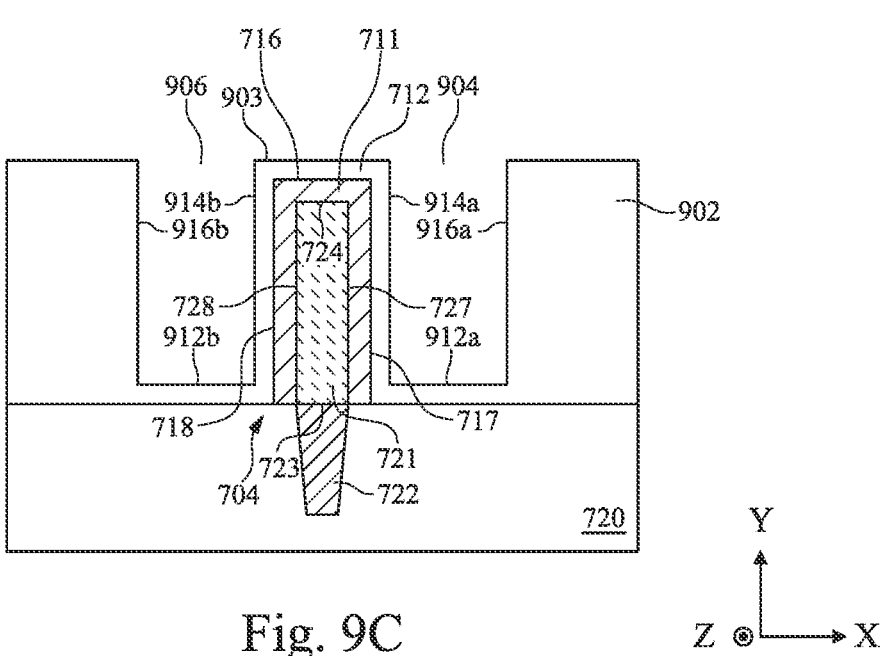

At 806, referring to FIG. 9C, two openings 904 and 906 are respectively formed at the two sides of the metal gate 711. The two openings 904 and 906 may be formed by performing a patterning and etching process to remove a corresponding portion of the dielectric layer 902. The two openings 904 and 906 are substantially aligned with the metal gate 711 in the X-direction. The opening 904 is characterized by a bottom surface 912a, a proximal side 914a (i.e., proximate to the sidewall 717 of the metal gate 711), and a distal side 916a (i.e., distal to the sidewall 717 of the metal gate 711). Likewise, the opening 906 is characterized by a bottom surface 912b, a proximal side 914b (i.e., proximate to the sidewall 718 of the metal gate 711), and a distal side 916b (i.e., distal to the sidewall 718 of the metal gate 711). The bottom surfaces 912a and 912b are elevated relative to the top surface of the dielectric layer

720. The remaining portions of the dielectric layer 902 disposed between the sidewall 727 and the proximal side 914a, between the sidewall 728 and the proximal side 914b, as well as the between the top surface 716 and the top surface 903 form the gate dielectric layer 712.

Figure 9D:
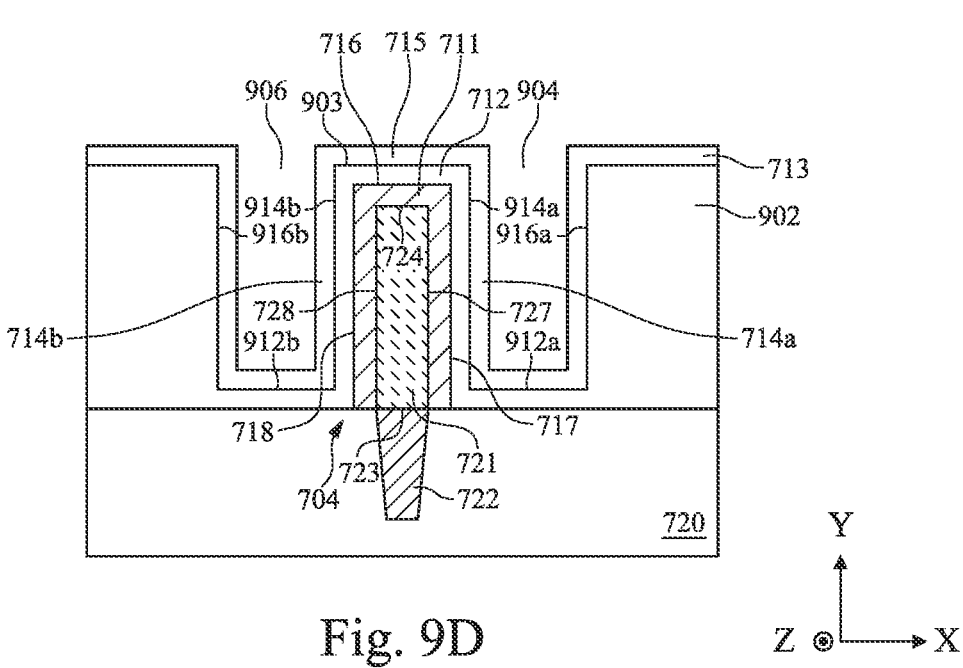

At 808, referring to FIG. 9D, two S/D regions 714a and 714b as well as a channel region 715 are formed. In some embodiments, a semiconductor layer 713 is formed in the openings 904 and 906 and over the gate dielectric layer 712. The semiconductor layer 713 is deposited on the top surface 903 of the dielectric layer 902, the two sides 914a/916a and 914b/916b, as well as the bottom surface 912a/912b of the opening 904/906. A top portion of the semiconductor layer 913 over the top surface 903 and aligned with the metal gate 911 may form the channel region 715. The portions of the semiconductor layer 713 disposed on the two sides 914a and 914b as well as the bottom surface 912a of the opening 904 may be further treated to form the S/D region 714a, and the portion of the semiconductor layer 713 disposed on the two sides 914b and 914b as well as the bottom surface 912b of the opening 906 may be further treated to form the S/D region 714b.

In some embodiments, an S/D layer (not shown) is formed in the openings 904 and 906 and over the gate dielectric layer 712. The S/D layer may be deposited on the top surface 903 of the dielectric layer 902, the two sides 914a/916a and 914b/916b, as well as the bottom surface 912a/912b of the opening 904/906. The portion of the S/D layer disposed on the two sides 914a and 914b as well as the bottom surface 912a of the opening 904 may be further treated to form the S/D region 714a, and the portion of the S/D layer disposed on the two sides 914b and 914b as well as the bottom surface 912b of the opening 906 may be further treated to form the S/D region 714b. The top portion of the S/D layer positioned over the top surface 903 and aligned with the metal gate 911 may be removed to form a gap that separates and isolates the S/D regions 714a and 714b. A semiconductor layer 713 may be formed on the S/D layer and fills the gap between the S/D regions 714a and 714b. The portion of the semiconductor layer 713 filled in the gap may form the channel region 715. In some embodiments, the semiconductor layer 713 is an IGZO layer deposited using ALD.

Figure 9E:
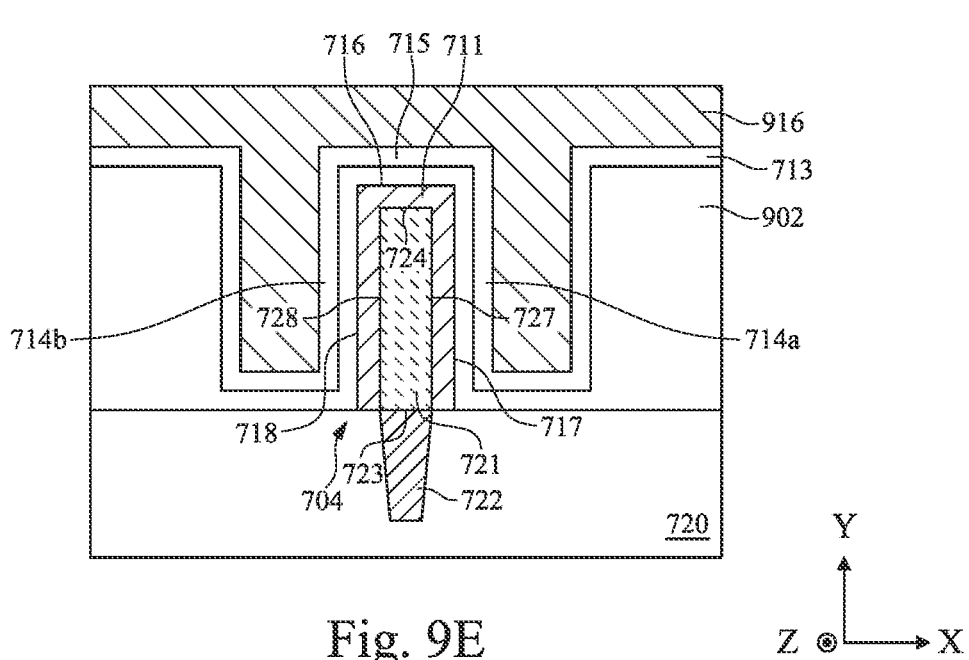
Figure 9F:
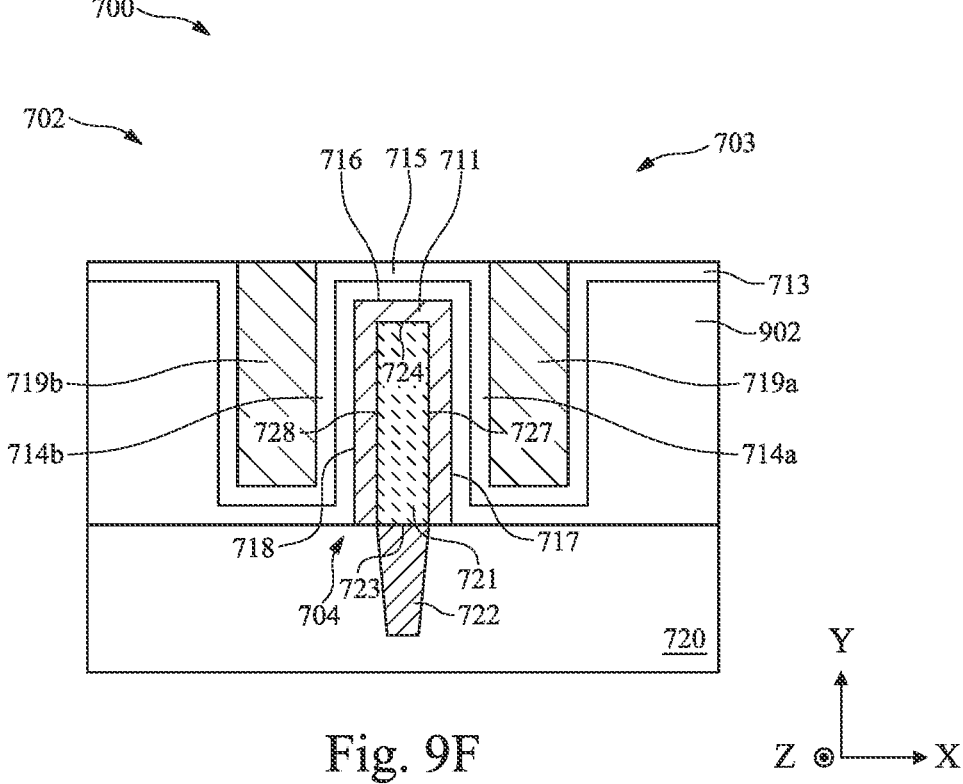

At 810, referring to FIGS. 9E-9F, two S/D electrodes 719a and 719b are formed. A metal layer 916 is deposited on the dielectric layer 902 and fills the openings 904 and 906, respectively. At 812, a CMP process is performed to remove excess metal layer 916 and form the two S/D electrodes 719a and 719b, respectively. The top surface of the channel region 715 (i.e., top surface of the semiconductor layer 713) and the top surfaces of the two S/D electrodes 719a and 719b are co-planar. The transistor 703 is thereby formed. The transistor 703 and the capacitor 704 form the 1T1C memory cell 702.

Figure 9G:
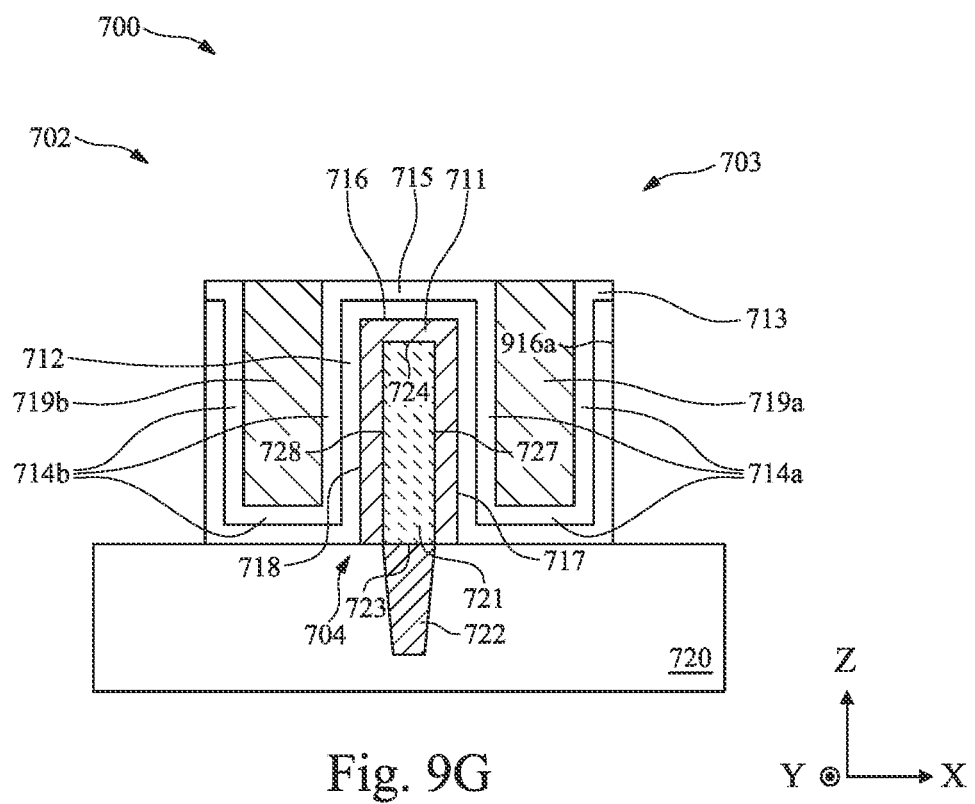

At 814, referring to FIG. 9G, a patterning and etching process is performed to remove portions of the dielectric layer 902 proximate to the two S/D electrodes 719a and 719b.

Figure 9H:
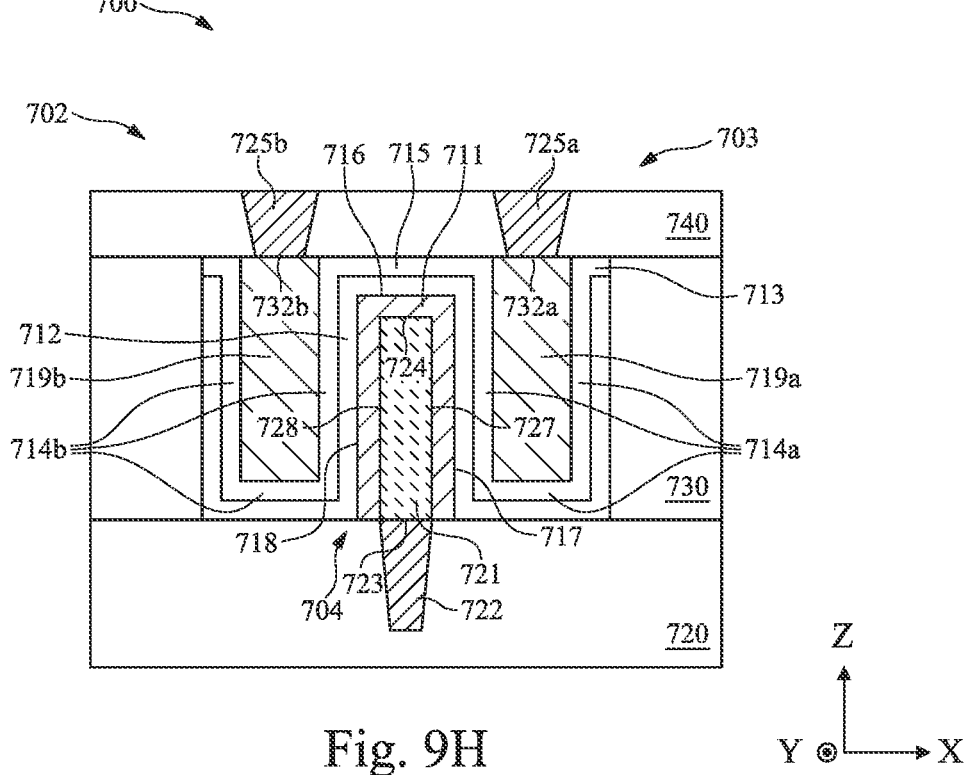

At 816, referring to FIG. 9H, two via contacts 725a and 725b are formed. In some embodiments, a second dielectric layer 730 is formed on the first dielectric layer 720 and covers the two sides of the transistor 703. A CMP process may be performed to planarize the top surface of the second dielectric layer 730. A third dielectric layer 740 may be formed over the second dielectric layer 730. The two via contacts 725a and 725b may be formed in the third dielectric layer 740 and respectively coupled to the top surfaces of the S/D electrodes 719a and 719b.

FIG. 10 is a schematic diagram illustrating a cross-sectional view of another example memory device 1000, in accordance with some embodiments. The memory device 1000 is a variation of the memory device 700 shown in FIG. 7. In the illustrated example, the memory device 1000 includes, among other components, a substrate 1001, one or more dielectric layers 1020/1030/1040, and a 1T1C memory cell 1002. The memory device 1000 may further include two via contacts 1025a and 1025b (collectively as 1025). Similar to the 1T1C memory cell 702, the 1T1C memory cell 1002 also has a stacked structure and includes a transistor 1003 and a capacitor 1004 partially enclosed in the transistor 1003, and the capacitor 1004 is disposed between the two S/D electrodes 1019a and 1019b of the transistor 1003 in the X-direction. A difference between the 1T1C memory cell 702 and the 1T1C memory cell 1002 is that the floating gate 1022 is at the top of the 1T1C memory cell 1002.

Various components of the memory device 1000, such as the substrate 1001, dielectric layers 1020/1030/1040, transistor 1003, capacitor 1004, and the via contacts 1025 are similar to the substrate 701, dielectric layers 720/730/740, transistor 703, capacitor 704, and the via contacts 725 of the memory device 700, respectively, and thus will not be repeated unless otherwise indicated.

In the illustrated example of the 1T1C memory cell 1002, the transistor 1003 includes two S/D electrodes 1019a and 1019b (collectively as 1019), a semiconductor layer 1013 disposed on the two S/D electrodes 1019, a gate dielectric layer 1012 disposed on the semiconductor layer 1013, a metal gate 1011 disposed on the gate dielectric layer 1012. The 1T1C memory cell 1002 may further include two S/D regions 1014a and 1014b (collectively as 1014) and a channel region 1015. The two S/D regions 1014 are respectively formed in two side portions and/or edge portions of the semiconductor layer 1013 proximate to the sidewalls 1017 and 1018 of the metal gate 1011, and the channel region 1015 is formed in a bottom portion of the semiconductor layer 413 proximate to the bottom surface 1016 of the metal gate 1011. The metal gate 1011 and the gate dielectric layer 1012 form the gate structure 1006. The capacitor 1004 includes the metal gate 1011, a high-k dielectric layer 1021 disposed on the metal gate 1011, and a floating gate 1022 disposed on the high-k dielectric layer 1021.

FIG. 11 is a flow diagram illustrating an example method 1100 for fabricating the memory device 1000 of FIG. 10 according to some embodiments. The method 1100 is described below in conjunction with FIGS. 12A-12H, which illustrate a portion of the memory device 1000 during the intermediate steps of the method 1100. FIGS. 12A-12H are schematic diagrams illustrating cross-sectional views of intermediate stages in the formation of the memory device 1000, in accordance with some embodiments.

Figure 12A:
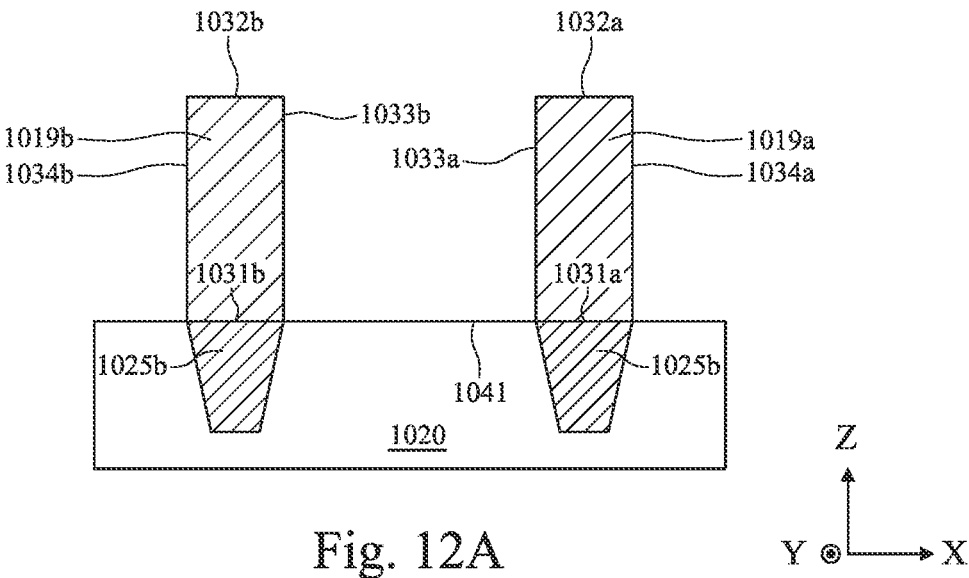

At 1102, referring to FIG. 12A, a partially formed device 1000 is provided. The partially formed device 1000 includes a first dielectric layer 1020, two via contacts 1025a and 1025b disposed in the dielectric layer 1020, and two S/D electrodes 1019a and 1019b respectively disposed on and coupled to the two via contacts 1025a and 1025b. The S/D electrode 1019a extends vertically from a bottom surface 1031a to a top surface 1032a and horizontally from a proximal sidewall 1033a to a distal sidewall 1034a. Likewise, the S/D electrode 1019b is substantially aligned with the S/D electrode 1019a in the X-direction, extends vertically from a bottom surface 1031b to a top surface 1032b and horizontally from a proximal sidewall 1033b to a distal sidewall 1034b. The two S/D electrodes 1019a and 1019b may be formed in a dielectric layer (not shown) disposed on the first dielectric layer 1020, and the portion of the dielectric layer surrounding and between the two S/D electrodes 1019a and 1019b are removed by a patterning and etching process, such that the top surfaces 1032a/1032b of the S/D electrodes 1019a/1019b, the sidewalls 1033a/1033b/1034a/1034b of the S/D electrodes 1019a/1019b, and the top surface 1041 of the first dielectric layer 1020 are exposed.

Figure 12B:
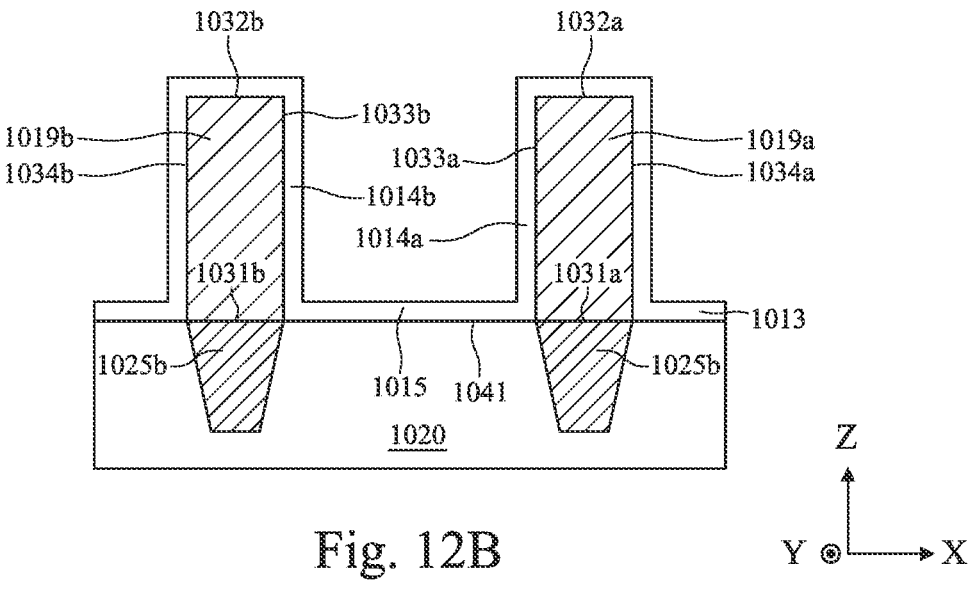

At 1104, referring to FIG. 12B, two S/D regions 1014a and 1014b as well as a channel region 1015 are formed. In some embodiments, a semiconductor layer 1013 is deposited on the S/D electrodes 1019a and 1019b and covers the top surfaces 1032a/1032b, the sidewalls 1033a/1033b/1034a/1034b, and the top surface 1041 of the first dielectric layer 1020. The S/D regions 1014a and 1014b may be formed in the semiconductor layer 1013 by treating the portions of the semiconductor layer 1013 disposed on the proximal sidewalls 1033a and 1033b, respectively. The portion of the semiconductor layer 1013 disposed on the top surface 1041 between the two S/D electrodes 1019a and 1019b may form the channel region 1015. In some embodiments, the semiconductor layer 1013 is an IGZO layer deposited using ALD.

In some embodiments, an S/D layer (not shown) is deposited on the S/D electrodes 1019a and 1019b. The S/D layer may cover the top surfaces 1032a/1032b, the sidewalls 1033a/1033b/1034a/1034b. The S/D regions 1014a and 1014b may be formed in the S/D layer by treating the portions of the S/D layer disposed on the proximal sidewalls 1033a and 1033b, respectively. Then a semiconductor layer 1013 is deposited on the S/D layer. A portion of the semiconductor layer 1013 that covers the top surface 1041 of the first dielectric layer 1020 between the two S/D electrodes 1019a and 1019b may form the channel region 1015, which is connected to the two separate S/D regions 1014a and 1014b.

At 1106, referring to FIG. 12C, a gate dielectric layer 1012 is deposited. The gate dielectric layer 1012 may include a high-k dielectric material deposited using ALD. The gate dielectric layer 1012 is deposited on the semiconductor layer 1013 and covers the S/D regions 1014a and 1014b as well as the channel region 1015.

At 1108, referring to FIG. 12D, a second dielectric layer 1030 is formed. The second dielectric layer 1030 is deposited on the gate dielectric layer 1012 and fills the space surrounding and between the two S/D electrodes 1019a and 1019b. A CMP process may be performed to planarize the top surface 1037 of the second dielectric layer 1030.

Figure 12E:
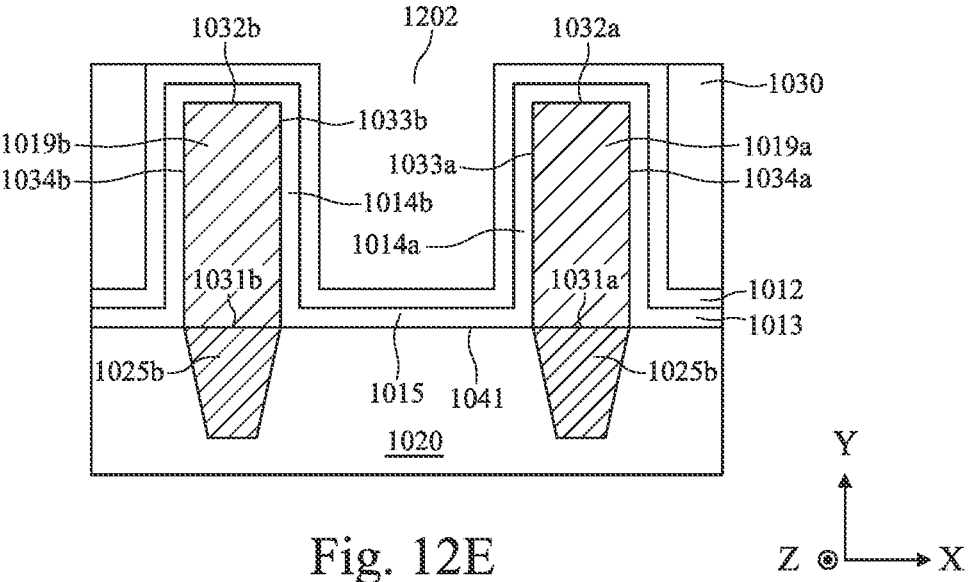

At 1110, referring to FIG. 12E, an opening 1202 is formed. The opening 1202 may be formed by performing a patterning and etching process to remove a portion of the second electric layer 1012 between the two S/D electrodes 1019a and 1019b to expose a surface of the gate dielectric layer 1012 disposed on the S/D regions 1014a and 1014b as well as the channel region 1015.

Figure 12F:
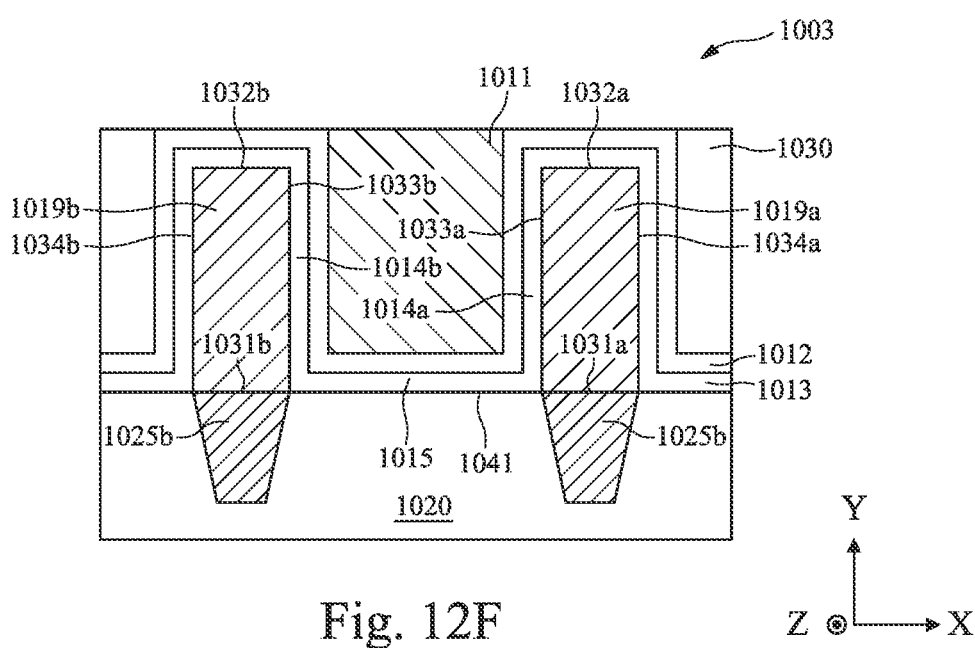

At 1112, referring to FIG. 12F, a metal gate 1011 is formed. In some embodiments, a metal layer is deposited on the second dielectric layer 1030 and fills the opening 1202, and a CMP process is performed to remove excess metal layer and form the metal gate 1011 between the two S/D electrodes 1019a and 1019b.

Figure 12G:
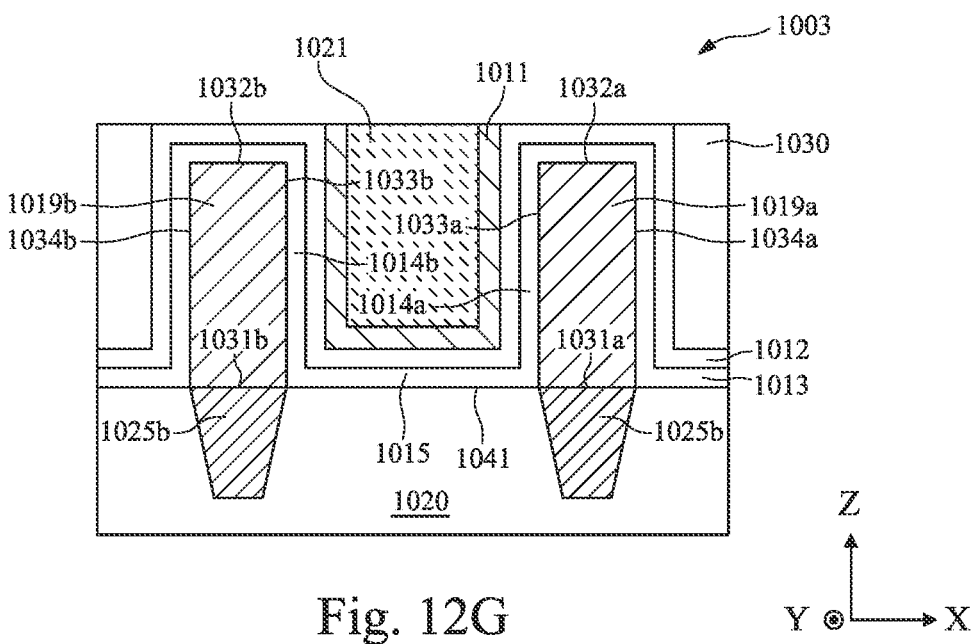

At 1114, referring to FIG. 12G, a high-k dielectric layer 1021 is formed. The high-k dielectric layer may be formed by performing a patterning and etching process to remove a portion of the metal gate 1011 between the two S/D electrodes 1019a and 1019b to form an opening, depositing a layer of high-k dielectric layer, and performing a CMP process to remove excess high-k dielectric material to form the high-k dielectric layer 1021 in the opening.

Figure 12H:
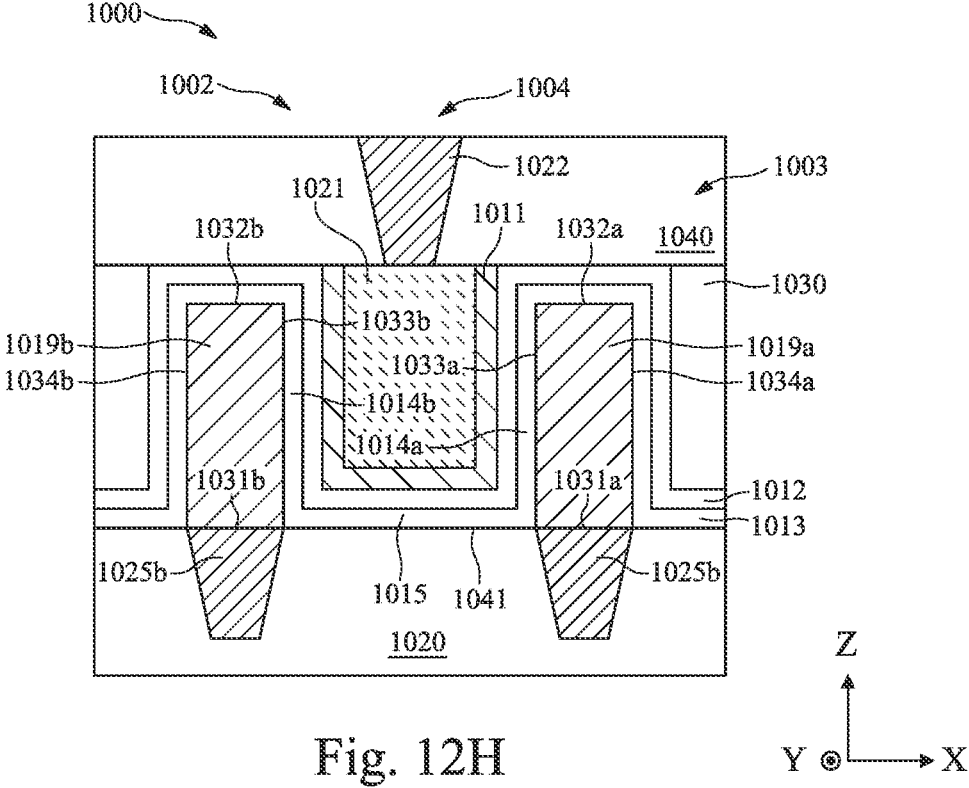

At 1116, referring to FIG. 12H, a floating gate 1022 is disposed on the high-k dielectric layer 1021. In some embodiments, a third dielectric layer 1040 is deposited on the second dielectric layer 1030, and the floating gate 1022 is formed in the third dielectric layer 1040. The metal gate 1011, high-k dielectric layer 1021, and the floating gate 1022 form the capacitor 1004. The capacitor 1004 and the transistor 1003 form the 1T1C memory cell 1002.

Example Semiconductor Stacked Structures Having Compact 1T1C Memory Cell

Figure 13:
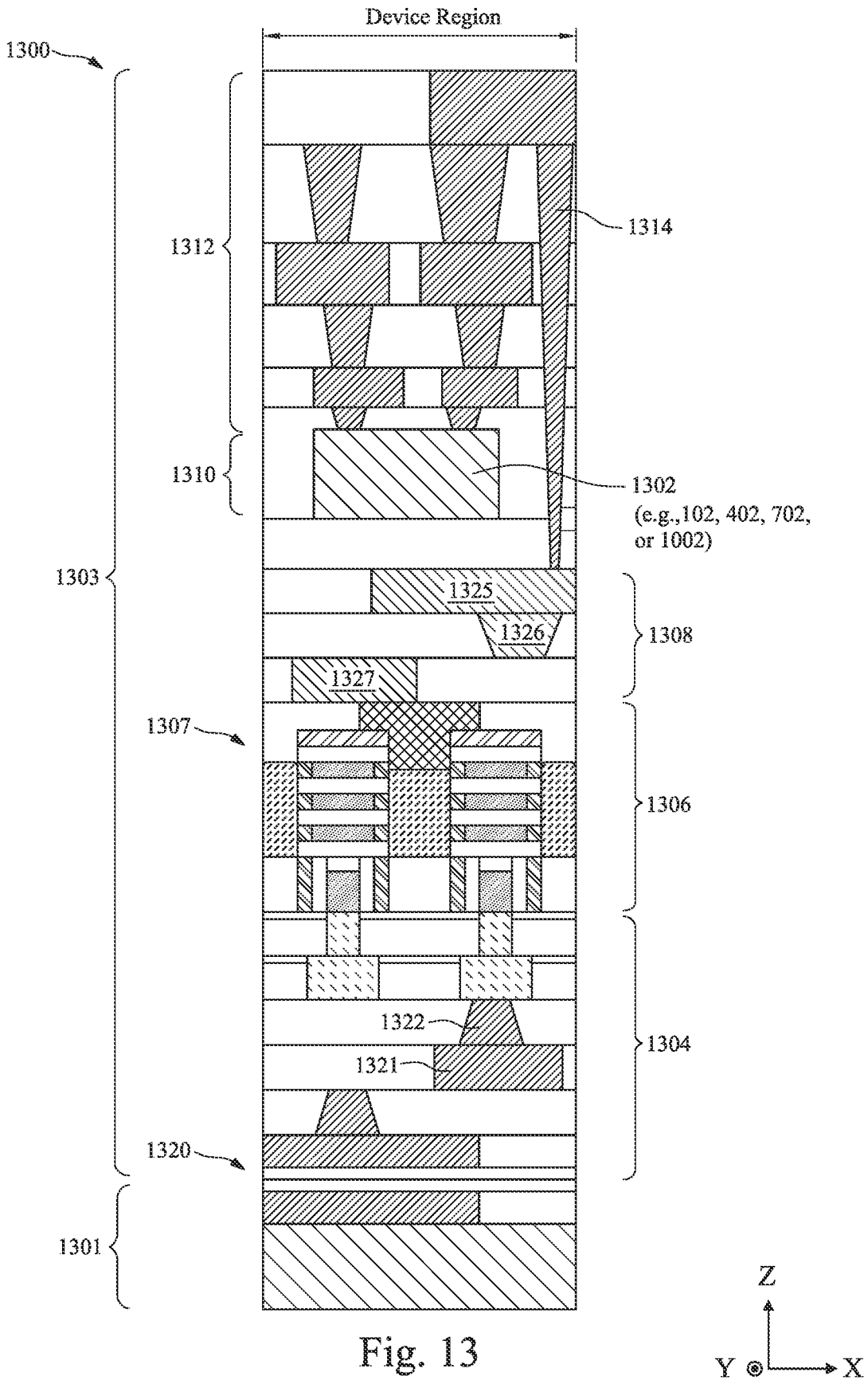
FIG. 13 is a schematic diagram illustrating cross-sectional view of an example of a stacked structure, in accordance with some embodiments.

FIG. 13 illustrates an example of a semiconductor stacked structure 1300 (sometimes also referred to as a "stacked structure" 1300) according to some embodiments of the present disclosure. The semiconductor stacked structure 1300 includes one or more of: the memory device 100 or the memory cell 102 thereof, the memory device 400 or the memory cell 402 thereof, the memory device 700 or the memory cell 702 thereof, and/or the memory device 1000 or the memory cell 1002 thereof, which are describe above with references to FIGS. 1A, 4, 7, and 10, respectively.

In the illustrated example of FIG. 13, the semiconductor stacked structure 1300 includes, among other components, a carrier substrate 1301 and a semiconductor device 1303. The semiconductor device 1303 is stacked over and bonded to the carrier substrate 1301 via a bonding structure 1320. The semiconductor device 1303 includes an interconnect structure 1304, a transistor portion 1306, a power rail portion 1308, a memory cell portion 1310, a contact plug portion 1312, and one or more through oxide via (TOV) 1314, sequentially stacked in the vertical direction. The stacked structure 1300 has a device region. The transistor portion 1306 may include one or more transistors 1307 in the device region. The memory cell portion 1310 includes one or more memory cells 1302 in the device region. Accordingly, the memory cell 1302 overlies the transistor 1307 in the device region.

The memory cell 1302 may be a 1T1C memory cell, for example, the 1T1C memory cell 102, 402, 702, or 1002 described above. The transistor 1307 may be a field-effect transistor (FET) or device, such as a planar FET, a three-dimensional FET, a fin-line FET (FinFET), a nanosheet FET (NSFET), a nanowire FET (NWFET), or a gate-all-around FET (GAAFET).

The power rail portion 1308 includes at least one power rail. The power rail may include one or more metal lines and metal vias coupled to a reference voltage, positive supply voltage, or the like. In the illustrated example, a first power rail 1325 and a metal via 1326 are electrically connected to the memory cell 1302 via the TOV 1314, and a second power rail 1327 is electrically connected to the transistor 1307.

The interconnect structure 1304 and the contact plug portion 1312 are sometimes also referred to as electrical routing and may each include multiple metal lines 1321 and metal via contacts 1322. The interconnect structure 1304 is configured to electrically connect the transistor 1307 to another feature or component in the carrier substrate 1301. The contact plug portion 1312 can also be regarded as an interconnect structure or an electrical routing structure. Similar to the interconnect structure 1304, the contact plug portion is configured to electrically connect the memory cell 1302 to the TOV 1314 or another feature or component in a layer above or below the memory cell portion 1310.

Figure 14:
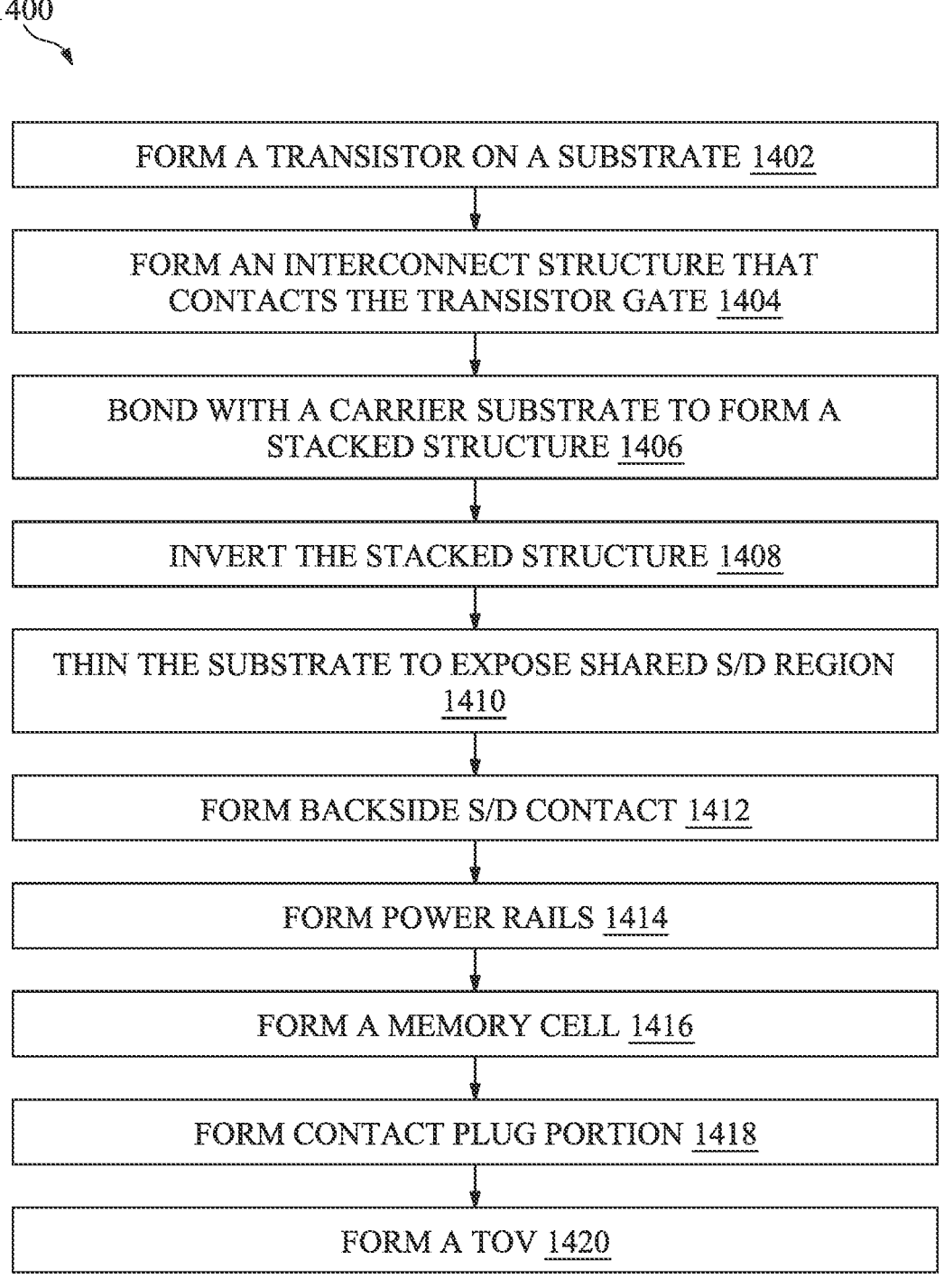
FIG. 14 is a flow diagram illustrating an example method for fabricating the stacked structure shown in FIG. 13, in accordance with some embodiments.
Figure 15A:
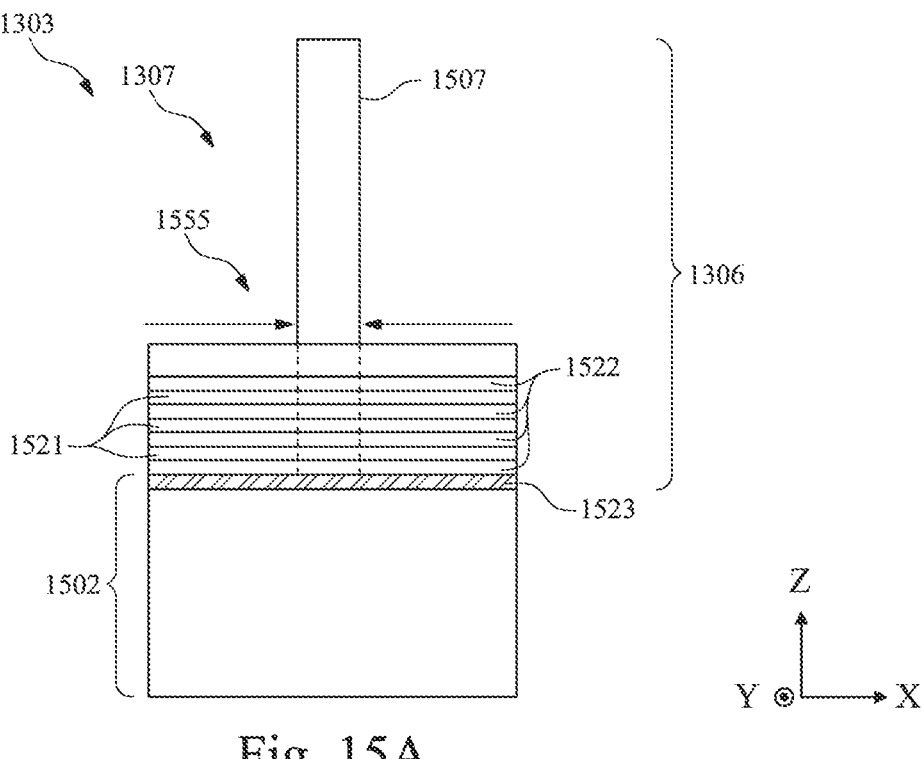
FIGS. 15A-15Q are schematic diagrams illustrating cross-sectional views of a stacked structure at various stages of its fabrication, in accordance with some embodiments.

FIG. 14 is a flow diagram illustrating an example method 1400 for fabricating the stacked structure 1300 shown in FIG. 13, according to some embodiments. For illustrative purposes, operations illustrated in FIG. 14 will be described with reference to the exemplary process for fabricating the stacked structure 1300, as illustrated in FIGS. 15A-15Q, which are cross-sectional views of the stacked structure 1300 at various stages of its fabrication, according to some embodiments. Operations can be performed in a different order, or not performed, depending on specific applications. It is noted that method 1400 may not produce a complete semiconductor device. Accordingly, it is understood that additional processes can be provided before, during, or after method 1400, and that some of these additional processes may only be briefly described herein.

Referring to FIG. 14, at 1402, a partially formed semiconductor device 1303 is provided. In some embodiments, a transistor portion 1306 including one or more transistors 1307 are formed on a substrate 1502. As shown in FIGS. 15A-15H, according to some embodiments, the transistor portion 1306 is formed on the substrate 1502. The transistor portion 1306 includes the transistor 1307, which may further include two transistors adjacent to one another. Although the transistor 1307 is described herein with respect to a nano-sheet GAAFET implementation, the transistor 1307 can be implemented as another type of transistor, such as a FinFET, a nanowire FET, and a planar FET.

The transistor 1307 can be formed on a substrate 1502, as shown in FIG. 15A. The substrate 1502 is similar to the substrate 101 of FIG. 1A. In some embodiments, the substrate 1502, can be a silicon-on-insulator (SOI) substrate that may include a buried layer (not shown). Substrate 1502 can be formed by growing or depositing buried layer on a semiconductor wafer (e.g., a silicon wafer), followed by growing or depositing a top silicon layer on buried layer. One or more of buried layer and the top silicon layer can be formed epitaxially.

Referring to FIG. 15A, a SiN layer 1523 is formed on the substrate 1502. A superlattice 1555 can be formed on the SiN layer 1523. Superlattice 1555 may include a stack of nanostructured layers 1521 and 1522 arranged in an alternating configuration. In some embodiments, nanostructured layers 1521 include materials similar to one another (e.g., epitaxial Si) and nanostructured layers 1522 include materials similar to one another (e.g., epitaxial SiGe). In some embodiments, superlattice 1555 is formed by etching a stack of two different semiconductor layers arranged in the alternating configuration. Nanostructured layers 1522 will be replaced in subsequent processing, while nanostructured layers 1521 will remain as part of transistor 1307. Although FIG. 15A shows three nanostructured layers 1521 and four nanostructured layers 1522, any number of nanostructured layers can be included in superlattice 355. The alternating configuration of superlattice 355 can be achieved by alternating deposition, or epitaxial growth, of SiGe and Si layers, following deposition of the first SiGe or Si layer on SiN layer 1523. Etching the Si layers can form nanostructured layers 1521, which are interleaved with SiGe nanostructured layers 1522. Each of nanostructured layers 1521-1522 can have thicknesses between about 1 nm and about 10 nm. In some embodiments, the topmost nanostructured layers (e.g., Si layers) of superlattice 1555 can be thicker than the underlying nanostructured layers.

Superlattice 1555, as a multi-layer stack of two different semiconductor materials, can be formed via an epitaxial growth process. The epitaxial growth process can employ (i) CVD, such as low pressure CVD (LPCVD), rapid thermal chemical vapor deposition (RTCVD), metal-organic chemical vapor deposition (MOCVD), atomic layer CVD (AL-CVD), ultrahigh vacuum CVD (UHVCVD), reduced pressure CVD (RPCVD), or another suitable CVD process, (ii) molecular beam epitaxy (MBE) processes, (iii) another suitable epitaxial process; or (iv) a combination thereof. In some embodiments, S/D regions can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions can be grown by selective epitaxial growth (SEG), where an etching gas can be added to promote selective growth on exposed semiconductor surfaces of substrate 1502 or the fin, but not on insulating material.

Within superlattice 1555, a doping type of the two different semiconductor layers can be determined by introducing one or more precursors during the epitaxial growth process. For example, the stacked semiconductor layers can be in-situ p-type doped during the epitaxial growth process using p-type doping precursors, such as diborane ($B_2H_6$) and boron trifluoride ($BF_3$). In some embodiments, the stack of two different semiconductor layers can be in-situ n-type doped during an epitaxial growth process using n-type doping precursors, such as phosphine ($PH_3$) and arsine ($AsH_3$).

Following the formation of superlattice 1555, the substrate 1502 can be etched to form a fin that provides structural support for superlattice 1555, while allowing a formation of shallow trench isolation (STI) regions in substrate 1502, between neighboring transistors.

Referring to FIG. 15A, a sacrificial structure 1507 is formed around superlattice 1555. Sacrificial structure 1507 can be made of polysilicon and can include one or more sacrificial hard mask layers and a sidewall spacer 1528 (omitted in the figure for simplicity). Sacrificial structure 1507 can be deposited and patterned using the hard mask layer(s), which can be retained during additional processing or removed. Hard mask layers can be made of, for example, an oxide material or a silicon nitride (SiN) material that can be grown and/or deposited using an ALD process. Alternatively, the hard mask used to pattern polysilicon layer can be deposited by any suitable method and can be patterned using a photoresist mask. Sidewall spacer 1528 can be made of, for example, a SiN material that can be grown and/or deposited using an ALD process. Sacrificial structure 1507 is replaced later in the fabrication process.

Next, superlattice 1555 is removed in the S/D regions, indicated by opposing arrows in FIG. 15A. Following the S/D recess, nanostructured layers 1521 and 1522 remain under sacrificial structure 1507 as indicated by dotted lines in FIG. 15A. Removal of superlattice 1555 in the S/D regions can be accomplished using, for example, a wet etch process that employs dilute hydrofluoric acid (DHF) and ammonium hydroxide-peroxide water mixture (APM). DHF can remove both silicon and SiGe nanostructured layers 1521 and 1522 outside the channel region, while the channel region is protected by hard mask and/or spacer layers of sacrificial structure 1507. Such layers, if made of SiN, will not be substantially etched by DHF. Alternatively, a dry etch process can be used to remove superlattice 1555 in the S/D regions.

Figure 15B:
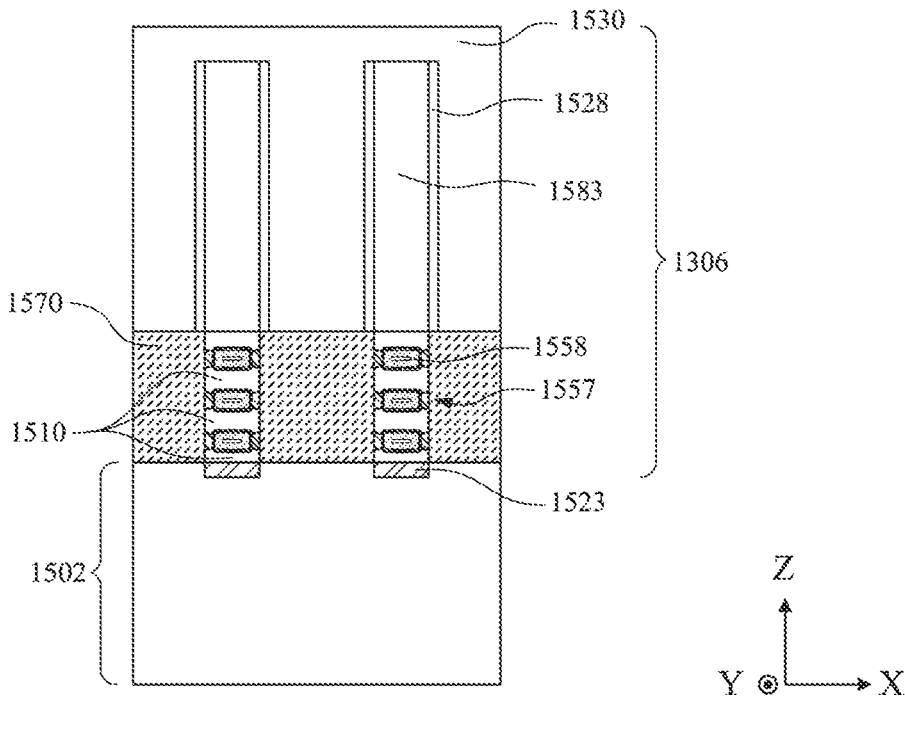

Referring to FIG. 15B, epitaxial S/D regions are formed on either side of sacrificial structure 1507. For example, S/D regions 1570 can be grown epitaxially from nanostructured layers 1521 and/or 1522 of superlattice 1555 under sacrificial structure 1507. S/D regions 1570 can be made of SiGe, for example, having a germanium concentration profile that varies along the height of S/D regions 1570 from about 35% germanium at the top and bottom of S/D regions 1570 to about 50% to 65% germanium in the middle of S/D regions 1570. In contrast, germanium concentrations near the bottom of S/D regions in some existing GAAFETs can be lower, e.g., about 25% germanium. Germanium concentration may affect doping profiles and consequently, electric potential in the S/D region that can influence channel current. When the germanium concentration profile of S/D regions 1570 is outside the range of about 35%-65%, channel current can be outside a desired range for operation of transistor 1307, when implemented as a GAAFET. S/D regions 1570 can be independently formed by metalorganic CVD (MOCVD), molecular beam epitaxy (MBE), liquid phase epitaxy (LYE), vapor phase epitaxy (VPE), SEG, or a combination thereof. In addition, S/D regions 1570 can be independently doped by in-situ doping during epitaxial growth and/or by implantation after epitaxial growth.

Referring to FIG. 15B, a dielectric layer 1530 (e.g., an ILD layer) is deposited. Sacrificial structure 1507 is removed and replaced with a metal gate structure that forms gate terminal 1583 (or gate structure 1583) as described with respect to FIGS. 15C-15G, resulting in the transistor 1307. During the replacement metal gate process, nanostructured layers 1522 are also selectively removed to form gate openings in the channel region. The gate openings are filled with metal by depositing gate structure 1583, to form GAA channel region 1557, as shown in FIG. 15B. The remaining nanostructured layers 1521 of superlattice 1555 form nanostructured channels 1510 of two adjacent transistors 1307 that share the S/D region 1570. Each of GAA channel regions 1557 can include GAA structures 1558 (three shown in FIG. 15B).

FIGS. 15C-15G are magnified cross-sectional views showing operations for forming gate structure 1583 and GAA channel region 1557 shown in FIG. 15B, according to some embodiments. GAA channel region 1557 includes multiple GAA structures 1558, which surround channels 1510 to control current flow therein.

FIG. 15C is a magnified cross-sectional view of superlattice 1555 and sacrificial structure 1507 shown in FIG. 15A. Superlattice 1555 is etched back as described above, so that the remaining portion of superlattice 1555 is in a GAA channel region 1557, under sacrificial structure 1507. FIG. 15D is a magnified cross-sectional view illustrating GAA channel region 1557 following formation of inner spacers 1564 and epitaxial S/D regions 1570. FIG. 15D shows that inner spacers 1564 are formed adjacent to nanostructured layers 1522 in GAA channel region 1557, before epitaxial S/D regions 1570 are grown laterally outward, in the X-direction, from nanostructured layers 1521. FIG. 15E is a magnified cross-sectional view illustrating GAA channel region 1557, following extraction of nanostructured layers 1522 and thus forming voids 1509. FIG. 15F is a magnified cross-sectional view illustrating GAA channel region 1557, following replacement of sacrificial structure 1507 with metal gate structure 1583. Sacrificial structure 1507 is removed, leaving sidewall spacers 1528 in place. Metal gate structure 1583 is formed in a multi-step process to replace sacrificial structure 1507.

Referring to FIG. 15G, each GAA structure 1558 can be viewed as a radial gate stack that includes, from the outermost layer to the innermost layer, an interfacial layer 1560, a gate dielectric layer 1561, a work function metal layer 1562, and a gate electrode 1563. Gate electrode 1563 is operable to maintain a capacitive applied voltage across nanostructured channels 1510. Gate dielectric layer 1561 separates the metallic layers of GAA structure 1558 from nanostructured channels 1510. Inner spacers 1564 electrically isolate GAA structure 1558 from epitaxial S/D region 1570 and prevent current from leaking out of nanostructured channels 1510. In some embodiments, inner spacers 1564 can be made of silicon carbide nitride (SiCN). As gate structure 1583 is formed, the radial gate stack is also formed to fill voids 1509 from the outside in, starting with interfacial layer 1560, and ending with gate electrode 1563.

Interfacial layer 1560 can be made of a silicon oxide and can be formed by deposition, chemical oxidation, or a thermal oxidation process. In some embodiments, interfacial layer 1560 is a silicon oxide formed using ozone (O3) with standard clean 1 (SC1) and standard clean 2 (SC2) wet clean processes. A thickness of interfacial layer 1560 can be between about 5 Å to about 15 Å. Gate dielectric layer 1561 can have a thickness between about 1 nm and about 5 nm. The gate work function metal layer 1562 can have a thickness between about 2 nm and about 15 nm. Any suitable materials, dimensions, and formation methods for gate dielectric layer 1561, gate work function metal layer 1562, and gate electrode 1563 are within the scope and spirit of the present disclosure.

Figure 15H:
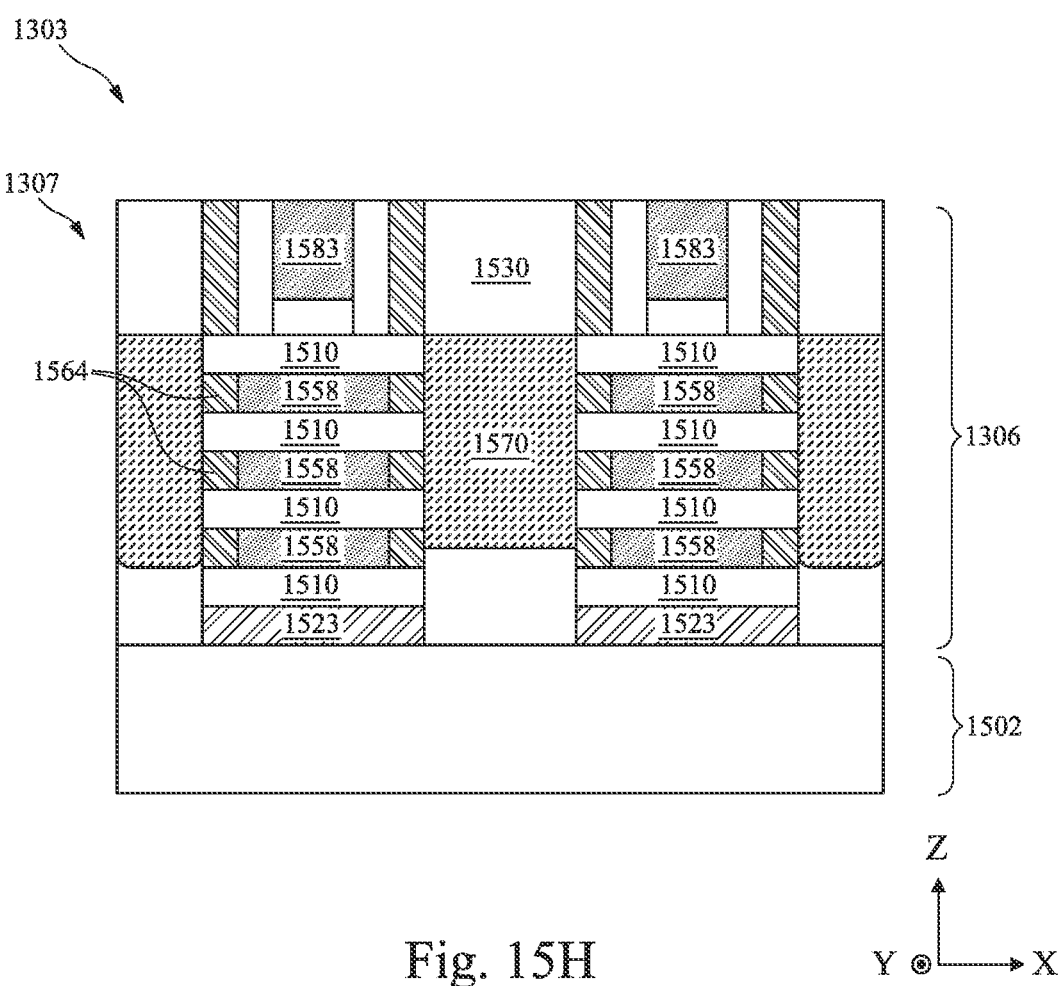
Figure 15I:
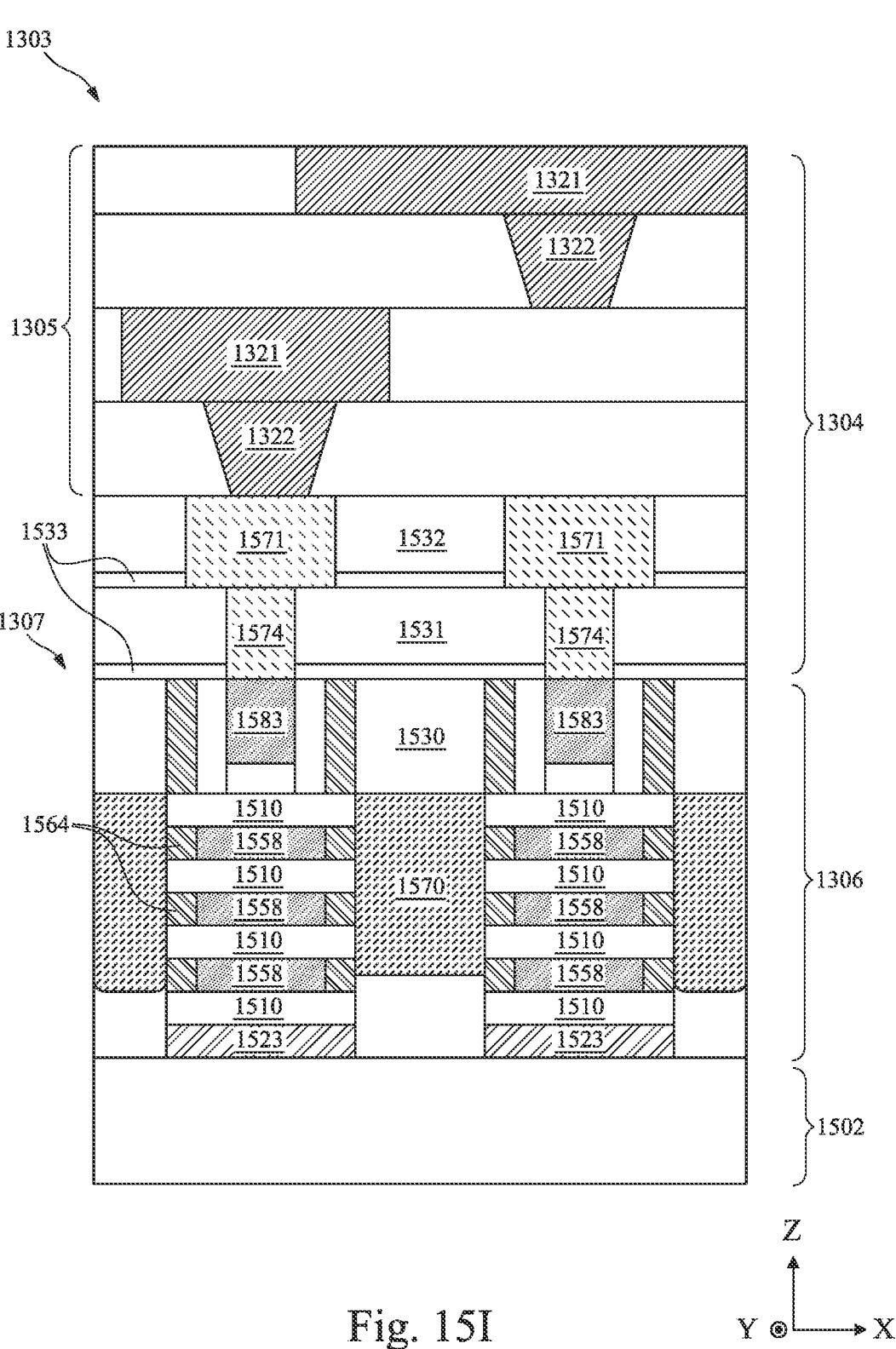

Referring to FIG. 14, at 1404, an interconnect structure 1304 is formed above transistor 1307, as shown in FIGS. 15H-15I, according to some embodiments. Interconnect structure 1304 provides electrical connections to respective gate terminals 1583 of GAAFETs of the transistor 1307. Interconnect structure 1304 includes at least a first metallization layer, for example, metal lines 1571 coupled to gate structures 1583 by gate contacts 1574, as shown in FIG. 15I. Metal lines 1571 can be in the form of copper wiring insulated by ILD layers 1530, 1531, and 1532. ILD layers 1230, 1531, and 1532 can be made of oxide (e.g., $SiO_2$) and can be formed on a base layer 1533, made of silicon nitride (SiN). Spacers separating ILD 1530 from gate terminals 1583 can be made of silicon carbide nitride (SiCN). Interconnect structure 1304 can be formed as a damascene structure in which the ILD is deposited, trenches are formed in the ILD by a plasma etching process, and the trenches are filled with copper using, for example, an electroplating process. Interconnect structure 1304 can further include one or more additional metallization layers 1305 formed in similar fashion as metal lines 1321 and via contacts 1322 disposed in multiple ILD layers. The additional metallization layers 1305 are sometimes also regarded as redistribution layers (RDLs) or RDL structures.

Figure 15J:
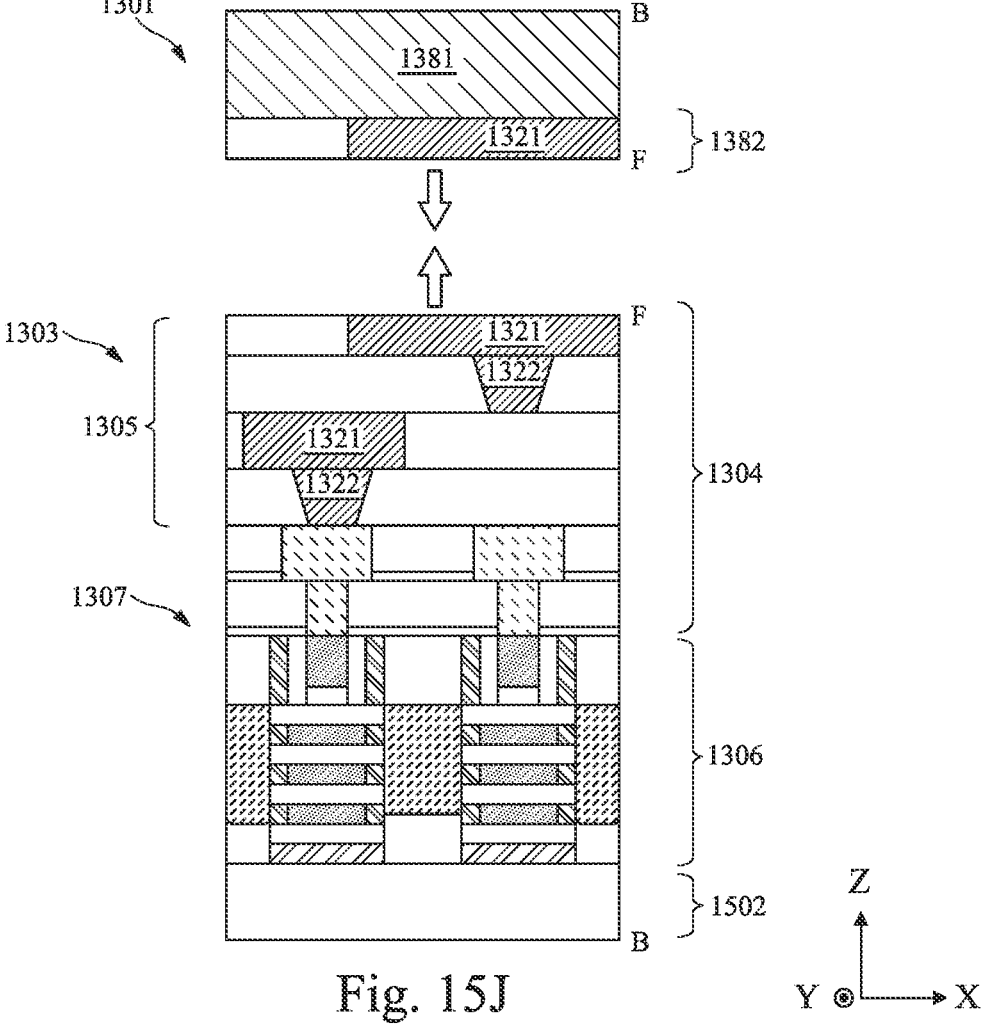
Figure 15K:
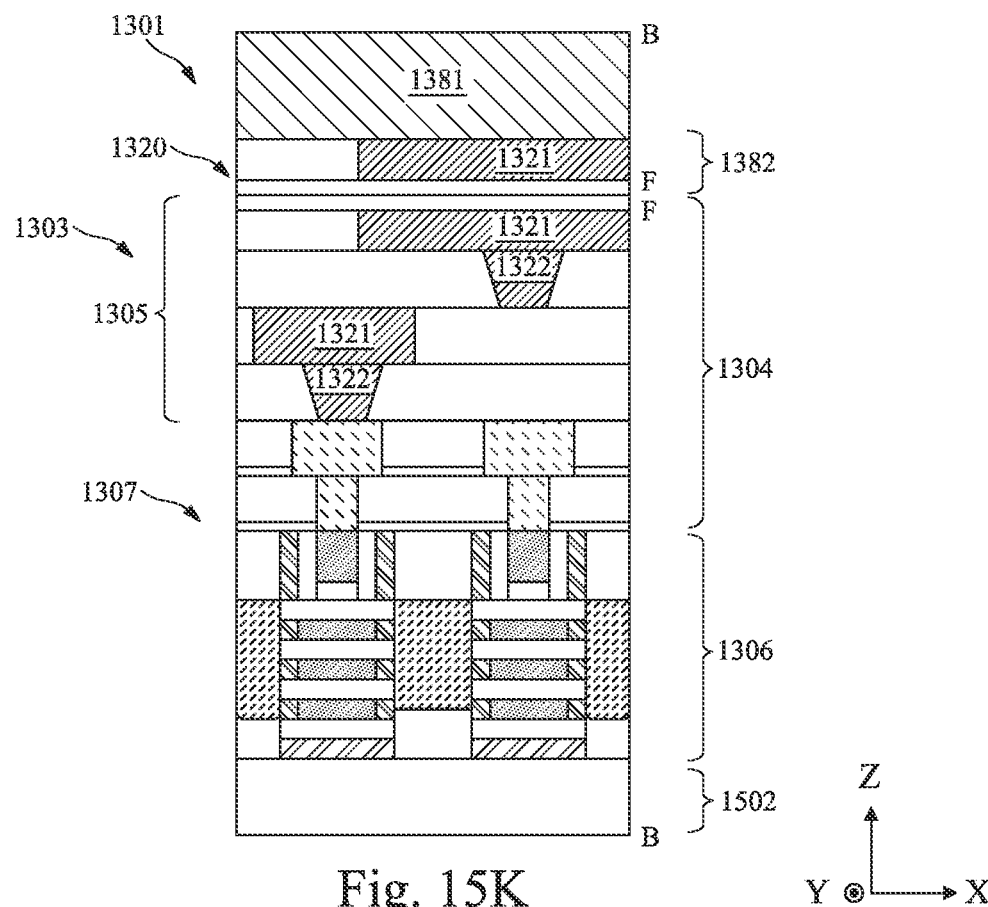

Referring to FIG. 14, at 1406, the partially formed semiconductor device 1303 formed in FIG. 15I is bonded to a carrier substrate 1301, resulting in a partially formed stacked structure 1300. As shown in FIGS. 15J-15K, the carrier substrate 1301 is provided. The carrier substrate 1301 may include a substrate 1381 and one or more metallization layers (or an RDL structure or the like) disposed on the substrate 1381. The carrier substrate 1301 has a frontside (F) and a backside (B), and the substrate 1381 is at the backside (B) while the topmost metallization layer (i.e., the metallization layer 1382) is at the frontside (F). Similarly, the semiconductor device 1303 has a front side (F) and a backside (B). The carrier substrate 1301 is aligned with and stacked over the semiconductor device 1303, and the frontside (F) of the carrier substrate 1301 and the partially formed semiconductor device 1303 are bonded in a face-to-face manner to form a bonding structure 1320 (shown in FIG. 15K). The bonding structure is sometimes also referred to as a bonding interface. The bonding structure 1320 interconnects the topmost metallization layer of the semiconductor device 1303 and the topmost metallization layer of the carrier substrate 1301.

In some embodiments, the carrier substrate 1301 and the semiconductor device 1303 are bonded using hybrid bonding techniques, and thus the bonding structure 1320 is a hybrid bonding structure. For example, the hybrid bonding may be performed by bonding the conductive element (e.g., the metal line 1321 of the metallization layer 1382) in the carrier substrate 1301 directly to the corresponding conductive element (e.g., the metal line 1321 of the metallization layer 1305 aligned with the metal line 1321 of the metallization layer 1382) in the partially formed semiconductor device 1303 through a metal-to-metal bonding, and a topmost dielectric layer (or ILD layer) in the carrier substrate 1301 directly to a corresponding topmost dielectric layer (or an ILD layer) in the semiconductor device 1303 through a non-metal covalent bonding (e.g., siloxane bonding or Si—O—Si bonding).

Hybrid bonding can provide a number of benefits over the traditional bonding. For example, hybrid bonding creates a strong bond strength between the two wafers, resulting in a bond that is much stronger than other bonding techniques such as adhesive bonding or thermo-compression bonding. The hybrid bonding process can be performed with high precision and accuracy, resulting in a higher alignment accuracy, which facilitates the creation of complex and multi-layer structures with very small feature sizes. Hybrid bonding can be performed at relatively low temperatures (e.g., less than 400° C.), which minimizes the risk of thermal damage to the wafers or the devices on them. Unlike other bonding techniques, hybrid bonding does not require the use of additional materials such as adhesives or solders, which can introduce contamination or reliability issues.

Alternatively, a bonding process using a bonding/adhesive layer may be employed to bond the carrier substrate 1301 and the semiconductor device 1303. In some embodiments, an oxide layer (not shown) is deposited onto interconnect structure 1304 as a bond interface layer. The bond interface layer can be an oxide deposited using a high-density plasma (HDP) process, at a temperature between about 350° C. and about 450° C. The deposition process can use reaction gases including, for example, $SiH_4$, $N_2O$, and $O_2$, at a pressure between about 5 mTorr and about 20 mTorr, and a plasma power between about 4000 W and about 60,000 W. To improve its bond strength, bond interface layer can be polished using a CMP process so that a smooth surface is formed, having a surface roughness of less than about 300 Å.

The semiconductor device 1303 is bonded to the carrier substrate 1301 to form the stacked structure 1300 using the bond interface layer (i.e., the bonding structure 1320). The bonding process can include a pre-treatment of either the semiconductor device 1303 or the carrier substrate 1301, or both. The pre-treatment can include, for example, a wet-clean in water to ensure OH radicals are present on one or both of the surfaces being bonded. Following the pre-treatment, the frontside (F) of the carrier substrate 1301 is bonded to the frontside (F) of the semiconductor device 1303, at the bond interface layer. Bonding tools for wafer on wafer (WOW) bonding can generally be used to perform the bonding process. The bonding process can be followed by an anneal operation to ensure the bonding strength is high.

Figure 15L:
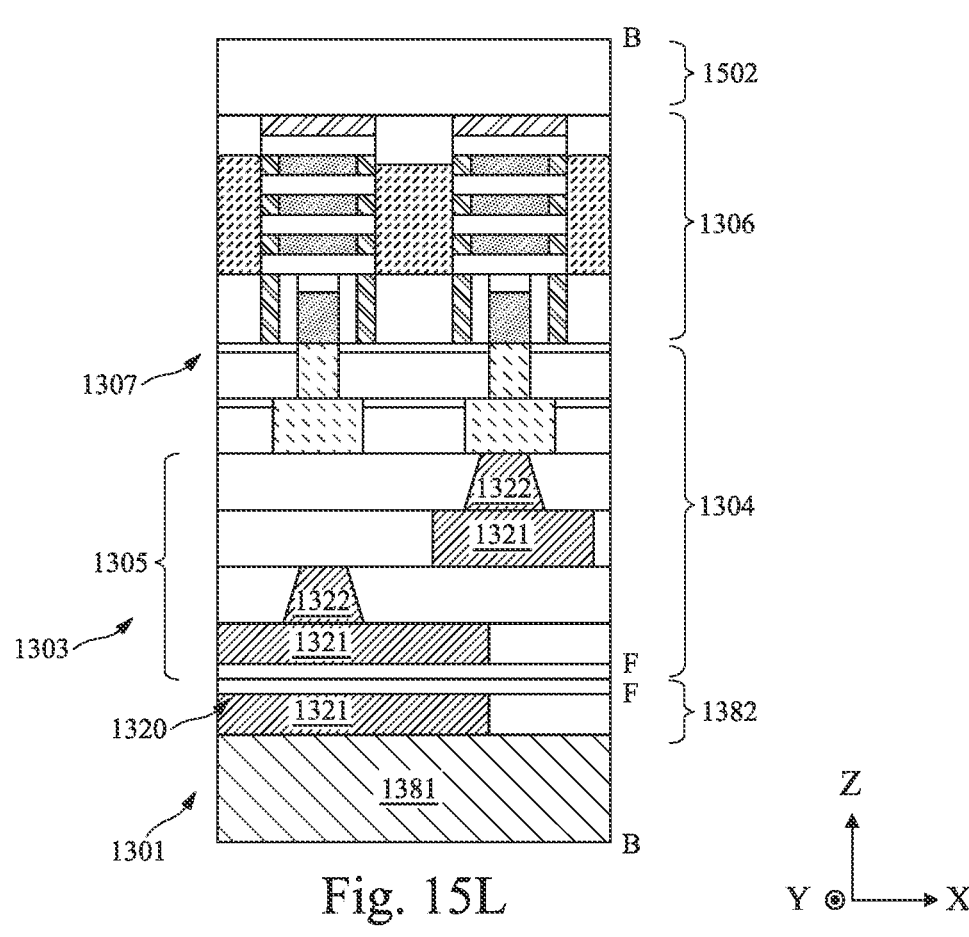

Referring to FIG. 14, at 1408, the stacked structure formed in FIG. 15K is flipped over so that the backside (B) of the semiconductor device 1303 is facing up, as shown in FIG. 15L. The remainder of the processing operations of FIG. 14, including fabricating the memory cell portion 1310, the contact plug portion 1312, and the TOV 1314 occur on the backside (B) of the substrate 1502 on which the transistor portion 1306 was constructed.

Figure 15M:
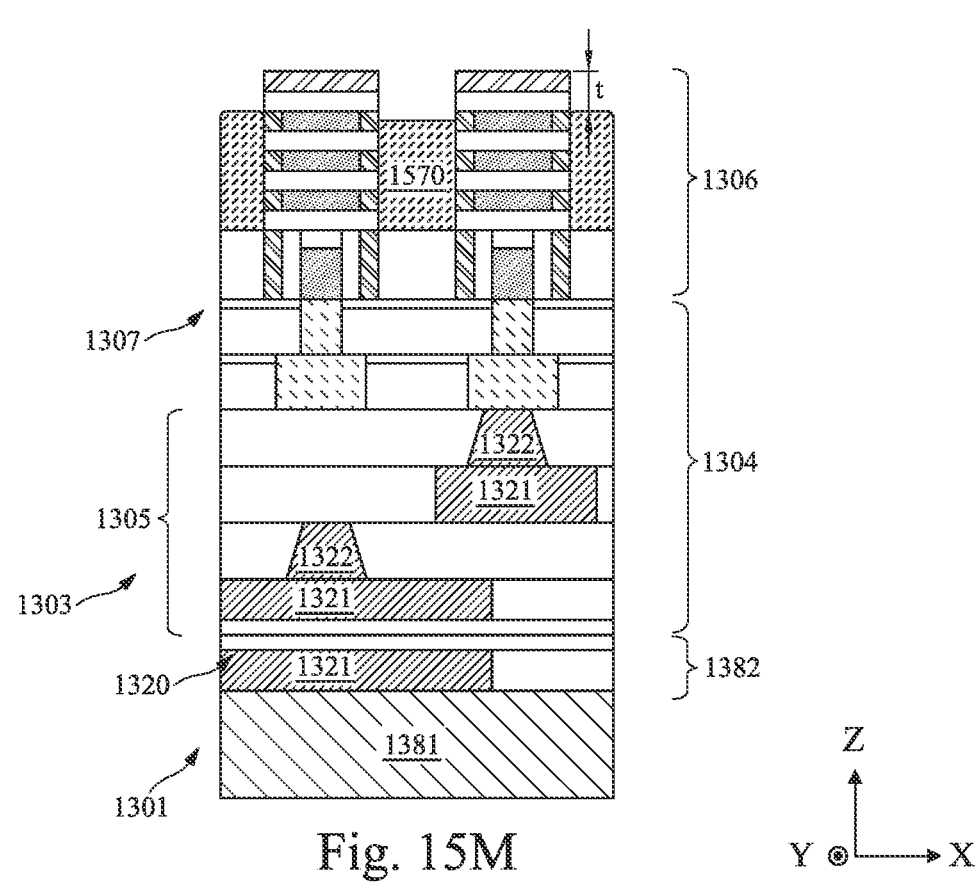

Referring to FIG. 14, at 1410, the substrate 1502 is thinned to expose transistor S/D regions 1570, as shown in FIG. 15L, according to some embodiments. The substrate 1502 is subjected to a grinding operation that reduces its thickness from about 100 μm to a thickness between about 5 μm to about 6 μm. The remaining silicon can be further reduced to a thickness of about 100 Å. Thus, almost all of the original substrate 1502 is removed. Thus, the fully formed memory cell 1302 can be considered to be formed on the carrier substrate 1301. Referring to FIG. 15M, the S/D region 1570 may be recessed by a recess distance (t), while SiN layer 1523 serves as a hard mask protecting the gate region of transistor 1307. Recess distance (t) can be between about 20 nm and about 50 nm. The S/D recess operation can be accomplished by a timed plasma etch-back operation using an anisotropic etch chemistry. Alternatively, the S/D recess can be accomplished using a wet etch chemistry, such as DHF and APM.

Figure 15N:
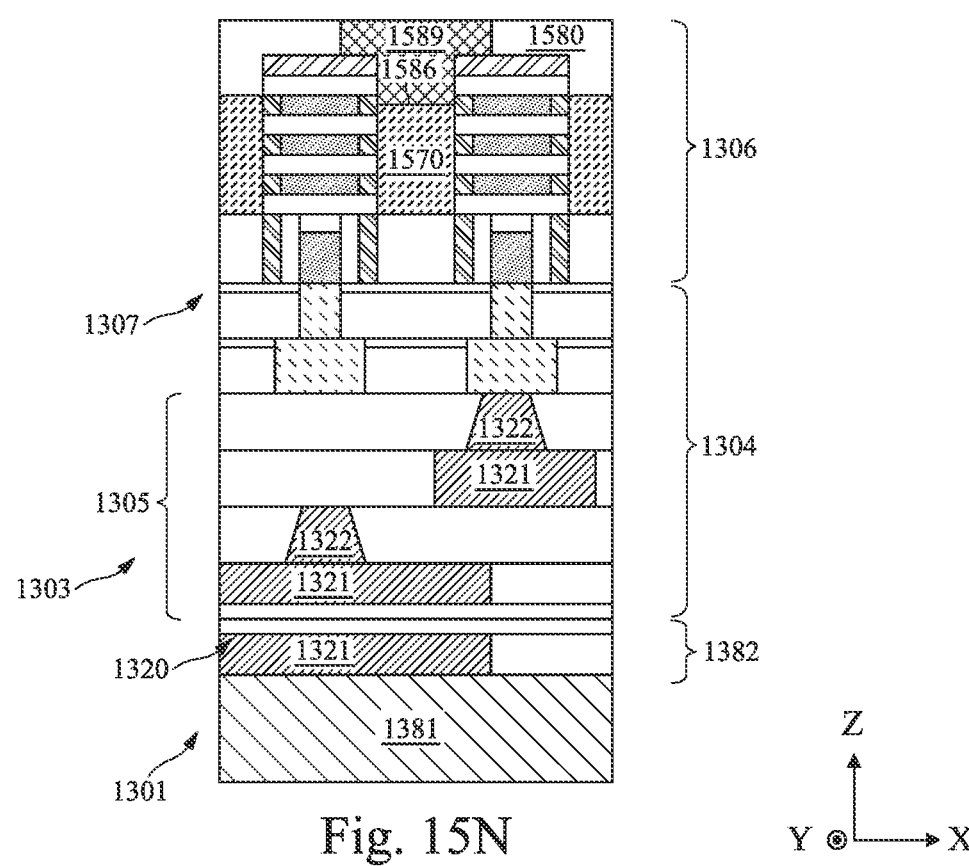

Referring to FIG. 14, at 1412, backside S/D contact 1589 can be formed as shown in FIG. 15N, according to some embodiments. An insulating layer 1500 can be deposited over the recessed S/D regions 1570 and SiN layer 1523. Insulating layer 1500 can be a low-k silicon oxide that can include carbon. Insulating layer 1500 can be patterned using a hard mask (not shown) that is in turn patterned with a photoresist mask. A T-shaped via (not shown) can be etched into insulating layer 1580 using a via etch chemistry (e.g., a fluorine-based anisotropic plasma etch that removes oxide) selective to SiN and silicon.

Following formation of the T-shaped via, the hard mask is removed, and T-shaped via is filled with metal to form backside S/D contact 1589 having a T-shape, as shown in FIG. 15N. The T-shaped backside S/D contact 1589 can have a bottom width between about 20 nm and about 40 nm. The backside S/D contact 1589 couples to shared S/D region 1570 at an interface 1586, which can include a contact silicide (e.g., titanium silicide (TiSi), nickel silicide (NiSi), and cobalt silicide (CoSi)). Backside S/D contact 1589 can undergo a CMP process to be made co-planar with insulating layer 1580.

Figure 15O:
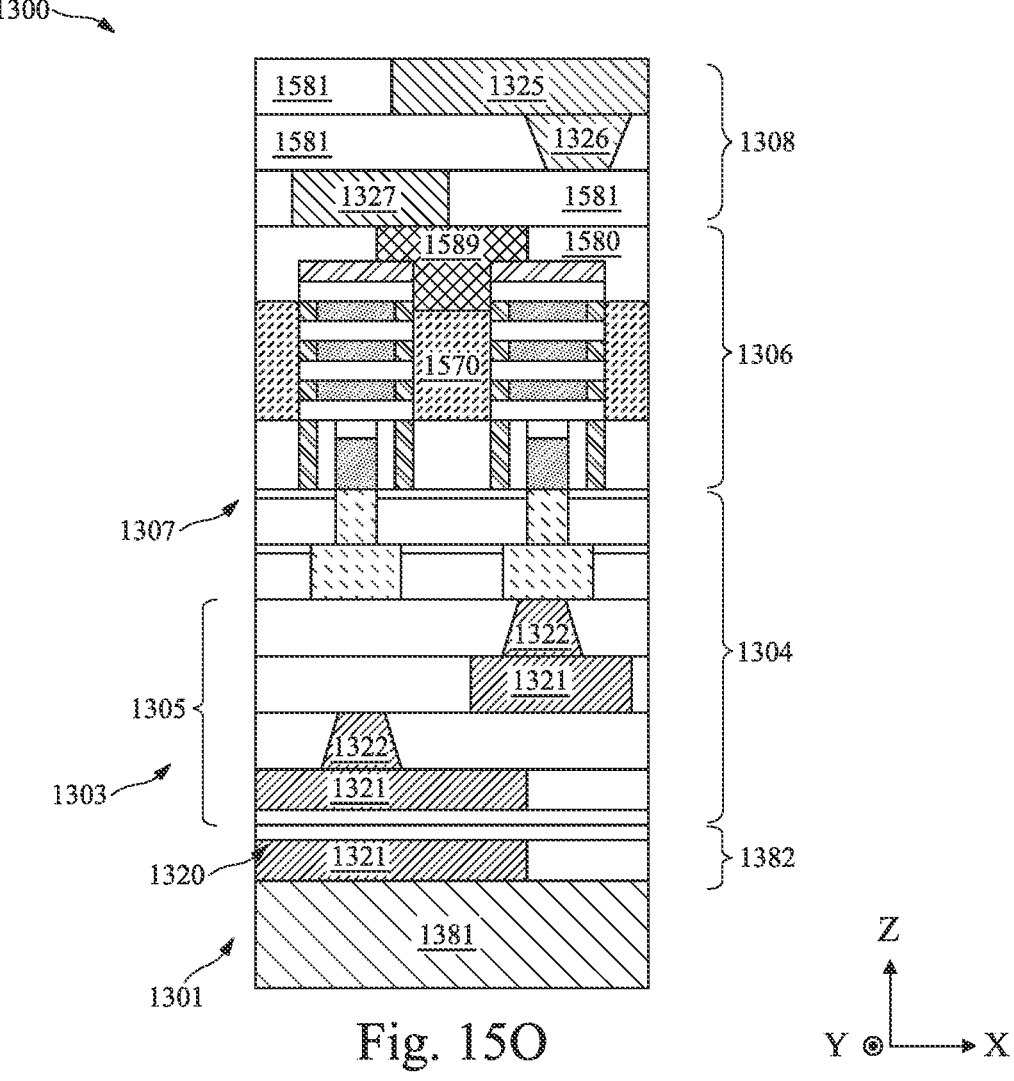

Referring to FIG. 14, at 1414, the power rail portion 1308 can be formed as shown in FIG. 15O, according to some embodiments. The power rail portion 1308 may be formed by depositing one or more dielectric layers (or ILD layers) 1581 and forming one or more power rails (e.g., the power rails 1325 and 1327) in the dielectric layers 1581. Power rails 1325 and 1327 may be formed by depositing a conductive material. In some embodiments, power rails 1325 and 1327 may each include a metal layer (or a metal line), which may be a single layer or a composite layer comprising a plurality of sub-layers formed of different materials. In some embodiments, the power rail may further include a metal via (e.g., the metal via 1326) coupled to a top or bottom surface of the power rail. In some embodiments, the power rails 1325 and 1327 include copper, aluminum, cobalt, tungsten, titanium, tantalum, ruthenium, or the like. The power rails 1325 and 1327 may be formed using, for example, PVD, plating or the like.

In the example of FIG. 15O, the second power rail 1327 is physically and electrically coupled to the epitaxial S/D regions 1570 through the backside S/D contact 1589. Subsequently, a planarization process (e.g., a chemical mechanical polish (CMP), grinding, etch back, or the like) may be performed on a surface of the second power rail 1327. As a result of this thinning process, the power rail 1327 may have a thickness in a range of between about 10 nm to about 200 nm. The first power rail 1325 and the metal via 1326 are subsequently formed in the dielectric layer 1581 above second power rail 1327, using the similar process. The first power rail 1325 is electrically connected to a feature or device (e.g., the memory cell 1302) above the first power rail 1325.

The power rails 1325 and 1327 may have a width in a range of between about 20 nm to about 40 nm. The formation of the power rails 1325 and 1327 on the backside of the transistor 1307 instead of the frontside of the transistor 1307 allows for the use of a larger power rail width, which helps to reduce electrical resistance. For example, the width of the power rail 1325 and 1327 may be more than twice the width compared to a frontside power rail. A larger power rail width may be achieved when forming a power rail on the backside of the transistor 1307 because the power rail area is not restricted by the presence of the interconnect structure that is formed on the frontside of the transistor 1307. It is noted that the width of the power rails 1325 and 1327 can be varied depending on design requirements. In other words, the first power rail 1325 may be equal to, larger than, or small than the second power rail 1327 in width and thickness.

Figure 15P:
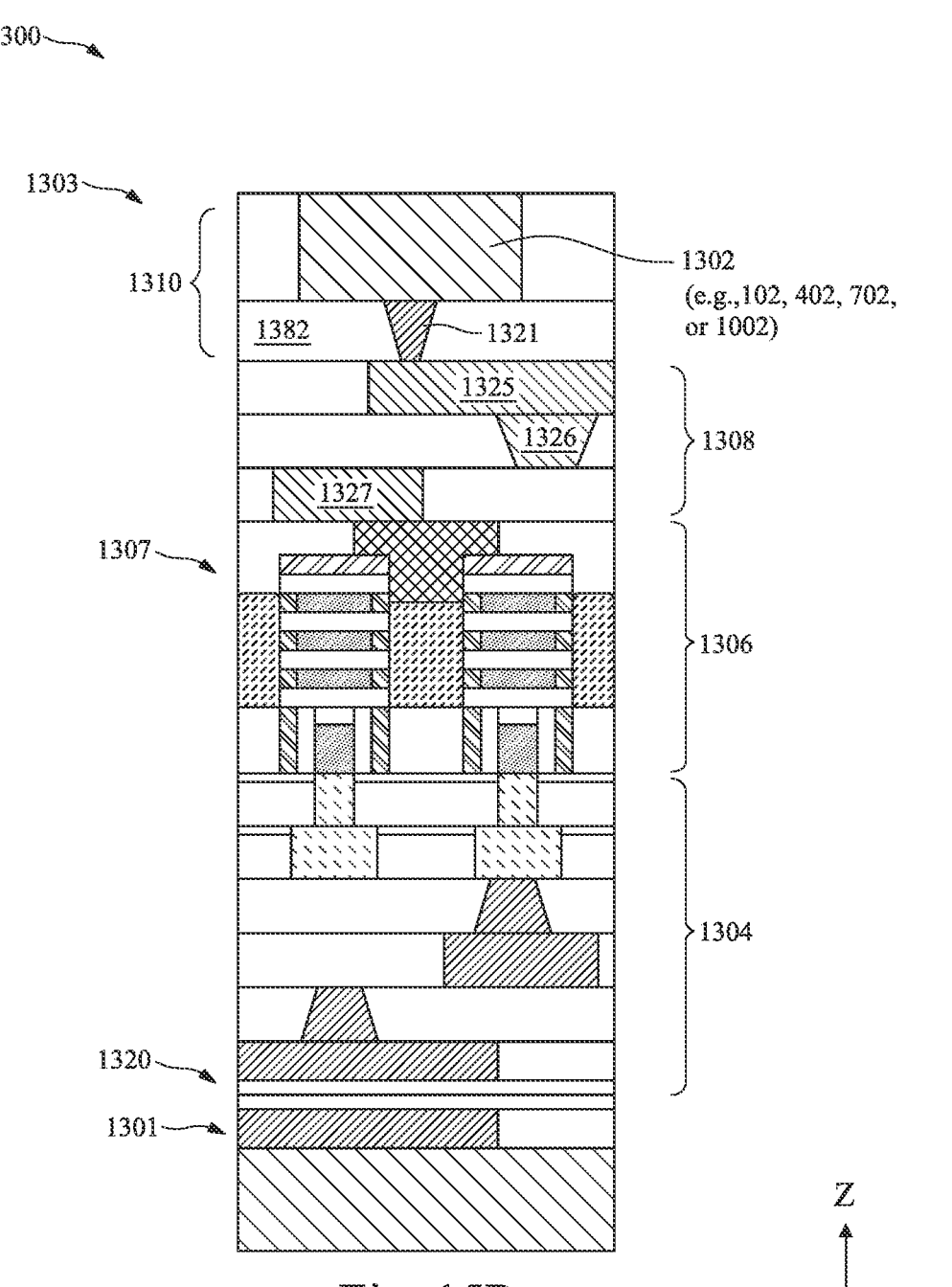
Figure 15Q:
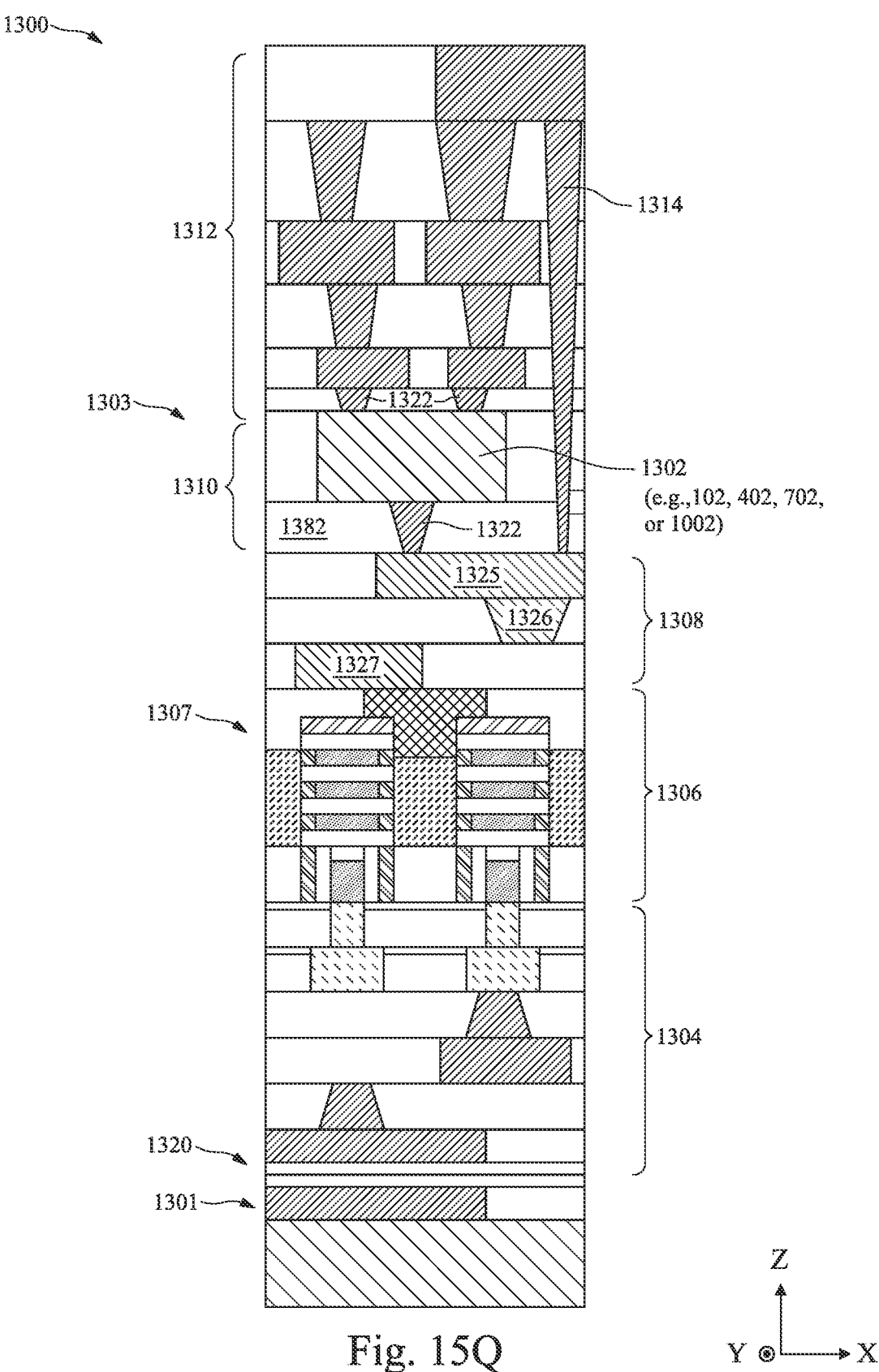

Referring to FIG. 14, at 1416, a memory cell portion 1310 can be formed as shown in FIG. 15P, according to some embodiments. A dielectric layer (e.g., an ILD layer) may be formed on the power rail portion 1308, and one or more memory cells 1302 may be formed in the metallization layer 1382. In some embodiments, the memory cell 1302 is a 1T1C memory cell such as the memory cell 102, 402, 702, or 1002 according to the present disclosure. The memory cell 1302 may be electrically connected to the first power rail 1325 through a via contact 1322 in the metallization layer 1382.

Referring to FIG. 14, at 1418, a contact plug portion 1312 is formed as shown in FIG. 15Q, according to some embodiments. The contact plug portion 1312 may be formed over the memory cell portion 1310 by removing a portion of a dielectric layer disposed on the memory cell portion 1310 to form a void, filling the void with a conductive material to form a contact plug (i.e., a metal line 1321 or a via contact 1322). Any suitable process (such as deposition, damascene, dual damascene, or the like) may be used to form the contact plugs. The conductive material may be formed of, for example, doped polysilicon, a metal, metal silicide, conductive metal nitride, or a combination thereof. The one or more contact plugs are used to provide electrical connectivity to other components within the semiconductor device.

Referring to FIG. 14, at 1420, one or more TOVs 1314 is formed as shown in FIG. 15Q, according to some embodiments. The TOV 1314 may be used to electrically interconnect the memory cell 1302 and the power rail 1325. The TOV 1314 may be used to electrically interconnect the memory cell 1302 to the transistor 1307 or other features within the stacked structure 1300. The TOV 1314 can be formed by etching a via (e.g., a tapered via) through multiple dielectric layers to connect with the power rail 1325 or the S/D region 1570 of the transistor 1307 or another component or device within the stacked structure 1300, and filling the tapered via with metal (e.g., copper) to connect a topmost metallization layer of the contact plug portion 1312. In some embodiments, a tapered TOV 1314 has an aspect ratio of in the range of about 15:1 to about 25:1. A lower portion of TOV 1314 can further include a diffusion barrier and/or a silicided contact to the power rail 1325 that includes an intervening metal. The TOV 1314 be used to in conjunction with the power rail 1325 to provide power to the memory cell 1302.

FIGS. 16A-16D are schematic diagrams illustrating cross-sectional views of additional example stacked structures, which are variations of the stacked structure 1300 of FIG. 13. In the illustrated example of FIG. 16A, a stacked structure 1600A includes a semiconductor device 1303 stacked over and bonded to a carrier substrate 1301. The semiconductor device 1303 includes a memory cell portion 1310 which further includes the 1T1C memory cell 102. As mentioned above, the 1T1C memory cell 102 has a compact structure and includes a transistor 103 stacked over a capacitor 104. The transistor 103 and the capacitor 104 share the metal gate 111. The capacitor 104 has a floating gate 122 placed at the bottom of the 1T1C memory cell 102. The two S/D electrodes 119a/119b may be coupled to the power rail 1325 through the via contact 125a/125b, the contact plug portion 1312, and the TOV 1314. In some embodiments, the floating gate 122 can be electrically coupled to the power rail 1325 either directly or through one or more via contacts.

Figure 16A:
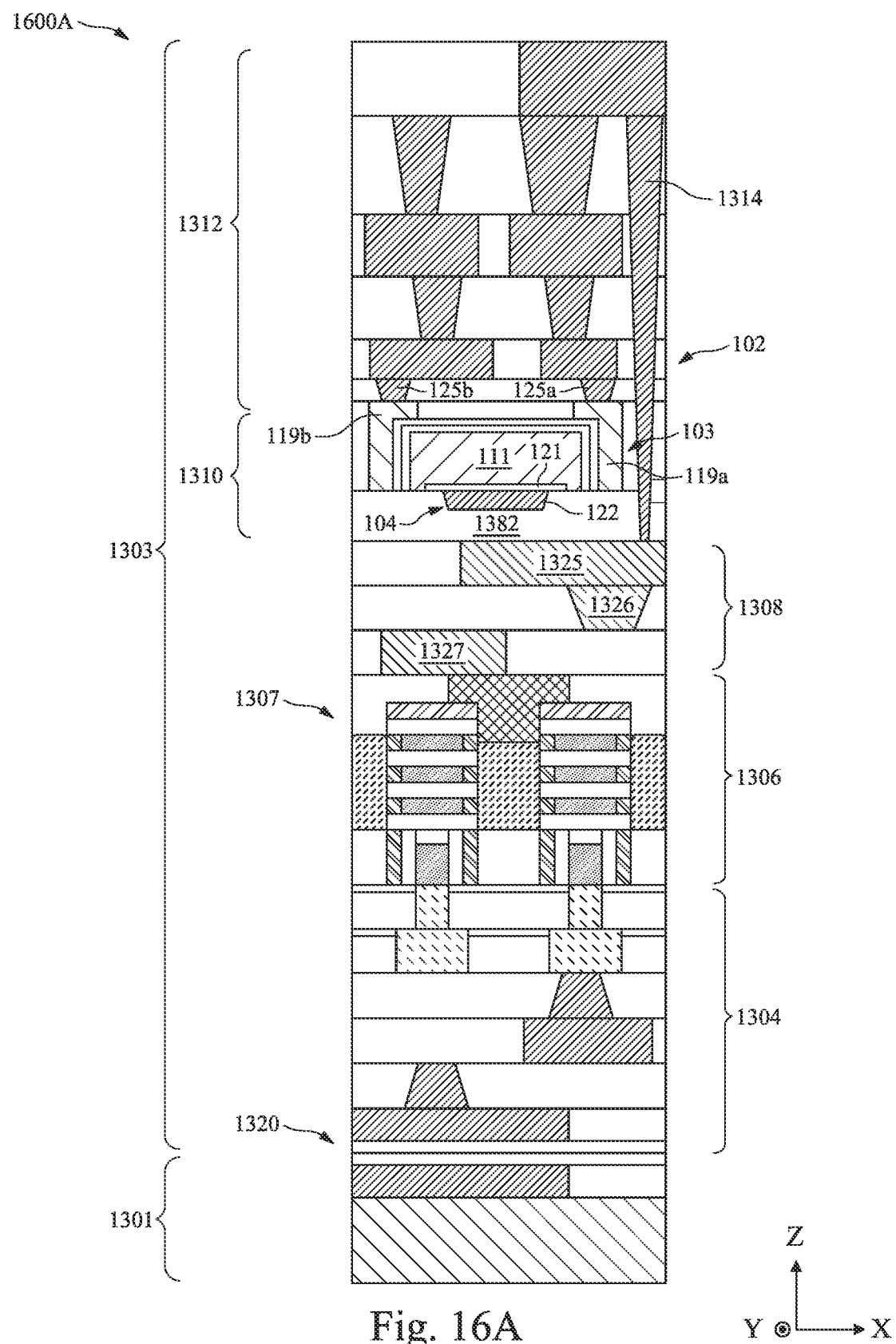
FIGS. 16A-16D are a schematic diagram illustrating cross-sectional views of variations of the stacked structure shown in FIG. 13, in accordance with some embodiments.
Figure 16B:
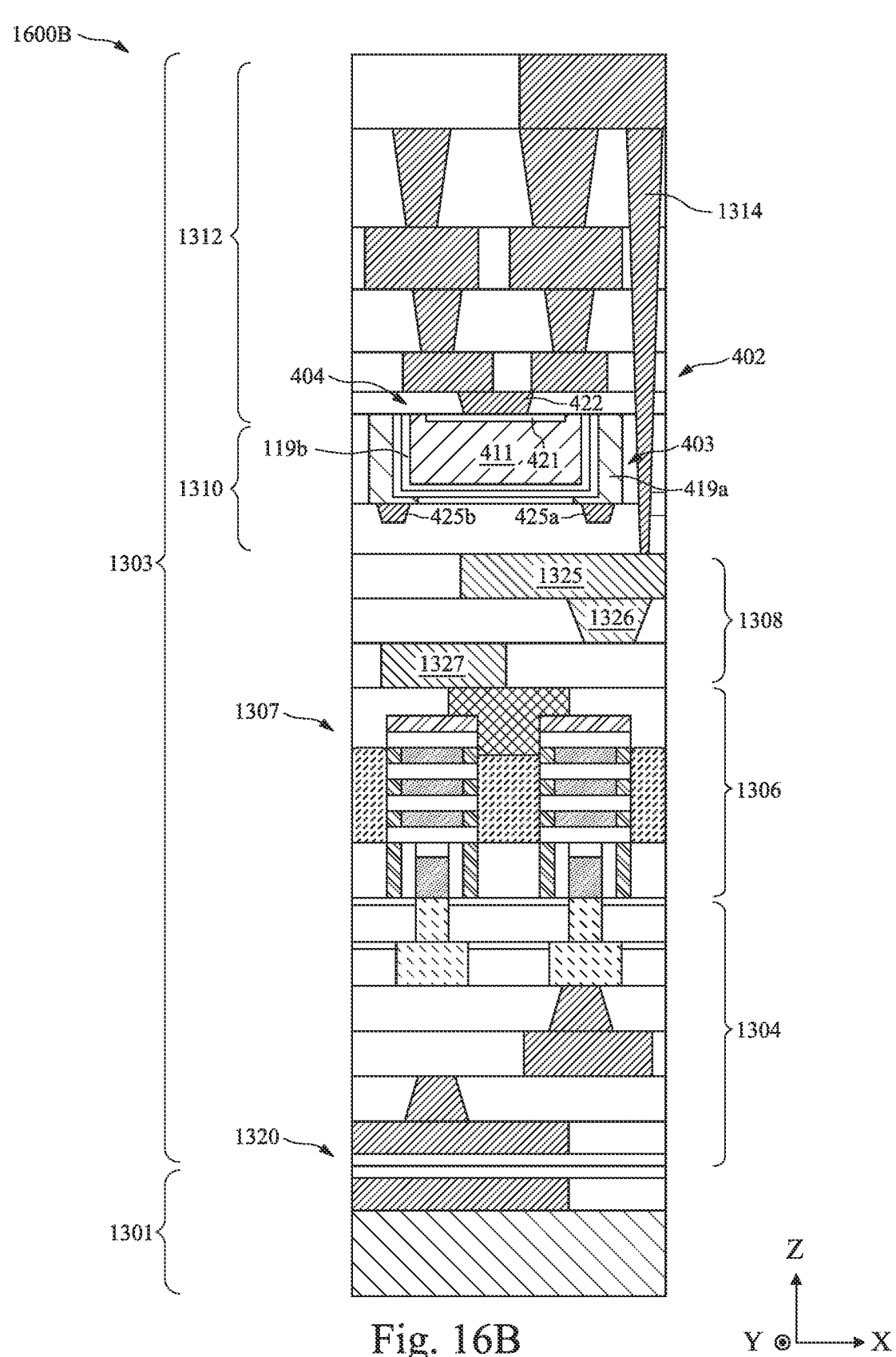

Similarly, in the illustrated example of FIG. 16B, a stacked structure 1600B includes a 1T1C memory cell 402 in the memory cell portion 1310. As mentioned above, the 1T1C memory cell 402 has a compact structure and includes a capacitor 404 stacked over a transistor 403. The transistor 403 and the capacitor 404 share the metal gate 411. The capacitor 404 has a floating gate 422 placed at the top of the 1T1C memory cell 402. The floating gate 422 may be coupled to the power rail 1325 through the contact plug portion 1312 and the TOV 1314. In some embodiments, the two S/D electrodes 419 may be electrically coupled to the power rail 1325 either directly or through one or more contact plugs.

Figure 16C:
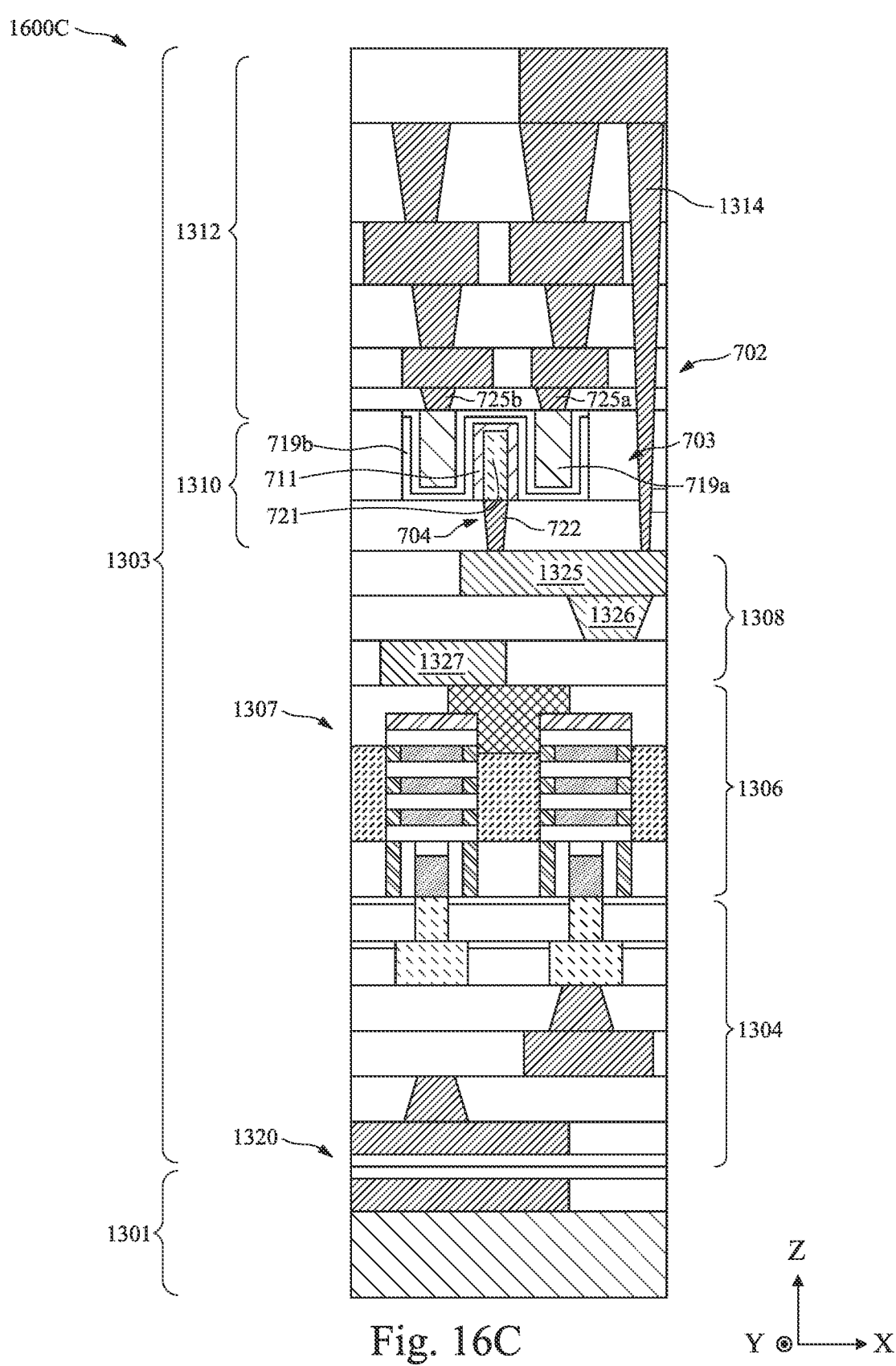

Similarly, in the illustrated example of FIG. 16C, a stacked structure 1600C includes a 1T1C memory cell 702 in the memory cell portion 1310. As mentioned above, the 1T1C memory cell 702 has a compact structure and includes a capacitor 704 partially enclosed in a transistor 703. The transistor 703 and the capacitor 704 share the metal gate 711. The capacitor 704 has a floating gate 722 placed at the bottom of the 1T1C memory cell 702. The floating gate 722 may be coupled to the power rail 1325 either directly or through one or more contact plugs. In some embodiments, the two S/D electrodes 419 may be electrically coupled to the power rail through the via contacts 725a/725b, the contact plug portion 1312, and the TOV 1314.

Figure 16D:
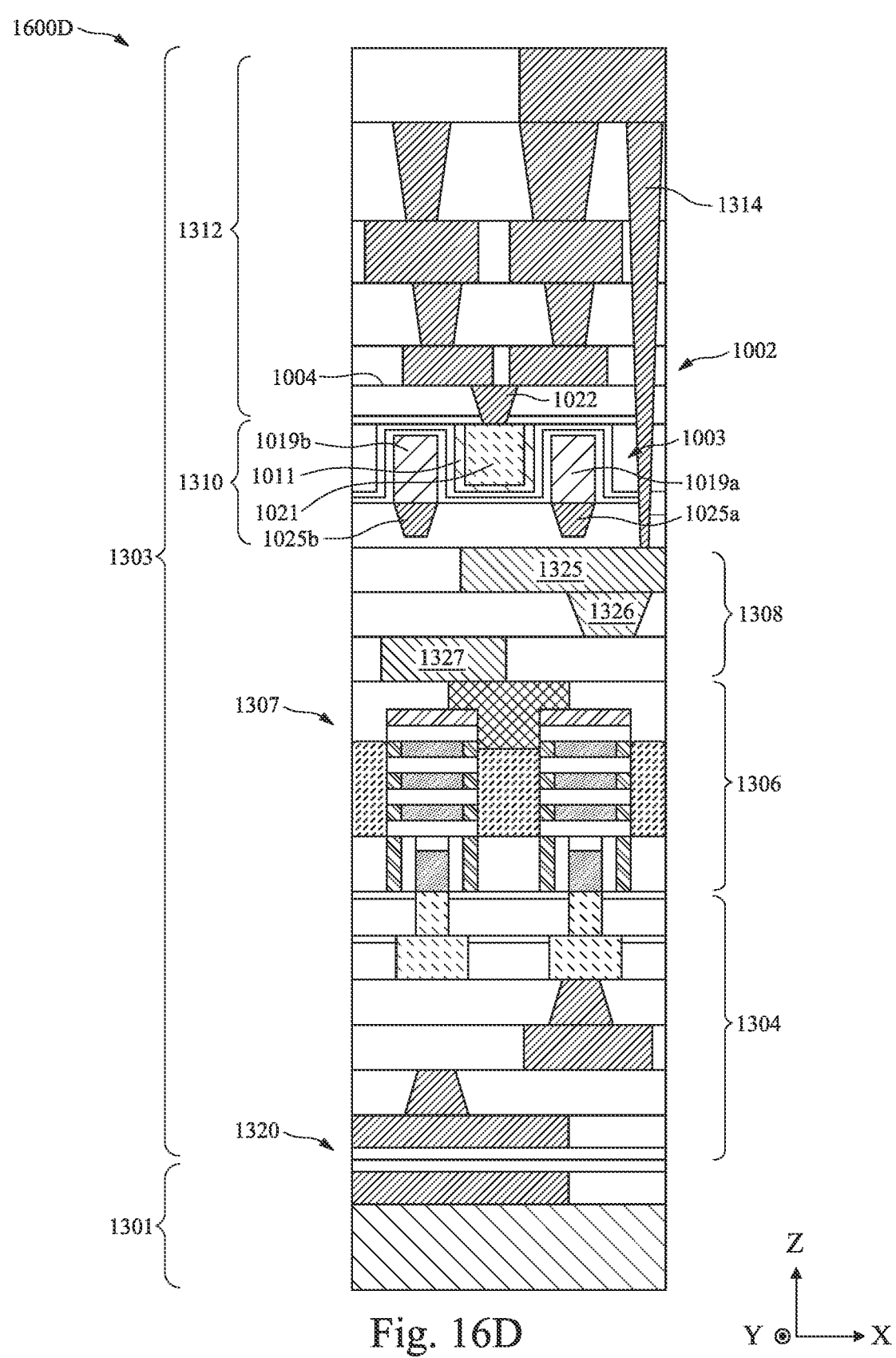

Similarly, in the illustrated example of FIG. 16D, a stacked structure 1600D includes a 1T1C memory cell 1002 in the memory cell portion 1310. As mentioned above, the 1T1C memory cell 1002 has a compact structure and includes a capacitor 1004 stacked over a transistor 1003. The transistor 1003 and the capacitor 1004 share the metal gate 1011. The capacitor 1004 has a floating gate 1022 placed at the top of the 1T1C memory cell 1002. The floating gate 1022 may be coupled to the power rail 1325 through the contact plug portion 1312 and the TOV 1314. In some embodiments, the two S/D electrodes 1019 may be electrically coupled to the power rail 1325 either directly or through one or more contact plugs.

Figure 17:
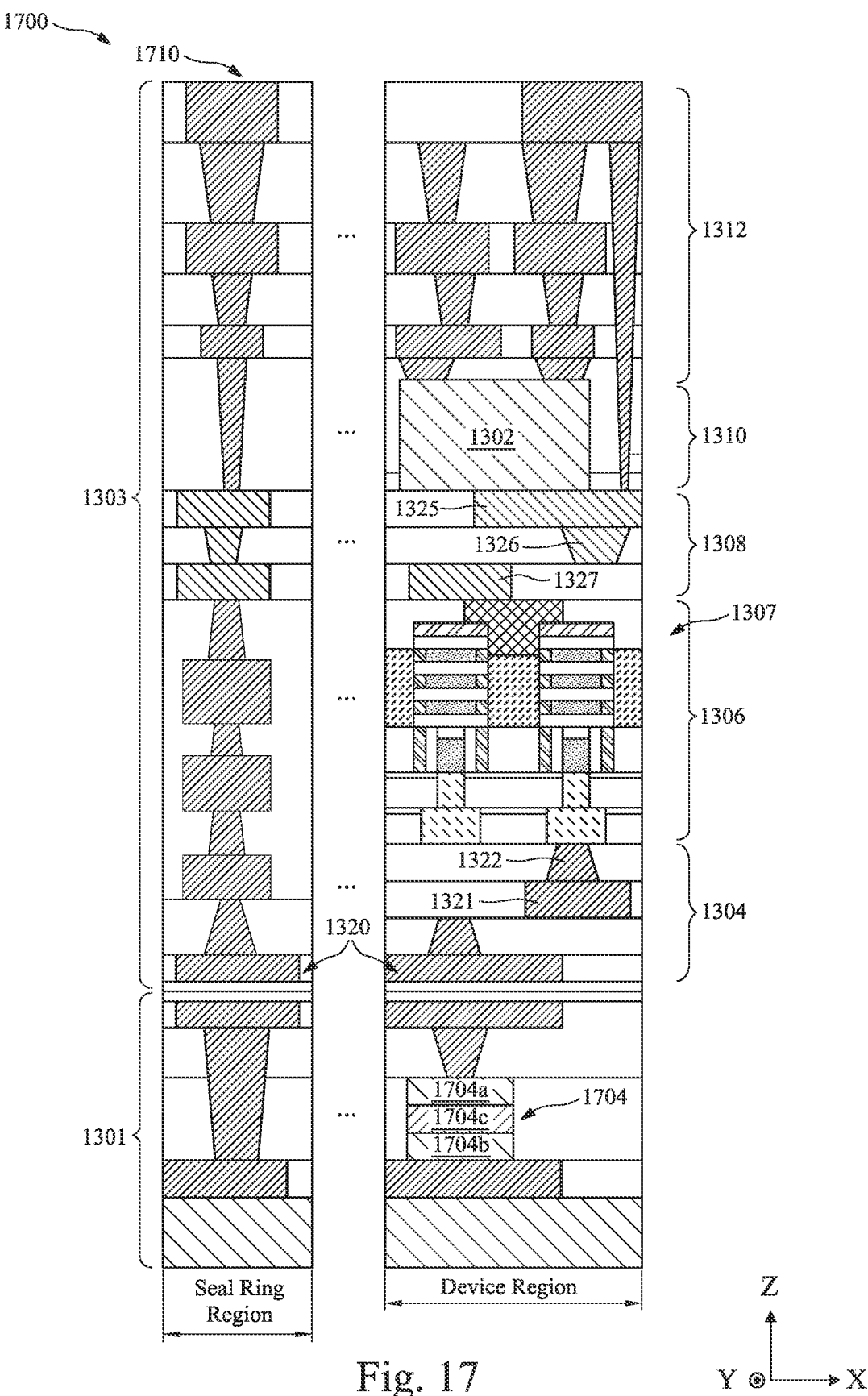
FIG. 17 is a schematic diagram illustrating cross-sectional view of an example of another example of a stacked structure, in accordance with some embodiments.

FIG. 17 illustrates another example of a semiconductor stacked structure 1700 according to some embodiments of the present disclosure. The semiconductor stacked structure 1700 is a variation of the semiconductor stacked structure 1300 of FIG. 13. In the illustrated example, the semiconductor stacked structure 1700 includes a device region and a seal ring region. Various components in the device regions of the semiconductor stacked structure 1700 are similar to those of the semiconductor stacked structure 1300, and will not be repeated unless otherwise indicated.

At least one difference between the semiconductor stacked structure 1700 and the semiconductor stacked structure 1300 is that the semiconductor stacked structure 1700 further includes a metal-insulator-metal (MIM) capacitor 1704 in the device region of the carrier substrate 1301. The MIM capacitor 1704 may provide extra storage capacity for the stacked structure 1700. The MIM capacitor 1704 may be a planar-type, a cylinder-type, a cup-type, or a bar-type MIM structure, which each includes a top electrode (e.g., the electrode 1704a of FIG. 17), a bottom electrode (e.g., the electrode 1704b of FIG. 17), on either side of a dielectric/insulating layer (e.g., the layer 1704c of FIG. 17). In some embodiments, the MIM capacitor 1704 may be electrically coupled with the transistor(s) 1307 to form another memory cell (e.g., a 1T1C memory cell or a 2T1C memory cell) in the device region. In some embodiments, the MIM capacitor 1704 is a ferroelectric capacitor. In this arrangement, the memory cell 1302 (i.e., the 1T1C memory cell 102, 402, 702, or 1002 with a compact structure), the transistor 1307, the MIM capacitor 1704 are vertically stacked, and these components at least partially overlap each other in the vertical direction. This arrangement facilitates an increase of the density of components in an integrated circuit chip.

At least another difference between the semiconductor stacked structure 1700 and the semiconductor stacked structure 1300 is that the semiconductor stacked structure 1700 further includes a seal ring structure 1710 disposed in the seal ring region. The seal ring region may be proximate to a periphery of the stacked structure 1700. For simplicity, only a portion of the seal ring region is illustrated in FIG. 17, and it is understandable that the seal ring region may be continuously around the device region. One or more seal rings 1710 (sometimes also referred to as "seal ring units") may be formed in the seal ring region. The seal rings 1710 may be used to help protect the functional components in the device region. The seal ring 1710 also strengthens the stacked structure 1700 and the final package or product derived from the stacked structure 1700, provides increased robustness to the stacked structure, and prevents or reduces damage during a subsequent singulation process. Additionally, if desired, the seal ring 1710 could be electrically connected to the functional circuit elements within the device region in order to provide an electrical connection to those elements. The seal ring 1710 may include a conductive material such as copper, aluminum, tungsten, alloys of these, and the like. However, other materials, such as layers of conductive and insulative materials, could alternatively be used. The seal ring 1710 may be formed to have a width of between about 5 μm and about 300 μm, such as about 10 μm.

FIG. 18 is a flow diagram illustrating an example method 1800 for fabricating the stacked structure 1700 shown in FIG. 13, according to some embodiments. For illustrative purposes, operations illustrated in FIG. 18 will be described with reference to the exemplary process for fabricating the stacked structure 1700, as illustrated in FIGS. 19A-19E, which are cross-sectional views of the stacked structure 1700 at various stages of its fabrication, according to some embodiments. The method 1800 is a close variation of the method 1400, and similar operations will not be repeated unless otherwise indicated.

Figure 19A:
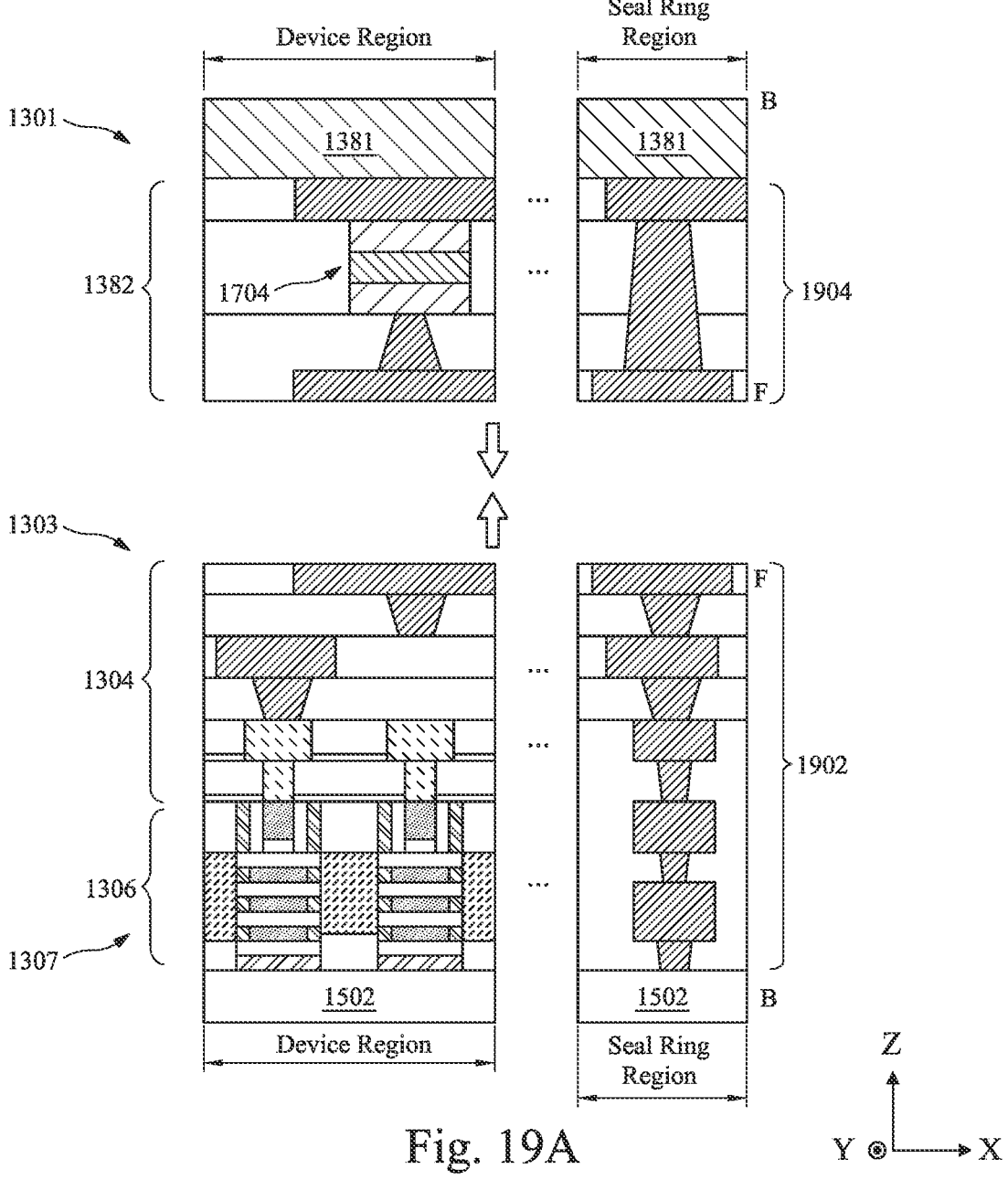
FIGS. 19A-19E are schematic diagrams illustrating cross-sectional views of a stacked structure at various stages of its fabrication, in accordance with some embodiments.

Referring to FIG. 18, at 1802, a partially formed semiconductor device 1303 is provided, according to some embodiments. At 1804, a carrier substrate 1301 is provided, according to some embodiments. As shown in FIG. 19A, both the semiconductor device 1303 and the carrier substrate 1301 have a device region and a seal ring region that are vertically aligned in a face-to-face manner. The semiconductor device 1303 includes a substrate 1502, a transistor 1307 in a transistor portion 1306, and an interconnect structure 1304 over the transistor portion 1306 in the device region, as well as a first seal ring portion 1902 in the seal ring region. The carrier substrate 1301 includes a substrate 1381, an MIM capacitor 1704, and a topmost metallization layer 1382 in the device region, as well as a second seal ring portion 1904 in the seal ring region. The first seal ring portion 1902 may be formed simultaneously (or during the same process) with forming the transistor 1307 and the interconnect structure 1304 in the device region of the semiconductor device 1303. Similarly, the second seal ring portion 1904 may be formed simultaneously (or during the same process) with forming the MIM capacitor 1704 and the metallization layer 1382 in the device region of the carrier substrate 1301.

Figure 19B:
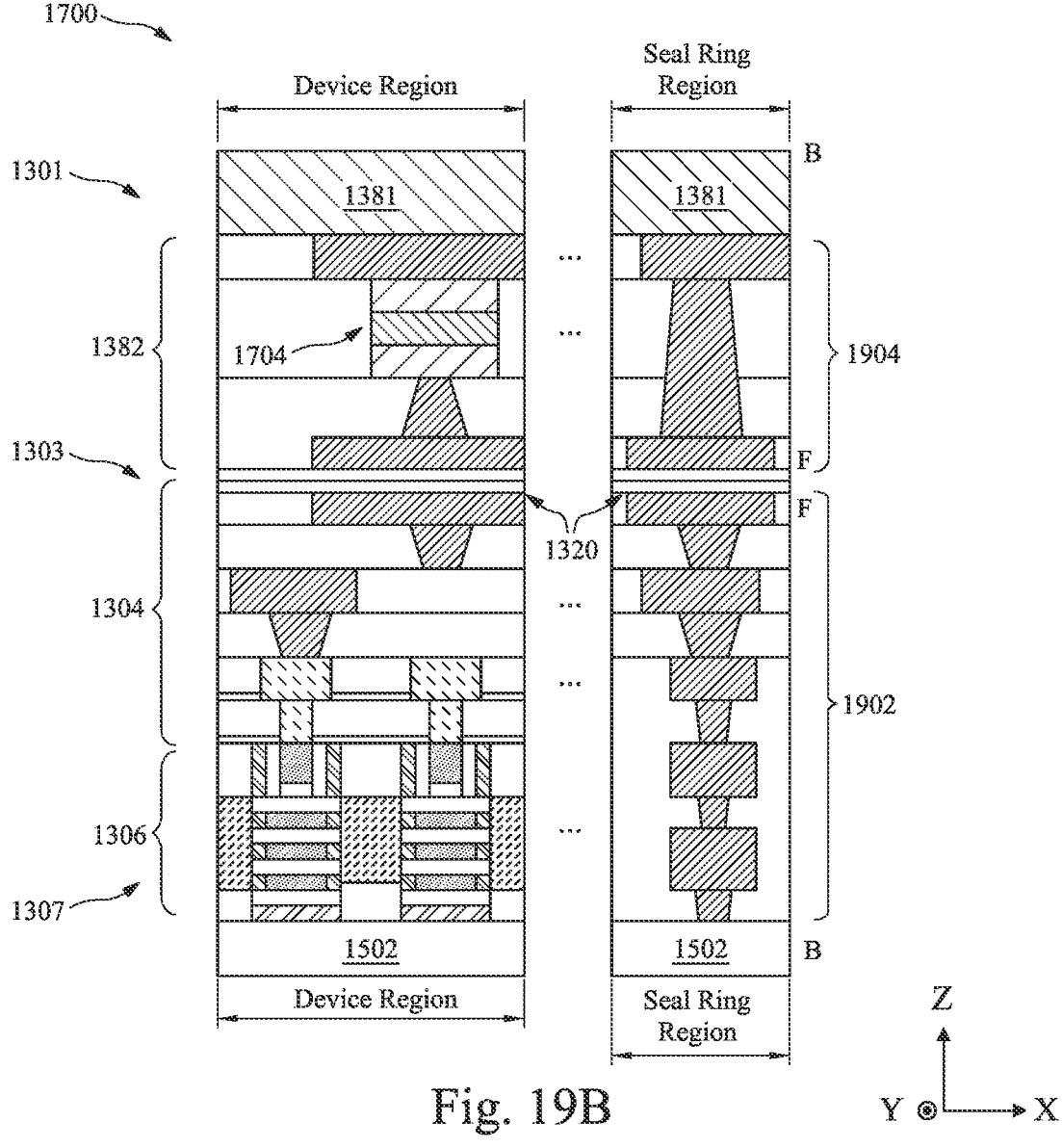

At 1806, the semiconductor device 1303 and the carrier substrate 1301 are aligned and bonded in a face-to-face manner (i.e., frontside-to-frontside) to form the partially-formed stacked structure 1700, as shown in FIG. 19B. A hybrid bonding process may be performed, such as a bonding structure 1320 may be formed at the interface of both the device region and the seal ring region. The interconnect structure 1304 and the metallization layer 1382 are bonded at the device region, and the first and second seal ring portions 1902 and 1904 are bonded at the seal ring region.

Figure 19C:
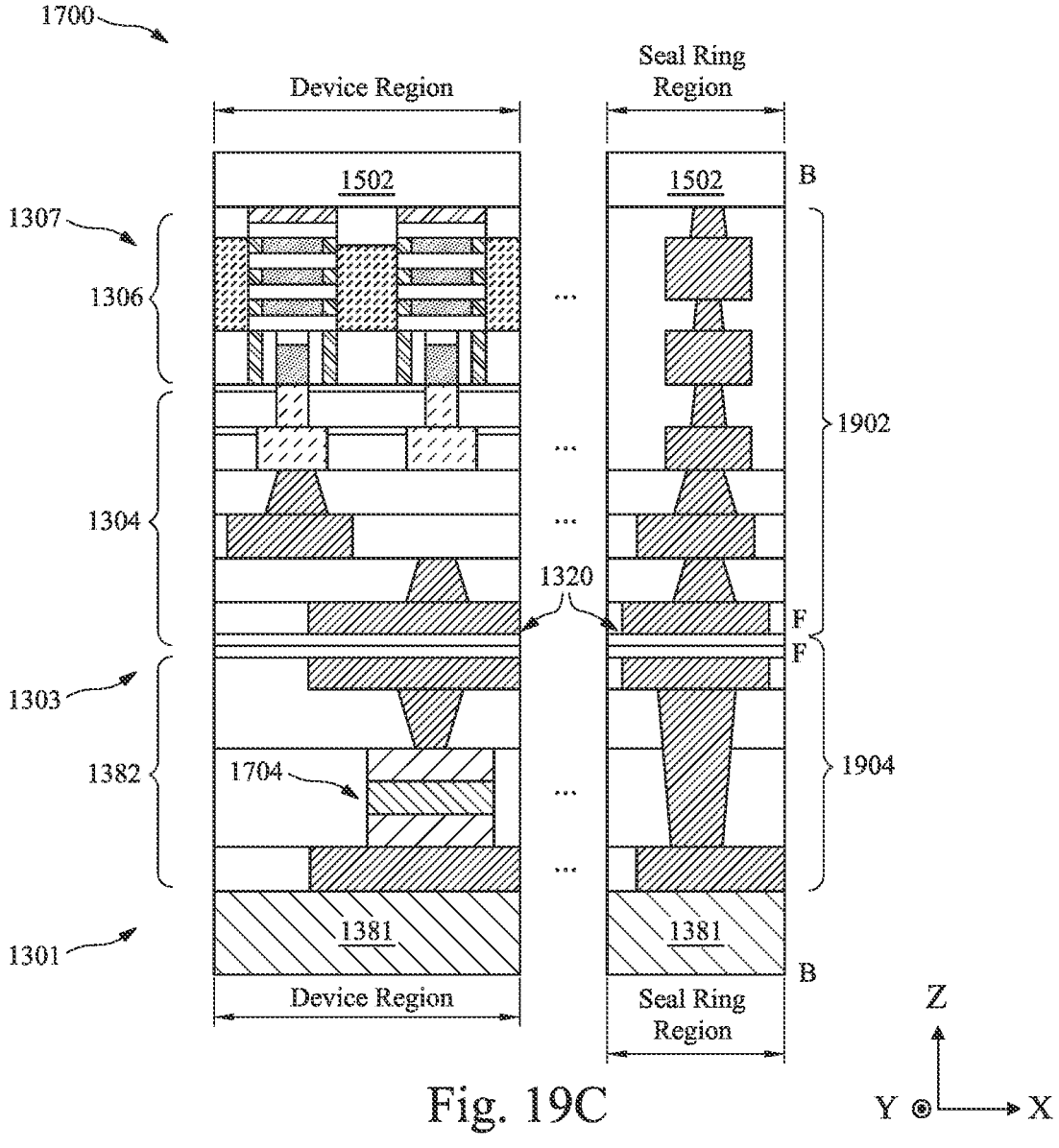

At 1808, the stacked structure 1700 is flipped over so that the backside (B) of the semiconductor device 1303 is facing up, as shown in FIG. 19C.

Figure 19D:
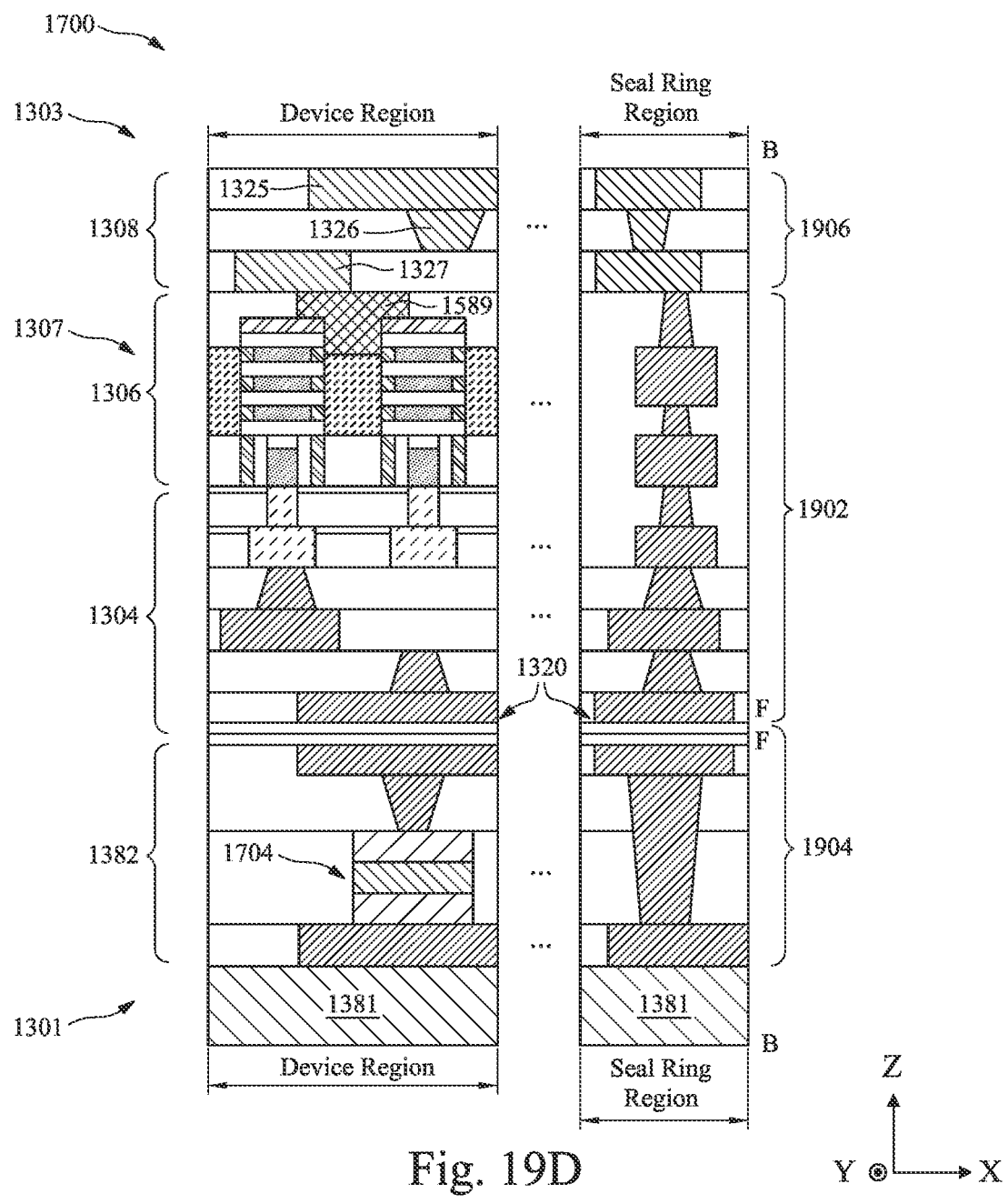

At 1810, a backside S/D contact 1589 and a power rail portion 1308 are subsequently formed in the device region, and a third seal ring portion 1906 is formed in the seal ring region during the same process, as shown in FIG. 19D. The third seal ring portion 1906 is aligned with and connected to the first seal ring portion 1902.

Figure 19E:
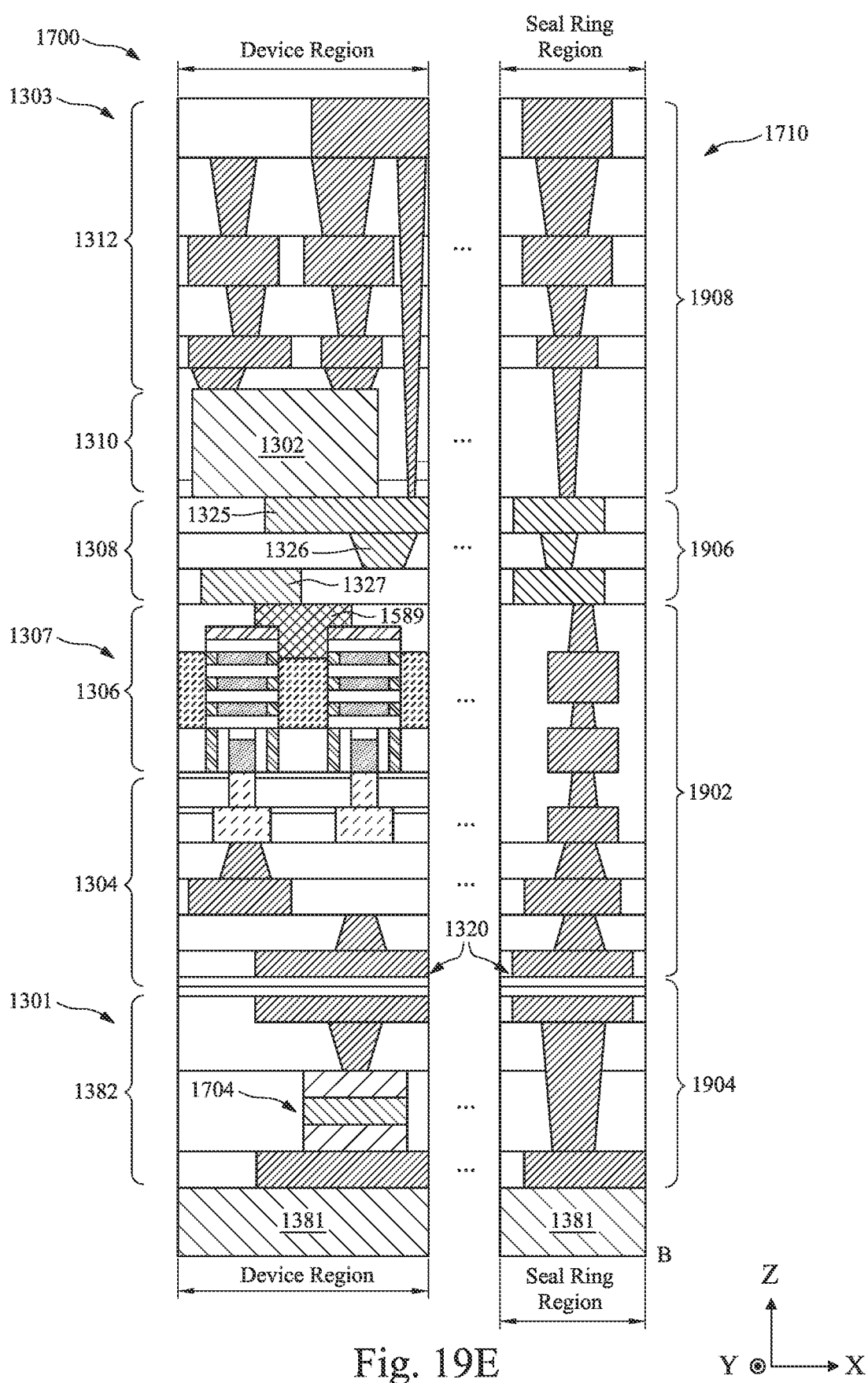

At 1812, a memory cell 1302 and a contact plug portion 1312 are subsequently formed in the device region, and a fourth seal ring portion 1908 is correspondingly formed in the seal ring region during the same process, as shown in FIG. 19E. The fourth seal ring portion 1908 is aligned with and connected to the third seal ring portion 1902. As such, a seal ring 1710 is formed in the seal ring region of the stacked structure 1700.

SUMMARY

In accordance with some aspects of the disclosure, memory cells are provided. In one example, a memory cell includes a capacitor and a transistor stacked over the capacitor. The capacitor includes a floating gate, a high-k dielectric layer disposed on the floating gate, and a metal gate disposed on the high-k dielectric layer. The metal gate extends horizontally from a first sidewall to a second sidewall and vertically from a bottom surface to a top surface. The transistor includes the metal gate and a gate dielectric layer disposed on the metal gate. The gate dielectric layer includes two side portions respectively disposed on the two sidewalls of the metal gate and, and a top portion disposed on the top surface of the metal gate. The transistor further includes two separate S/D regions respectively formed on the two side portions of the gate dielectric layer, and a channel region formed on the top portion of the gate dielectric layer. The transistor further includes two separate S/D electrodes respectively disposed on the two S/D regions.

In accordance with some aspects of the disclosure, semiconductor devices are provided. In one example, a semiconductor device includes a substrate, an interconnect structure disposed on the substrate, a memory cell disposed over the logic device. The memory cell and the logic device are at least partially overlapped in a vertical direction. The memory cell includes a capacitor and a transistor stacked over the capacitor. The capacitor includes a floating gate, a high-k dielectric layer disposed on the floating gate, and a metal gate disposed on the high-k dielectric layer. The metal gate extends horizontally from a first sidewall to a second sidewall and vertically from a bottom surface to a top surface. The transistor includes the metal gate and a gate dielectric layer disposed on the metal gate. The gate dielectric layer includes two side portions respectively disposed on the two sidewalls of the metal gate and, and a top portion disposed on the top surface of the metal gate. The transistor further includes two separate S/D regions respectively formed on the two side portions of the gate dielectric layer, and a channel region formed on the top portion of the gate dielectric layer. The transistor further includes two separate S/D electrodes respectively disposed on the two S/D regions.

In accordance with some aspects of the disclosure, method for fabricating memory cells, semiconductor devices, and semiconductor stacked structures are provided. In one example, a method includes: forming, on a substrate, a transistor including an S/D region and a gate disposed over the S/D region, forming an interconnect structure disposed on and in contact with the gate of the transistor, bonding a frontside the interconnect structure with a frontside of a carrier substrate in a face-to-face manner to form a stacked structure, inverting the stacked structure, thinning the substrate to expose the S/D region of the transistor, forming a backside S/D contact on the S/D region, forming a plurality of power rails over the backside S/D contact, forming a memory cell over the power rails, and forming a contact plug portion over the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory cell, comprising:
a capacitor comprising:
a floating gate;
a high-k dielectric layer disposed on and in contact with the floating gate; and
a metal gate disposed on and in contact with the high-k dielectric layer, the metal gate extending horizontally from a first sidewall to a second sidewall and vertically from a bottom surface to a top surface; and
a transistor stacked over the capacitor, the transistor comprising:
the metal gate;

a gate dielectric layer disposed on the metal gate, the gate dielectric layer comprising two side portions respectively disposed on the first and second sidewalls of the metal gate and a top portion disposed on the top surface of the metal gate;

two separate source/drain (S/D) regions respectively formed on the two side portions of the gate dielectric layer;

a channel region formed on the top portion of the gate dielectric layer; and two separate S/D electrodes respectively disposed on the two S/D regions.

2. The memory cell of claim 1, wherein the memory cell is an one-transistor-one-capacitor (1T1C) memory cell.

3. The memory cell of claim 1, further comprising:

two via contacts respective disposed on the two S/D electrodes.

4. The memory cell of claim 1, wherein the channel region is formed in a semiconductor layer disposed on the top portion of the gate dielectric layer.

5. The memory cell of claim 4, wherein the semiconductor layer is an indium gallium zinc oxide (IGZO) layer.

6. The memory cell of claim 1, wherein the S/D regions are respectively formed in an S/D layer disposed on the side portions of the gate dielectric layer.

7. The memory cell of claim 1, wherein the high-k dielectric layer has an aspect ratio substantially less than 1.

8. A semiconductor device, comprising:

a substrate;

an interconnect structure disposed on the substrate;

a logic device disposed over and electrically connected to the interconnect structure;

a memory cell disposed over the logic device, wherein the memory cell comprises:

a capacitor comprising:

a floating gate;

a high-k dielectric layer disposed on the floating gate; and a metal gate disposed on the high-k dielectric layer, the metal gate extending horizontally from a first sidewall to a second sidewall and vertically from a bottom surface to a top surface; and a transistor stacked over the capacitor, the transistor comprising:

the metal gate;

a gate dielectric layer disposed on the metal gate, the gate dielectric layer comprising two side portions respectively disposed on the first and second sidewalls of the metal gate and a top portion disposed on the top surface of the metal gate;

two separate source/drain (S/D) regions respectively formed on the two side portions of the gate dielectric layer;

a channel region formed on the top portion of the gate dielectric layer; and two separate S/D electrodes respectively disposed on the two S/D regions; and wherein the memory cell and the logic device are at least partially overlapped in a vertical direction.

9. The semiconductor device of claim 8, wherein the memory cell is a 1T1C memory cell.

10. The semiconductor device of claim 8, further comprising:

a power rail portion disposed between the logic device and the memory cell and at least partially overlapped with the logic device and the memory cell, the power rail portion comprising a first power rail electrically connected to the memory cell and a second power rail electrically connected to the logic device.

11. The semiconductor device of claim 10, wherein the first power rail is electrically connected to the floating gate of the memory cell.

12. The semiconductor device of claim 10, wherein the first power rail is electrically connected to one or both S/D electrodes.

13. The semiconductor device of claim 10, further comprising:

a contact plug portion disposed over and electrically connected to the memory cell.

14. The semiconductor device of claim 13, further comprising:

a through oxide via (TOV) electrically connecting the contact plug portion and the first power rail, wherein the memory cell is electrically connected to the first power rail through the TOV.

15. The semiconductor device of claim 8, further comprising:

a passive device disposed between the interconnect structure and the substrate, wherein the passive device is at least partially overlapped with the logic device and the memory cell.

16. The semiconductor device of claim 15, wherein the passive device is a metal-insulator-metal (MIM) capacitor.

17. The semiconductor device of claim 8, further comprising a seal ring.

18. The semiconductor device of claim 8, wherein the logic device is a gate-all-around field-effect transistor (GAAFET).

19. A semiconductor device, comprising:

a logic transistor disposed on a first side of a semiconductor layer;

an interconnect structure disposed on the logic transistor;

a carrier substrate bonded to the interconnect structure; and a memory cell disposed on a second side of the semiconductor layer opposite the first side, the memory cell comprising:

a capacitor structure; and a transistor structure stacked in a vertical direction with the capacitor structure, wherein the capacitor structure and the transistor structure share a common metal gate electrode, wherein the transistor structure comprises a channel region comprising an oxide semiconductor material.

20. The semiconductor device of claim 19, wherein the interconnect structure is bonded to the carrier substrate via a hybrid bonding structure comprising a metal-to-metal bond and a dielectric-to-dielectric bond.

* * * * *